(12) United States Patent
Bockhaus et al.

(10) Patent No.: US 6,374,370 B1
(45) Date of Patent: Apr. 16, 2002

(54) METHOD AND SYSTEM FOR FLEXIBLE CONTROL OF BIST REGISTERS BASED UPON ON-CHIP EVENTS

(75) Inventors: John W Bockhaus; Jay Fleischman, both of Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/183,173

(22) Filed: Oct. 30, 1998

(51) Int. Cl.⁷ ............................................... G06F 11/30
(52) U.S. Cl. ........................... 714/39; 714/30; 714/732; 714/733
(58) Field of Search ............................ 714/39, 30, 28, 714/29, 45, 732–733, 47; 703/28

(56) References Cited

U.S. PATENT DOCUMENTS

| | | | |
|---|---|---|---|
| 3,947,823 A | 3/1976 | Padegs et al. | 340/172.5 |
| 4,303,990 A | 12/1981 | Seipp | 364/900 |
| 4,425,643 A | 1/1984 | Chapman et al. | 371/20 |
| 4,431,928 A | 2/1984 | Skokan | 307/465 |
| 4,433,413 A | 2/1984 | Fasang | 371/25 |
| 4,446,514 A | 5/1984 | Brown et al. | 364/200 |
| 4,491,907 A | 1/1985 | Koeppen et al. | 364/200 |
| 4,500,993 A | 2/1985 | Jacobson | 371/16 |
| 4,598,385 A | 7/1986 | Kessels et al. | 364/900 |
| 4,622,669 A | 11/1986 | Pri-Tal | 371/25 |
| 4,674,089 A | 6/1987 | Poret et al. | 371/25 |
| 4,841,232 A | 6/1989 | Graham et al. | 324/73 |
| 4,868,822 A | 9/1989 | Scott et al. | 371/16 |
| 4,873,666 A | 10/1989 | Lefebvre et al. | 365/189.07 |
| 4,879,646 A | 11/1989 | Iwasaki et al. | 364/200 |
| 4,910,417 A | 3/1990 | El Gamal et al. | 307/465 |
| 4,912,630 A | 3/1990 | Cochcroft, Jr. | 364/200 |
| 4,924,468 A | 5/1990 | Horak et al. | 371/22.1 |
| 4,933,897 A | 6/1990 | Shankar et al. | 364/900 |
| 4,935,719 A | 6/1990 | McClure | 340/146.2 |
| 4,964,033 A | 10/1990 | Williams | 364/200 |
| 4,993,027 A | 2/1991 | McGraw et al. | 371/16.2 |
| 5,051,996 A * | 9/1991 | Bergeson et al. | 371/22.4 |
| 5,053,700 A | 10/1991 | Parrish | 324/158 R |
| 5,059,942 A | 10/1991 | Burrows | 340/146.2 |
| 5,136,590 A | 8/1992 | Polstra et al. | 371/16.2 |
| 5,157,673 A | 10/1992 | Feldbrugge | 371/68.1 |
| 5,157,781 A | 10/1992 | Harwood et al. | 395/575 |
| 5,173,619 A | 12/1992 | Gaudenzi et al. | 307/272.2 |
| 5,202,976 A | 4/1993 | Hansen et al. | 395/500 |
| 5,206,948 A | 4/1993 | De Angelis et al. | 395/575 |
| 5,210,862 A | 5/1993 | De Angelis et al. | 395/575 |
| 5,226,149 A | 7/1993 | Yoshida et al. | 395/575 |

(List continued on next page.)

OTHER PUBLICATIONS

Montessoro et al. "General and Efficient Multiple List Traversal for Concurrent Fault Simulation". 1991 IEEE, pp. 43–48.

Marchioro et al. "Simulation of a Macro–pipelined Multi––CPU Event Processor For Use in Fastbus". 1989 IEEE, pp. 1597–1601.

*Primary Examiner*—Scott T. Baderman

(57) ABSTRACT

A method and structure facilitates the debugging and test coverage capabilities of a microprocessor. A microprocessor having memory arrays, a debug block, and one or more built-in-self-test (BIST) engines is disclosed. The debug block is capable of driving control information out onto a state machine output bus in response to an event and the control information can be selectively used to control signature analysis or recording elements of the microprcessor, such as multiple-input-shift-registers and first-in-first-out devices, that facilitate in the monitoring and debugging of the microprocessor. The signature and recording elements may or may not be contained within the one or more BIST engines and may or may not be used in conjunction with the memory arrays or BIST engine(s) of the microprocessor.

35 Claims, 42 Drawing Sheets

U.S. PATENT DOCUMENTS

| | | | |
|---|---|---|---|
| 5,226,153 A | 7/1993 | De Angelis et al. | 395/575 |
| 5,317,711 A | 5/1994 | Bourekas et al. | 395/425 |
| 5,327,435 A | 7/1994 | Warchol | 371/16.1 |
| 5,345,580 A | 9/1994 | Tamaru et al. | 395/500 |
| 5,375,228 A | 12/1994 | Leary et al. | 395/575 |
| 5,400,345 A | 3/1995 | Ryan, Jr. | 371/22.3 |
| 5,418,452 A | 5/1995 | Pyle | 324/158.1 |
| 5,425,036 A | 6/1995 | Liu et al. | 371/23 |
| 5,442,641 A | 8/1995 | Beranger et al. | 371/21.2 |
| 5,450,349 A | 9/1995 | Brown, III et al. | 395/183.03 |
| 5,452,437 A | 9/1995 | Richey et al. | 395/182.02 |
| 5,473,754 A | 12/1995 | Folwell et al. | 395/183.21 |
| 5,475,815 A | 12/1995 | Byers et al. | 395/183.08 |
| 5,479,652 A | 12/1995 | Dreyer et al. | 395/183.06 |
| 5,488,688 A | 1/1996 | Gonzales et al. | 395/183.1 |
| 5,504,755 A | 4/1996 | Nozuyama | 371/22.2 |
| 5,519,715 A | 5/1996 | Hao et al. | 371/22.3 |
| 5,526,365 A | 6/1996 | Whetsel | 371/22.3 |
| 5,528,526 A | 6/1996 | Klug et al. | 364/715.11 |
| 5,530,804 A | 6/1996 | Edgington et al. | 395/183.06 |
| 5,532,174 A | 7/1996 | Corrigan | 437/8 |
| 5,534,798 A | 7/1996 | Phillips et al. | 326/108 |
| 5,535,331 A | 7/1996 | Swoboda et al. | 395/183.21 |
| 5,541,935 A | 7/1996 | Waterson | 371/22.5 |
| 5,548,775 A | 8/1996 | Hershey | 395/800 |
| 5,550,528 A | 8/1996 | Offord et al. | 340/146.2 |
| 5,555,428 A | 9/1996 | Radigan et al. | 395/800 |
| 5,557,619 A | 9/1996 | Rapoport | 371/22.5 |
| 5,561,761 A | 10/1996 | Hicok et al. | 395/183.06 |
| 5,564,041 A | 10/1996 | Matsui et al. | 395/500 |
| 5,566,300 A | 10/1996 | Naoe | 395/183.06 |
| 5,579,251 A | 11/1996 | Sato | 364/579 |
| 5,579,492 A | 11/1996 | Gay | 395/290 |
| 5,586,288 A | 12/1996 | Dahlberg | 395/435 |
| 5,590,354 A | 12/1996 | Klapproth et al. | 395/800 |
| 5,598,421 A | 1/1997 | Tran et al. | 371/22.3 |
| 5,606,564 A | 2/1997 | Ho et al. | 371/22.1 |
| 5,606,710 A | 2/1997 | Hall et al. | 395/800 |
| 5,613,144 A | 3/1997 | Hall et al. | 395/800 |
| 5,623,500 A | 4/1997 | Whetsel, Jr. | 371/22.1 |
| 5,630,048 A | 5/1997 | La Joie et al. | 395/183.01 |
| 5,638,382 A * | 6/1997 | Krick et al. | 371/22.5 |
| 5,640,508 A | 6/1997 | Fujiwara et al. | 395/183.06 |
| 5,640,542 A | 6/1997 | Whitsel et al. | 395/500 |
| 5,644,609 A | 7/1997 | Bockhaus et al. | 377/64 |
| 5,699,516 A | 12/1997 | Sapir et al. | 395/200.01 |
| 5,825,785 A * | 10/1998 | Barry et al. | 371/22.4 |
| 5,867,409 A * | 2/1999 | Nozuyama | 364/717.03 |
| 5,867,644 A * | 2/1999 | Ranson et al. | 714/39 |
| 6,163,865 A * | 12/2000 | Kempsey | 714/733 |
| 6,182,247 B1 * | 1/2001 | Herrmann et al. | 714/39 |

\* cited by examiner

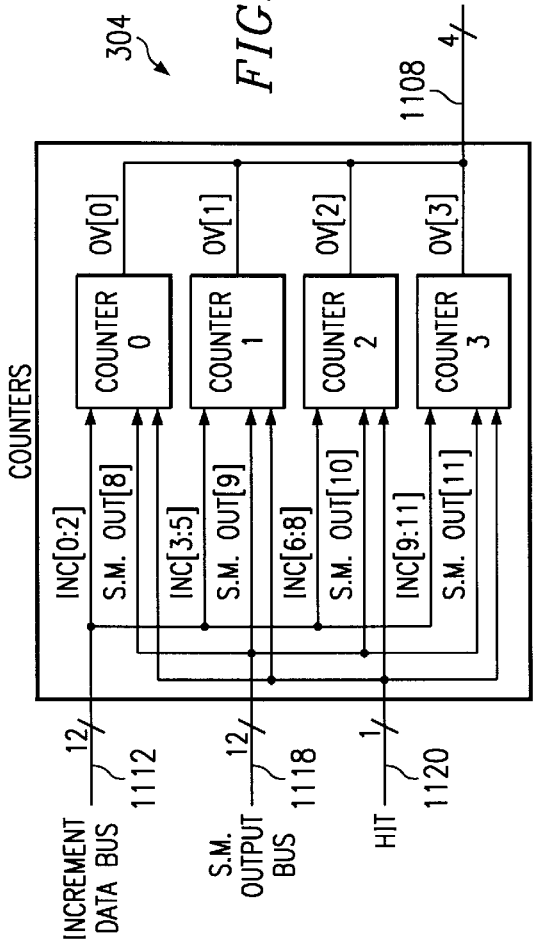
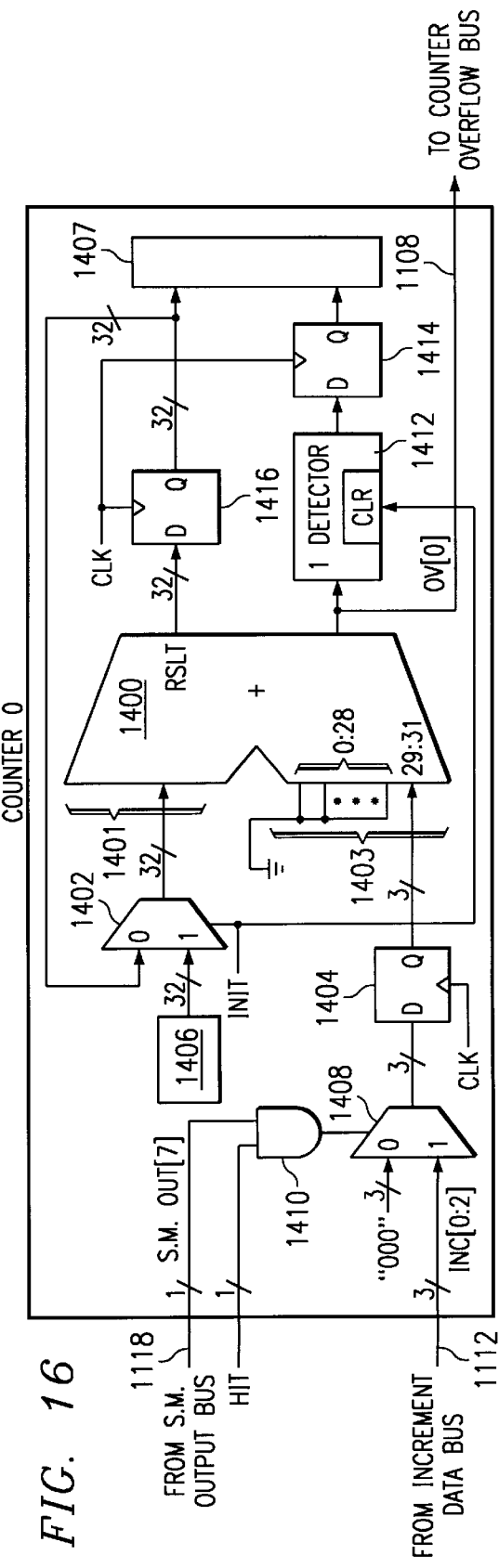
FIG. 15
FIG. 16

MAIN BIST CONTROL REGISTER

METHOD AND SYSTEM FOR FLEXIBLE CONTROL OF BIST REGISTERS BASED UPON ON-CHIP EVENTS

CROSS REFERENCES TO RELATED APPLICATIONS

The subject matter of the present application is related to copending U.S. application Ser. No. 09/183,536, titled "A Flexible and Programmable BIST Engine for On-chip Memory Array Testing and Characterization", filed Oct. 30, 1998, U.S. application Ser. No. 08/741,563, titled "Circuitry and Method for Detecting Signal Patterns on a Bus Using Dynamically Changing Expected Patterns", filed Oct. 31, 1996; U.S. application Ser. No. 08/711,574, titled "Apparatus and Method for Tracking Events in a Microprocessor that can Retire More than Once Instruction During a Clock Cycle", filed Sep. 10, 1996; U.S. application Ser. No. 08/756,594, titled "Cross-Triggering CPUs for Enhanced Test Operations in a Multi-CPU Computer System", filed Nov. 27, 1996; U.S. application Ser. No. 08/753,454, titled "Method for Processing Information in a Microprocessor to Facilitate Debug and Performance Monitoring", filed Nov. 25, 1996; U.S. application Ser. No. 08/742,193, titled "Flexible Circuitry and Method for Detecting Signal Patterns on a Bus", filed Oct. 31, 1996, U.S. application Ser. No. 08/709,798, titled "Apparatus and Method for Comparing a Group of Binary Fields with an Expected Pattern to Generate Match Results", filed Sep. 10, 1996; U.S. application Ser. No. 08/707,936, titled "Circuitry for Providing External Access to Signals that are Internal to an Integrated Circuit-Chip Package", filed Sep. 10, 1996; U.S. application Ser. No. 08/758,606, titled "Input Comparison Circuitry and Method for a Programmable State Machine", filed Nov. 27, 1996; and U.S. application Ser. No. 08/711,491, titled "System and Method for On-chip Debug Support and Performance Monitoring in a Microprocessor", filed Sep. 10, 1996, all of which are assigned to the assignee hereof and are herein incorporated by reference.

FIELD OF THE INVENTION

This invention relates generally to microprocessor testing, and more particularly to a system and method for on-chip debug support and performance monitoring for microprocessors and microprocessor systems.

BACKGROUND

It has become very difficult to diagnose failures in and to measure the performance of state-of-the-art microprocessors. This is because modern microprocessors not only run at very high clock speeds, but many of them also execute instructions in parallel, out of program order and speculatively. Moreover, visibility of the microprocessor's inner state has become increasingly limited due to the complexity of the microprocessors and to practical constraints on the number of external pads that can be provided on the chip package.

In the past, the traditional failure diagnosis and performance measurement tools have been external logic analyzers and in-circuit emulators. Logic analyzers are capable of monitoring signals on the chip pads and other externally-accessible system signals, capturing the state of these signals and generating triggers based on their states. Unfortunately, logic analyzers must rely solely on externally-accessible signals to accomplish this, not on signals that are internal to the chip itself. In-circuit emulators, on the other hand, are used to mimic the functional characteristics of a new microprocessor in a system environment and to add visibility to certain data values within the microprocessor. But such devices only emulate the functionality of the microprocessor. By their very nature, they cannot give an accurate representation of the performance characteristics of an actual silicon device. Therefore, they are primarily useful only for developing and debugging system software.

By way of background, U.S. Pat. No 5,488,688, issued Jan. 30, 1996, to David R. Gonzales, et al., discloses a digital signal processor with a FIFO buffer configured on-chip to monitor a fixed set of internal bus signals. The FIFO buffer is coupled to a debug controller that is capable of operating in first and second modes. In the first mode, the CPU may be halted on the occurrence of one of four specifically-enumerated event conditions: after an external request; after a hardware breakpoint (occurrence of specific data or address values); after a software breakpoint (execution of a specific CPU instruction); or after a specified number of instructions have beeri executed. In the second mode, only the FIFO buffer is halted on the occurrence of an event condition. In either mode, the user may examine the contents of the FIFO buffer after a halt to determine what flow of software instructions were executed just prior to the event occurrence. An off-chip serial interface is used to communicate with the debug controller and to examine the contents of the FIFO buffer. The serial interface complies with the well-known Institute of Electrical and Electronics Engineers (IEEE) Standard 1149.1, "Test Access Port and Boundary Scan Architecture," also known as the Joint Test Action Group (JTAG) standard. A serial port conforming to this standard will hereinafter be referred to as a test access port or "TAP."

By way of further background, U.S. Pat. No. 5,418,452, issued May 23,1995, to Norman C. Pyle, discloses an apparatus for testing integrated circuits using time division multiplexing. In order to reduce the number of pins necessary to communicate the signals from on-chip test nodes to an off-chip logic analyzer, Pyle employs a multiplexer on the chip under test and a demultiplexer in the logic analyzer. Each input of the multiplexer is coupled to an on-chip test node, and the multiplexer select lines are driven by counter outputs. By applying an identical set of counter outputs to the select lines of the demultiplexer, Pyle implements a time-division-multiplexed serial communication line between the chip under test and the logic analyzer. Signals from the numerous test nodes in the chip under test are coupled to the communication line in different time slices. The signals are then reconstructed by the demultiplexer in the logic analyzer.

By way of still further background, U.S. Pat. No. 5,473, 754, issued Dec. 5, 1995 to Dale E. Folwell, et al., discloses a scheme for enabling an off-chip device to monitor the state of an on-chip 24-bit program counter in real time using an 8-bit port on the chip under test. Folwell assumes that discontinuities in the program counter will occur only in a limited number of situations. He then captures the contents of the program address bus only when one of these conditions occurs, and then sends those contents off chip via the 8-bit port. Because the contents of the program address bus are not captured with every increment of the counter, the volume of data that must be output via the 8-bit port is reduced.

By way of still further background, U.S. Pat. No. 5,317, 711, issued May 31, 1994 to Philip A. Bourekas, et al., discloses a scheme for providing off-chip test access to the signals of an on-chip bus that connects an on-chip cache to an on-chip CPU. The signals of the bus are brought out to the chip's external address/data bus when the external address/data bus is not being used for transactions with main memory or peripherals. To accomplish this, reserved pins on the microprocessor are used to control a multiplexer. Depending on the state of the multiplexer's select lines, either the microprocessor's main memory read/write and data lines, or the address that is being provided to the internal cache memory, is coupled to the chip's external address/data bus.

By way of still further background, U.S. Pat. No. 4,910,417, issued Mar. 20, 1990 to Abbas El Gamal, et al., discloses an improved user-programmable interconnect architecture for logic arrays. Specifically, Gamal uses existing row-column selecting logic in combination with an output multiplexer for coupling user-selectable internal circuit nodes to a particular external chip pad for testing. Additionally, latches are provided for each chip input pin so that, with the assertion of an external signal, all chip inputs may be frozen. Then, the row-column select circuitry and output multiplexer may be used to probe nodes within the chip using the latched inputs as stimulus.

While the above structures are useful for the particular purposes for which they are proposed, they fall far short of teaching or suggesting a comprehensive structure for debugging and monitoring the performance of a state-of-the-art microprocessor or microprocessor system.

Adequate debugging and monitoring of a microprocessor or microprocessor system is further exacerbated by the recent trend to place memory devices of the microprocessor system on-chip with the microprocessor and other chip circuitry. As IC fabrication technology has evolved to the sub-micron level, as evidenced by devices fabricated using a 0.25-micron or even smaller fabrication process, it has become possible to place large memory arrays, such as random access memories (RAMs), static random access memories (SRAMs), and cache RAMs, entirely on-chip with the microprocessor and other circuitry. On-chip memory arrays provide the advantage of direct communication with the CPU without the need for I/Os to external pins.

In spite of the advantages of placing memory arrays on-chip, there are concerns with how to accomplish testing of on-chip memory arrays. On-chip memory arrays, which may account for a large portion, even a majority, of the total die area of a chip, are much harder to control and observe than their discrete predecessors, making it difficult to use traditional external tester equipment and hardware to test, screen, characterize, and monitor on-chip arrays. Visibility into how on-chip memory arrays function is severely limited by the placement of the array-chip interface, such as the interface between a memory array and a CPU core of a microprocessor chip, for instance, on-chip.

Prior methodologies for testing on-chip memory arrays include both Built-In-Self-Test (BIST) and Direct Access Testing (DAT). DAT involves porting the memory array I/Os off the chip in order to engage in direct testing of the array, in a manner similar to testing a discrete memory array device. An example of a prior art DAT implementation 10 is shown in FIG. 1. In this figure, the chip is shown as a microprocessor 20 having on-chip memory array 22, multiplexers (mux) 24 and 28, and central processing unit (CPU) core 26. Data is provided to memory array 22 from either high-performance tester hardware that is external to the microprocessor and capable of providing address and data pattern sequences 56 at high speed and large bandwidth for at-speed testing or directly from the CPU core 26. Datapath control of the memory array 22 is therefore provided by multiplexer 24 that provides information 36 to memory array 22 upon selecting information 38 from CPU core 26 or information 42 from the bus interface 30, 50 or 32, 52. Multiplexers 24 and 28 and bus interface 34, and portions of 40, 42 represent special DAT hardware and signals in the memory array datapath. As shown in FIG. 1, DAT I/O interface is provided through bus interface 32 and shared DAT/CPU high-speed chip I/O 52 or, optionally, as indicated by the dashed lines, through DAT I/O interface 34 comprised of bus interface 30 and dedicated DAT high-speed chip I/O 50. Multiplexer 28 chooses information from either bus 40 or bus 46 to present to bus interface 32 via bus 48, as shown. Shared DAT/CPU I/O bus 52 is a microprocessor system bus, such as a cache system bus, that is already available. Data from memory array 22 is provided to CPU core 26 and to either bus interface 30 or 32 via cache address and data busses 40, as shown.

The DAT solution provides the power and flexibility of today's testing equipment but requires more expensive and complex external test support, high-speed I/O for at-speed testing, and additional circuitry and busses than would otherwise be available on the chip in order to properly test and characterize the arrays. For instance, a large memory array that resides on a microprocessor chip, such as a large double-or quad-word accessible cache, would require a large number of external I/O pins or pads of the chip. Additionally, DAT methodologies typically rely upon additional core VLSI datapaths and are thus more dependent on the non-array VLSI.

DAT is also severely challenged by today's high-speed on-chip memory arrays, with frequencies of up to 1 GHz, which typically are much faster than currently available tester technology. A large amount of data must often be presented to the cache of a microprocessor at high speeds, for instance, in order to achieve acceptable fault coverage of the memory. Due to this growing speed discrepancy between on-chip memory arrays and currently available external tester equipment used to test them, the DAT methodology is often no longer capable of testing on-chip memory arrays at speed; it is often necessary to test each array on the chip sequentially or with common test vectors, such as array address and data pattern sequences. Moreover, even as external test equipment can be expected to become faster, memory arrays will themselves also become faster so that this speed discrepancy will continue to be a problem in the future.

BIST differs from DAT in that it essentially integrates the test vector generation provided by the external tester equipment of DAT on-chip. Referring to FIG. 2, a BIST implementation is illustrated. BIST moves the test vector generation on-chip microprocessor 20 inside BIST block 64 so that less hardware is required of the BIST implementation than a DAT implementation. Multiplexer 62, BIST block 64, portions of bus 40, and associated address/data bus 68 represent special BIST hardware in the memory datapath. Previous BIST solutions predominantly hard-wired the test vector generation within BIST block 64 to render only limited, fixed test functionality. In order to provide independent, although restricted, access to just the memory array(s) 22, as opposed to accessing the entire chip 20, BIST operation and extraction of test results are typically accomplished through IEEE Standard 1149.1 Joint Test Action Group (JTAG) boundary scan Test Access Port (TAP).

What is needed is a comprehensive system and method for enabling microprocessor and system designers to debug state-of-the-art microprocessors and systems more easily, and to do so in a highly flexible and sophisticated manner.

Such a system and method should enable tests to be performed using the actual hardware of the device being evaluated, under actual system environment conditions, and while running the device at full speed. Such a system and method should enable programmers to define a wide variety of possible kinds of events that may occur within the microprocessor or system, and to generate a variety of triggers based on those user-definable events. Moreover, the programmer should be able to define a variety of actions that might automatically be taken within the microprocessor or system upon the generation of one of the triggers. In addition, such a system and method should provide the programmer with enhanced access to signals and states that are internal to the microprocessor chip, and should provide this access in a flexible, user-configurable manner.

Additionally, the prior art lacks the ability to directly access, test, and monitor on-chip memory arrays of microprocessor systems in a flexible, thorough manner. Flexibility in test vector generation is particularly essential for testing large, on-chip arrays because it is often impossible to accurately predict critical sensitivities of such arrays. Whether an array passes or fails a given test is dependent upon many interrelated factors, including the voltage to which the array is subjected, the testing temperature, the fabrication process of the array, and the frequency or frequencies at which the array is tested. Large, high-density memory arrays are also notoriously susceptible to various electrical and coupling effects, such as cell-to-cell coupling, bitline coupling, and ground bounce, that may cause logic and timing failures of the array. Moreover, the large number of sub-micron transistors of large, high-density arrays have known possible manufacturing defects, such as particle contamination, missing p-wells, and open/short conditions, for which the arrays must be tested.

SUMMARY OF THE INVENTION

Therefore, according to the present invention, a method and structure facilitates the debugging and test coverage capabilities of a microprocessor. A microprocessor having memory arrays, a debug block, and one or more built-inself-test (BIST) engines is disclosed. The debug block is capable of driving control information out onto a state machine output bus in response to an event and the control information can be selectively used to control signature analysis and/or recording elements of the microprocessor, such as multiple-input-shift-registers and first-in-first-out devices, that facilitate in the monitoring and debugging of the microprocessor. The signature and recording elements may or may not be contained within the one or more BIST engines. The control information interface between the BIST engine(s) and the debug block can greatly facilitate debugging and test coverage of the microprocessor. Alternately, the signature analysis elements and/or recording elements need not necessarily be used in conjunction with the memory arrays and the BIST engine(s) described above. These elements may be used to monitor and test any set of signals of interest occurring within the microprocessor as will be described.

The debug block features user-configurable diagnostic hardware contained on-chip with the microprocessor for the purpose of debugging and monitoring the performance of the microprocessor. A programmable state machine is coupled to on-chip and off-chip input sources. The state machine may be programmed to look for signal patterns presented by the input sources, and to respond to the occurrence of a defined pattern or sequence of defined patterns by driving certain control information onto the state machine output bus. On-chip devices coupled to the output bus take user-definable actions as dictated by the bus. The input sources include user-configurable comparators located within the functional blocks of the microprocessor. The comparators are coupled to storage elements within the microprocessor, and are configured to monitor nodes to determine whether the state of the nodes matches the data contained in the storage elements. By changing data in the storage elements, the programmer may change the information against which the state of the nodes is compared and also the method by which the comparison is made. The output devices include counters. Counter outputs may be used as state machine inputs, so one event may be defined as a function of a different event having occurred a certain number of times or an event may be specified as occurring a specified number of cycles subsequent to another event. The output devices also include circuitry for generating internal and external triggers. User-configurable multiplexer circuitry may be used to route user-selectable signals from within the microprocessor to the chip's output pads, and to select various internal signals to be used as state machine inputs.

Each BIST engine is coupled to the one or more memory arrays and has a main control block, one or more address generation blocks, and one or more data generation blocks. The main control block controls operation of the address generation blocks and the data generation blocks through its main control register. The address generation blocks operate to selectively provide address information to the on-chip memory arrays and include an address local control block having an address control. register and one or more address-data blocks. The address-data blocks have address-data registers that are controlled by the address control register to provide address information to the on-chip memory arrays from either the one or more address generation blocks, or from other on-chip non-BIST engine, non-memory array circuitry of the integrated circuit device such as a CPU, in accordance with instructions programmed into the address control register. The address control register may also be programmed to control the address-data registers to monitor address information provided to the on-chip memory arrays from either the one or more address generation blocks or from other on-chip non-BIST engine circuitry like the CPU.

Similarly, the data generation blocks operate to selectively provide and receive data information to and from the one or more on-chip memory arrays and include a data local control block having a data control register and one or more data—data blocks. The data—data blocks have data—data registers controlled by the data control register to provide or monitor data information from either the one or more data generation block or on-chip non-BIST engine circuitry of the integrated circuit device, such as the CPU, to the on-chip memory arrays in accordance with instructions programmed into the data control register and to receive information from the memory arrays. The main control register of the main control block coordinates when the address generation blocks and the data generation blocks execute their programming and can also ensure that the BIST engine operates synchronously with the non-BIST engine circuitry of the integrated circuit chip.

The address generation blocks and the data generation blocks of the BIST engine are programmed to provide address and data information to the on-chip memory arrays and to receive data information from the memory arrays in order to facilitate monitoring of the memory arrays. Programming the address and data generation blocks is accomplished by programming the appropriate control registers of the local address and data local control blocks to control the address and data generation blocks in the manner desired. The main control block is then programmed to coordinate execution by the address and data generation blocks of their programming; the main control block also ensures that the BIST engine operates synchronously with the CPU of the chip.

BRIEF DESCRIPTION OF THE DRAWINGS

The present invention is described herein with reference to the accompanying drawings, like reference numbers being used therein to indicate identical or functionally similar elements.

FIGS. 5 and 5A–5D represent a block diagram illustrating host microprocessor 100 with a preferred embodiment of the invention implemented therein.

FIG. 15 is a block diagram illustrating the counters of FIG. 13.

FIG. 16 is a block diagram illustrating a representative one of the counters of FIG. 15.

DETAILED DESCRIPTION OF THE INVENTION

Table of Contents
1. Host Systems
   1.1 An exemplary host microprocessor
   1.2 An exemplary multi-processor host computer system
2. Overview
3. The Debug Function
   3.1 Staging register and control registers
      3.1.1 Writing to a remote register
      3.1.2 Reading from a remote register
   3.2 Programmable state machine, counters, CPU core and off-chip trigger interfaces
   3.3 System bus interface components
   3.4 Fetch unit components
   3.5 Data cache interface components
   3.6 Sort unit components
   3.7 Retire unit components
   3.8 Off-chip data interface
4. The Built-in-self-test Engine
   4.1 A basic BIST engine implementation
   4.2 The address generation block (AGB)
   4.3 The data generation block (DGB)
   4.4 BIST main control (BMC)
   4.5 Sample BIST engine implementation
5. The Interface Between the Debug Function and the BIST Engine
   5.1 Signature analysis using control signal K
   5.2 Accessing recorded event information using control signal I
1. Host Systems The present invention may be applied beneficially in a wide variety of different kinds of microprocessors. For purposes of illustration, the invention will be described herein with reference to a particular kind of microprocessor, namely a four-way superscalar reduced instruction set ("RISC") microprocessor. It is believed that this form of description will enable persons having ordinary skill in the art not only to make and use the invention, but also readily to perceive any modifications or adaptations necessary to apply the invention to microprocessors other than the one specifically described herein. This section one will describe the illustrative host microprocessor first without having any of the components of the invention added to it. The remaining sections will describe a preferred implementation of the invention within the context of the exemplary host microprocessor discussed in this section one.

1.1 An Exemplary Host Microprocessor

Figure 1:
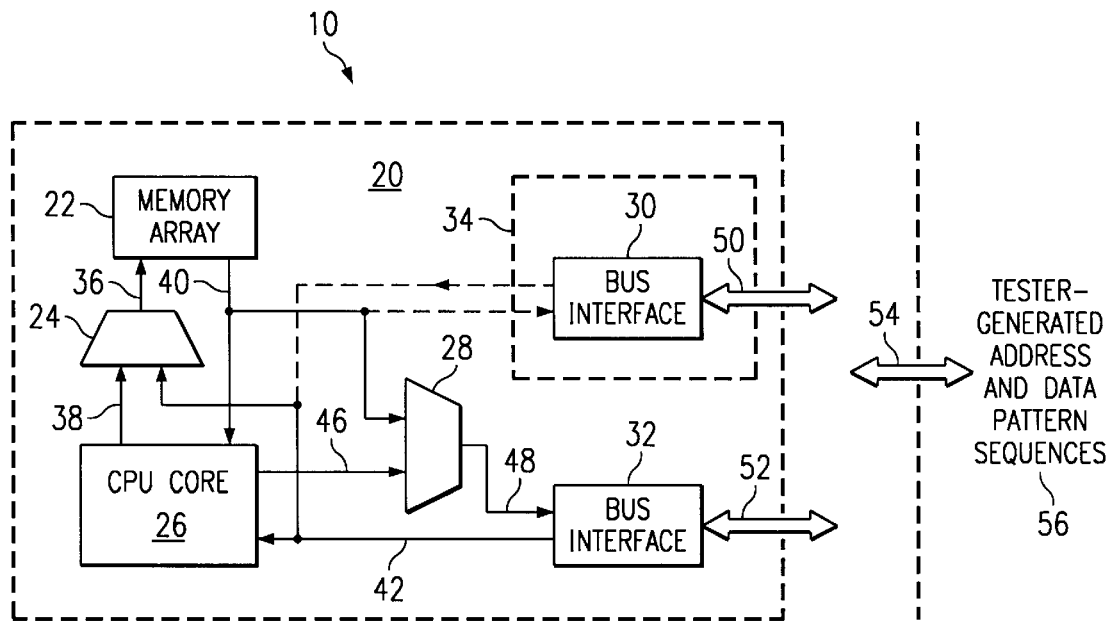
FIG. 1 illustrates a block diagram of direct access testing (DAT), according to the prior art.
Figure 2:
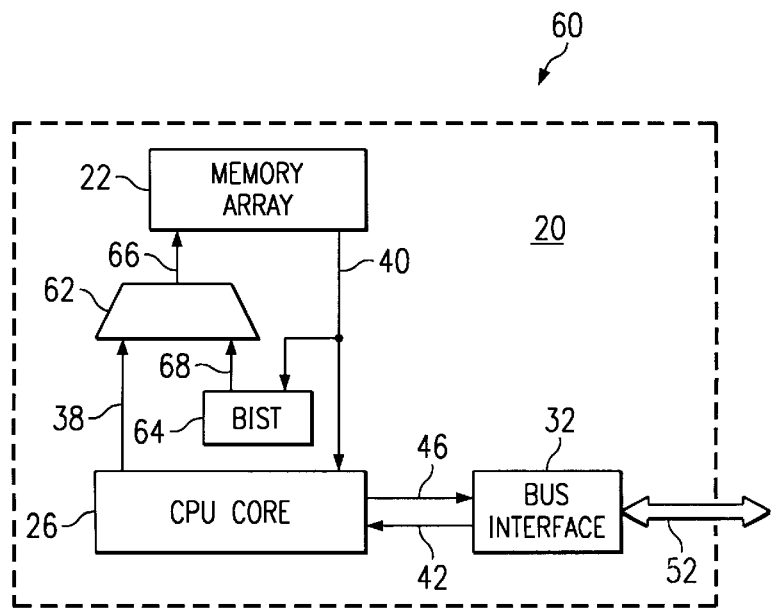
FIG. 2 illustrates a block diagram of a built-in-self-test (BIST) implementation.
Figure 3:
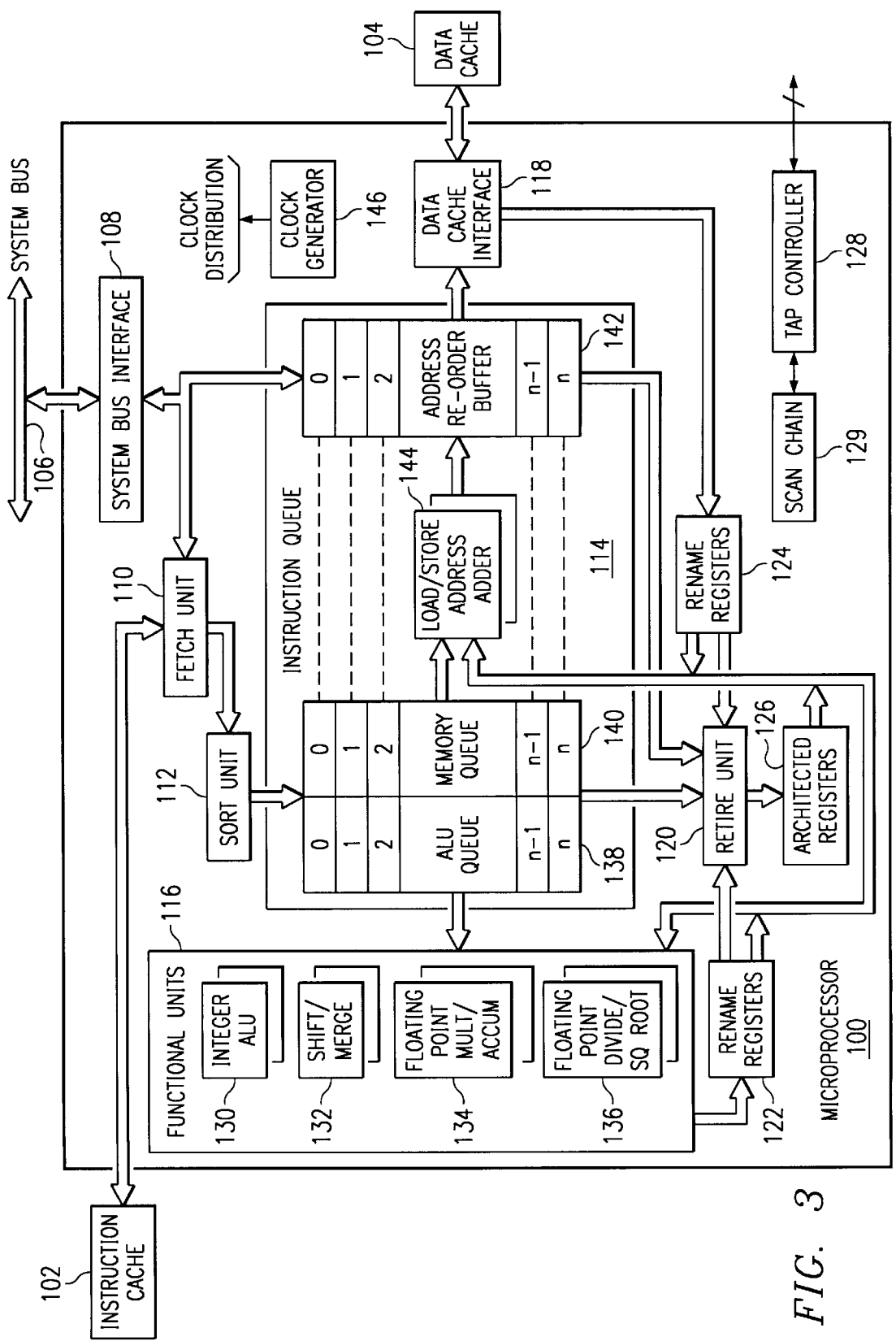
FIG. 3 is a block diagram illustrating a host four-way superscalar RISC microprocessor 100 coupled to an instruction cache, a data cache and a system bus.

FIG. 3 is a block diagram of an exemplary RISC microprocessor 100 before the addition of any of the components of the invention. Microprocessor 100 is coupled to an instruction cache 102, a data cache 104 and a system bus 106. Microprocessor 100 includes system bus interface unit 108, instruction fetch unit 110, sort unit 112, instruction queue unit 114, functional units 116, data cache interface unit 118, retire unit 120, rename register blocks 122, 124, architected register block 126, test access port ("TAP") controller 128, scan chain 129 and clock generator 146. Functional units 116 include dual integer ALUs 130, dual shift/merge units 132, dual floating point multiply/accumulate units 134, and dual floating point divide/square root units 136. Instruction queue unit 114 includes ALU instruction queue 138, memory instruction queue 140, address reorder buffer 142, and dual load/store address adders 144.

System bus 106 is a 64-bit multiplexed address/data split transaction bus that uses the same protocol as the system bus of the well-known PA-7200 microprocessor manufactured and sold by Hewlett Packard Company. System bus interface 108 is provided to implement the protocol necessary for microprocessor 100 to communicate with memory subsystem 208 and input/output subsystem 210 over system bus 106.

Instruction fetch unit 110 is provided to retrieve instructions from instruction cache 102 or, in the case of cache misses, from main memory subsystem 208. During normal operation, instruction fetch unit 110 is capable of retrieving up to four quadword-aligned instructions per cycle from single-level instruction cache 102. Cache lines can also be loaded into instruction queue 114 by sort unit 112 at the rate of four instructions per cycle, thus keeping pace with instruction fetch unit 110. When instruction fetch unit 110 indicates a cache miss, system bus interface 108 initiates instruction cache prefetches by fetching the next sequential line of instructions from main memory subsystem 208. High-bandwidth connections are provided both to instruction cache 102 and to data cache 104 to enhance performance. Data cache 104 is preferably dual-ported, with each port having access to a double word per cycle.

Because the overall objective behind the design of a microprocessor such as microprocessor 100 is to enhance performance by reducing the ratio of clock cycles per instruction executed, it is desirable that more than one instruction may be executed concurrently (thus the nomenclature "super-scalar"). In the example of microprocessor 100, duplicate functional units are provided so that as many as four separate instructions may be started during any one clock cycle. However, in order to keep these functional units fully occupied, it is necessary to find four instructions that may be executed simultaneously. This task is known as instruction scheduling and sometimes involves executing instructions out of program order. While instruction scheduling may be left to the compiler, any four sequential instructions are likely to contain data dependencies that cannot be resolved at compile time. Therefore, in microprocessor 100, a large instruction queue 114 is provided so that instruction scheduling may be achieved in hardware to extract maximum parallelism from the instruction stream. ALU queue 138 and memory queue 140 are each 28-entries deep. ALU queue 138 holds instructions destined for functional units 116, while memory queue 140 holds memory load/store instructions. Certain instruction types such as load-and-modify instructions and branch instructions go into both queues. As a result, microprocessor 100 has the ability to examine up to 56 recently-fetched instructions in order to find four instructions that may be executed simultaneously.

Once a group of instructions has been fetched, insertion of the instructions into instruction queue 114 is handled by sort unit 112. Specifically, sort unit 112 receives four instructions from instruction fetch unit 110 and determines which of the four were actually requested by the CPU. (Sometimes a fetched bundle of four instructions contains superfluous instructions simply because instructions are fetched four at a time.) This determination is called instruction validation. Sort unit 112 then routes the valid instructions to one or both of ALU queue 138 and memory queue 140. Each of the queues 138 and 140 can handle up to four instructions per cycle, so an arbitrary collection of four instructions may be inserted into the queues simultaneously. As was mentioned previously, queues 138 and 140 each have entries or "slots" for 28 different instructions. Once a new instruction has been placed into a slot within one of the queues, hardware monitors the previous instructions that are then launching from the queues to functional units 116 and address adders 144. This is done in order to determine whether any of the now-launching instructions will supply an operand needed by the new instruction. Once the last instruction upon which the new instruction depends has been launched to functional units 116 or address adders 144, then the slot containing the new instruction begins to arbitrate for its own launch to functional units 116 or address adders 144.

Up to two instructions may be launched simultaneously from each of ALU queue 138 and memory queue 140. Because the hardware within functional units 116 and address adders 144 is duplicated, arbitration in each of the queues is handled in two groups. For example, even-numbered slots within ALU queue 138 arbitrate for launch to ALU0, and odd numbered slots arbitrate for launch to ALU1. Arbitration proceeds similarly among the slots within memory queue 140. In each queue, the even-numbered slot with the oldest instruction and the odd-numbered slot with the oldest instruction win arbitration and are launched to functional units 116 or address adders 144.

Address reorder buffer 142 is provided to help eliminate performance penalties that are associated with load-store dependencies. When a load or store instruction in a slot of memory queue 140 has received all of its operands, it requests to be dispatched just like an ALU instruction. The destination of the load/store instruction, however, will be one of address adders 144 instead of one of functional units 116. Address adders 144 are provided so that the effective address for the load/store instruction may be calculated before executing the instruction. Once calculated, the effective address is stored into one of 28 slots within address reorder buffer 142. (Each of the 28 slots within address reorder buffer 142 is associated with one of the slots in memory queue 140.) The effective address also goes to the translation look-aside buffer (not shown), which returns a physical address that is placed into the same slot of address reorder buffer 142. With its address stored in address reorder buffer 142, the load/store instruction begins arbitrating for access to one of the banks of synchronous SRAM that make up dual-ported data cache 104. The instruction tries again on each successive cycle until it wins access. (Arbitration is based on the age of the original load/store instruction, not the time its address has been in address reorder buffer 142. Priority is given to the oldest instruction.) Address reorder buffer 142 also checks for store-to-load dependencies as follows: Whenever a store instruction has its effective address calculated, the address is compared to the addresses of any younger load instructions that have completed their cache accesses by executing out of order. If the addresses are the same, then the load and all younger instructions are flushed from address reorder buffer 142 and reexecuted. Similarly, whenever a load instruction has its address calculated, the addresses of all older stores in address reorder buffer 142 are compared with it. In the event of a match, the load waits until the store data becomes available. These mechanisms are provided to ensure that out-of-order execution cannot cause stale data to be read.

Retire block 120 is provided to remove instructions from instruction queue 114 in program order after they have successfully executed or after their trap status is known. Up to four instructions may be retired per cycle—two from ALU queue 138 and two from memory queue 140. If an instruction needs to signal a trap, the trap parameters are recorded in the architected state, and the appropriate trap vector is forwarded to instruction fetch unit 110, which then begins fetching from the new address.

Microprocessor 100 employs register renaming to execute (but not retire) instructions speculatively. Rename register blocks 122 and 124 contain a total of 56 rename registers, one for each slot within ALU queue 138 and memory queue 140. In addition, architected register block 126 contains 32 integer and 32 floating point architectural registers. At retire time, the contents of the rename register associated with a given instruction are committed to the appropriate architectural register, and any store data is forwarded to a buffer (not shown) that holds data to be written to data cache 104.

Test access port ("TAP") controller 128 is provided to implement a serial off-chip interface in accordance with the well-known Institute of Electrical and Electronics Engineers (IEEE) Standard 1149.1, "Test Access Port and Boundary Scan Architecture," also known as the Joint Test Action Group ("JTAG") standard. TAP controller 128 is coupled to numerous test nodes located adjacent to the chip pads of microprocessor 100. Such an arrangement of test nodes is commonly called a "scan chain," as is indicated in the drawing at 129. TAP controller 128 may be commanded to latch the state of the various test nodes constituting scan chain 129, and the data thus captured may then be shifted serially off-chip via the test access port for analysis by external equipment.

Further information about the structure and operation of microprocessor 100 may be found in the engineering and user documentation supplied with the PA-8000 microprocessor manufactured and sold by Hewlett Packard Company.

1.2 An Exemplary Multi-processor Host Computer System

Figure 4:
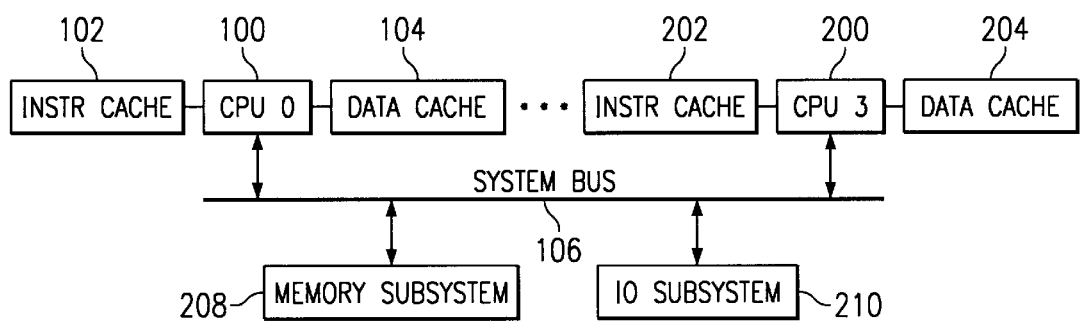
FIG. 4 is a block diagram illustrating a host multiprocessor computer system based on microprocessor 100.

As shown in FIG. 4, a complete computer system may be constructed using one or more microprocessors 100, 200 coupled via system bus 106 to a memory subsystem 208 and an input/output subsystem 210. In a multi-processor implementation such as that shown in FIG. 4, each of microprocessors 100, 200 would preferably have its own instruction cache 102, 202 and its own data cache 104, 204.

2. Overview

FIG. 5 is a block diagram illustrating host microprocessor 100 having a preferred embodiment of the invention implemented therein. State machine block 300 includes programmable state machine 302, counters 304, off-chip trigger interface 306 and CPU core interface 308. Off-chip trigger interface 306 provides a three-bit interface to components external to microprocessor 100. CPU core interface 308 provides a TRIG_TRAP signal to fetch unit 110, a control signal I to TAP controller 128, and two control signals J to clock generator 146.

Off-chip data interface 310 provides a 63-bit interface to components external to microprocessor 100. Its data inputs comprise 603 total signals coming from various points located throughout microprocessor 100.

System bus interface 108 is provided with system bus interface comparators 312 and performance signal generation logic 314. System bus interface comparators 312 take six bits of input from within system bus interface 108 and provide two output bits A to programmable state machine 302. Performance signal generation logic 314 provides six output bits B to programmable state machine 302.

Fetch unit 110 is provided with fetch unit comparators 316. Fetch unit comparators 316 take as inputs four instructions I0–I3, certain address bits ADR and a cache index CI. Address bits ADR and cache index CI correspond to the virtual address and the cache index for the fetched bundle of four instructions comprising instructions I0–I3. Fetch unit comparators 316 provide four output bits D to programmable state machine 302 and sixteen output bits 318 to sort unit 112.

Sort unit 112 is provided with validate logic 320. Validate logic 320 takes as inputs four bits from within sort unit 112, and the sixteen bits 318 that were generated by fetch unit comparators 316. Validate logic 320 provides four output bits E to programmable state machine 302 and sixteen output bits 322 to instruction queue 114.

Data cache interface 118 is provided with data cache interface comparators 324. Recall that data cache 104 is preferably organized as a dual-port unit. Thus, an even and an odd port exist for data loads. In this implementation, data stores share a common 64-bit data bus. Correspondingly, data cache interface comparators 324 have two sets of inputs for loads—one set for even loads and one set for odd loads. A third set of inputs is provided for stores, as shown. Data cache interface comparators 324 provide six total output bits F, G to programmable state machine 302. The four output bits F are also provided to instruction queue 114.

Data flow is provided from validate logic 320 and data cache interface comparators 324 to retire unit 120 via instruction queue 114. To accomplish this, new bit fields 326, 328 and 330 are added to each of the slots within ALU queue 138, memory queue 140 and address re-order buffer 142, respectively. The sixteen output bits 322 from validate logic 320 are stored in bit fields 326, 328. Output bits 322 include four bits per instruction (regardless of whether the instruction is an ALU-type or a memory-type instruction), and there is a potential maximum of four instructions entering instruction queue 114 from sort unit 112 during a given clock cycle. Thus, output bits 322 comprise a maximum of four different 4-bit sets. Each of the 4-bit sets is placed in the same slot of instruction queue 114 as the instruction to which it corresponds.

Similarly, the four output bits F from data cache interface comparators 324 comprise a maximum of two different 2-bit sets. These 2-bit sets are stored in bit field 330 in the same slot of instruction queue 114 as the instructions to which they correspond. Because results F from data cache interface comparators 324 always pertain to load-type memory instructions, and because even and odd load instructions are allowed to execute simultaneously in the architecture of microprocessor 100, one of these 2-bit sets will always correspond to an even load instruction, and the other will always correspond to an odd load instruction. Therefore, in order to represent this information properly in address re-order buffer 142, two bits in each slot of bit field 330 are reserved for one of the 2-bit sets produced by data cache interface comparators 324, and one additional bit in each slot of bit field 330 is reserved to indicate whether the 2-bit set just stored there derived from an even or an odd load instruction. Consequently, although outputs F comprise a maximum of four total bits (two result bits for each simultaneously-executing load instruction), a maximum of six bits may actually be stored in address-re-order buffer 142 during a given clock cycle. (In a preferred embodiment, the even/odd indicator need not be independently generated and stored in address re-order buffer 142 with the comparison results. This is because, in such an embodiment, the address of the load instruction will already be stored in address re-order buffer 142; therefore, the even/odd bit may be determined from this previously-stored address whenever it is needed.)

Retire unit 120 is provided with retiring instruction comparator matrix 332 and overall match generation matrix 334. Retiring instruction comparator matrix 332 takes, as its inputs, 24 bits of "retire-time information" from instruction queue 114. These 24 bits comprise six bits of retire-time information for each of the four instructions retiring during a given clock cycle. (Some of these bits will be null if fewer than four instructions actually retire during that clock cycle.) Retiring instruction comparator matrix 332 provides sixteen output bits to overall match generation matrix 334. Overall match generation matrix 334 takes these sixteen bits as inputs, as well as 22 other bits from instruction queue 114. The latter 22 bits include the 16 bits 322 from validation logic 320 that were previously placed in bit fields 326, 328, and the 6 bits deriving from data cache interface comparators 324 that were previously placed in bit field 330. Based on these inputs, overall match generation matrix 334 provides 12 output bits H to programmable state machine 302.

TAP controller 128 is provided with sample-on-the-fly circuitry 336. Sample-on-the-fly circuitry 336 takes as an input the control signal I generated by CPU core interface 308, and is coupled to numerous test nodes 0–n located throughout microprocessor 100. Its purpose is to latch, in a conventional manner, the state of test nodes 0–n whenever control signal I is asserted. After the state of the test nodes is so latched, TAP controller 128 may then be used to clock the latched information serially off-chip in a conventional manner via the test access port. The information may then be analyzed by components external to microprocessor 100.

Staging register circuitry 338 is provided, and is coupled to architected registers 126 via parallel data bus 340. This enables data to be transferred between architected registers 126 and staging register 338 by executing an instruction on microprocessor 100. Serial data and control lines 342 form a serial loop comprising staging register circuitry 338, fetch unit comparators control register circuitry 344, state machine/counters control register circuitry 346, system bus interface comparators control register circuitry 348, off-chip data interface control register circuitry 350, data cache interface comparators control register circuitry 352 and retire unit comparators control register circuitry 354.

As can be seen in FIG. 5, the CPU core interface block 308 of the debug circuitry described above provides control signals I and K to BIST engines 150 and 160. This interface between on-chip debug hardware and the cache BIST engine hardware allows certain BIST registers to be controlled based upon events or other triggers that occur in the microprocessor 100. The I and K signals control the BIST engines to achieve two important objectives of the present invention: to debug and to test microprocessor 100. Alternately, as will be described, these signals can be used to debug and test microprocessor 100 without going through the BIST engines.

3. The Debug Function 3.1 Staging Register and Control Registers

Staging register circuitry 338 and control register circuitries 344–354, as well as how data communication is achieved between them and architected registers 126, will now be described with reference to FIGS. 4–10.

Figure 6:
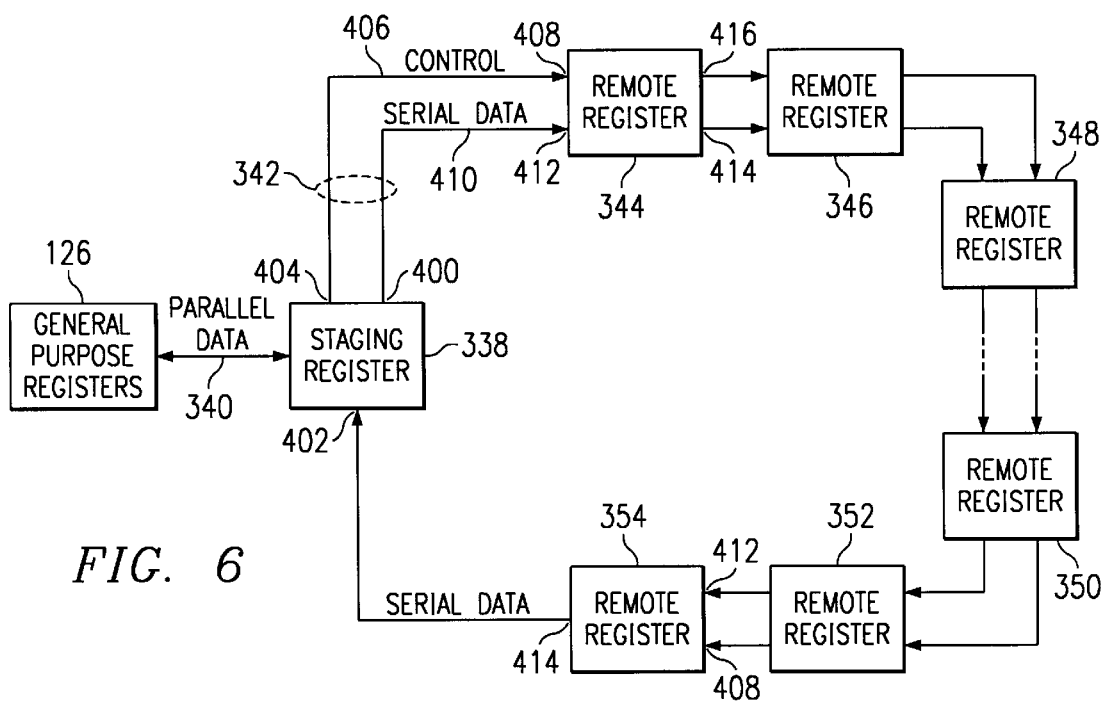
FIG. 6 is a block diagram illustrating a serial loop of control registers interfaced with a staging register and a general-purpose architected register.
Figure 5A:
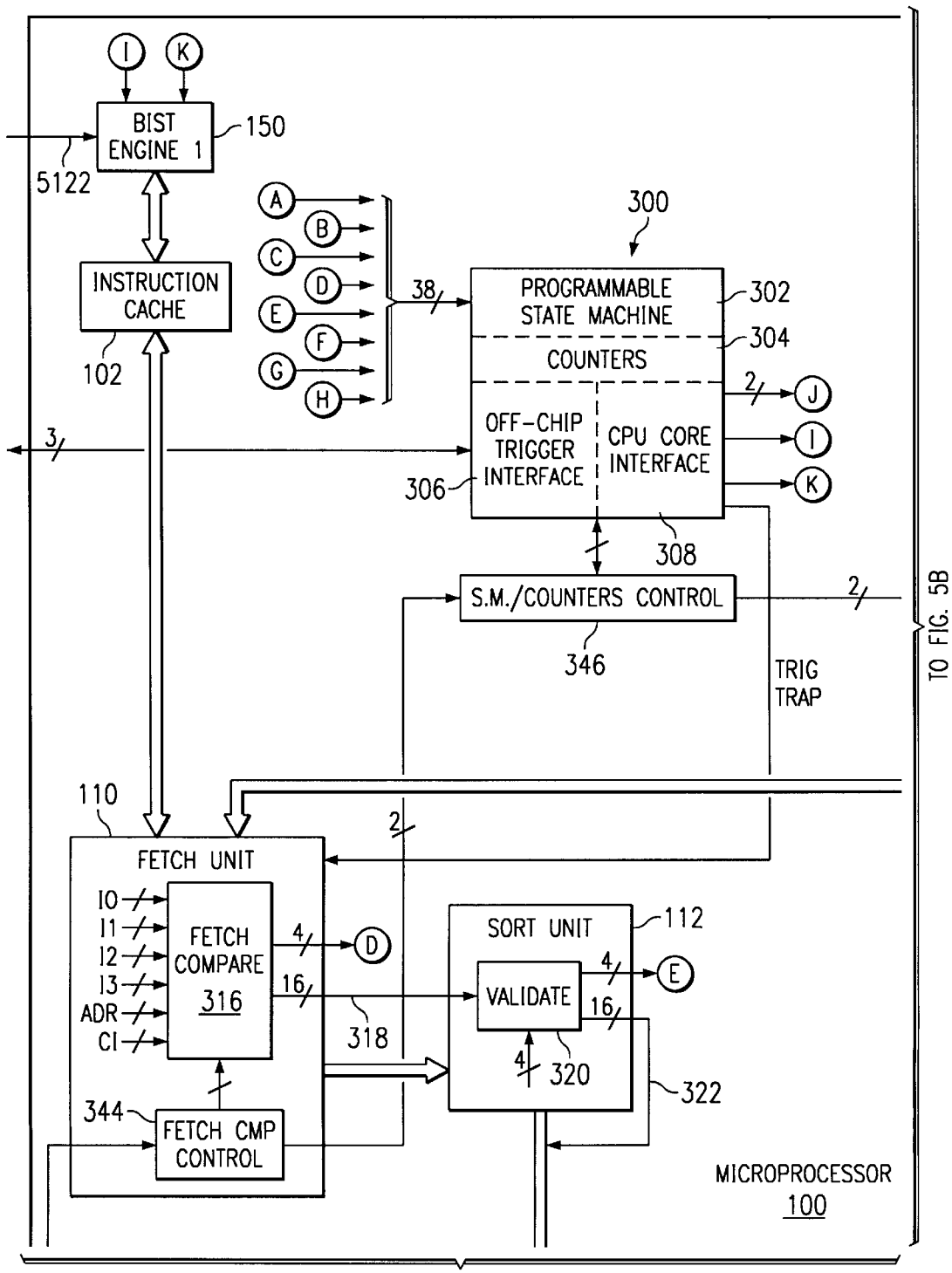
Figure 5B:
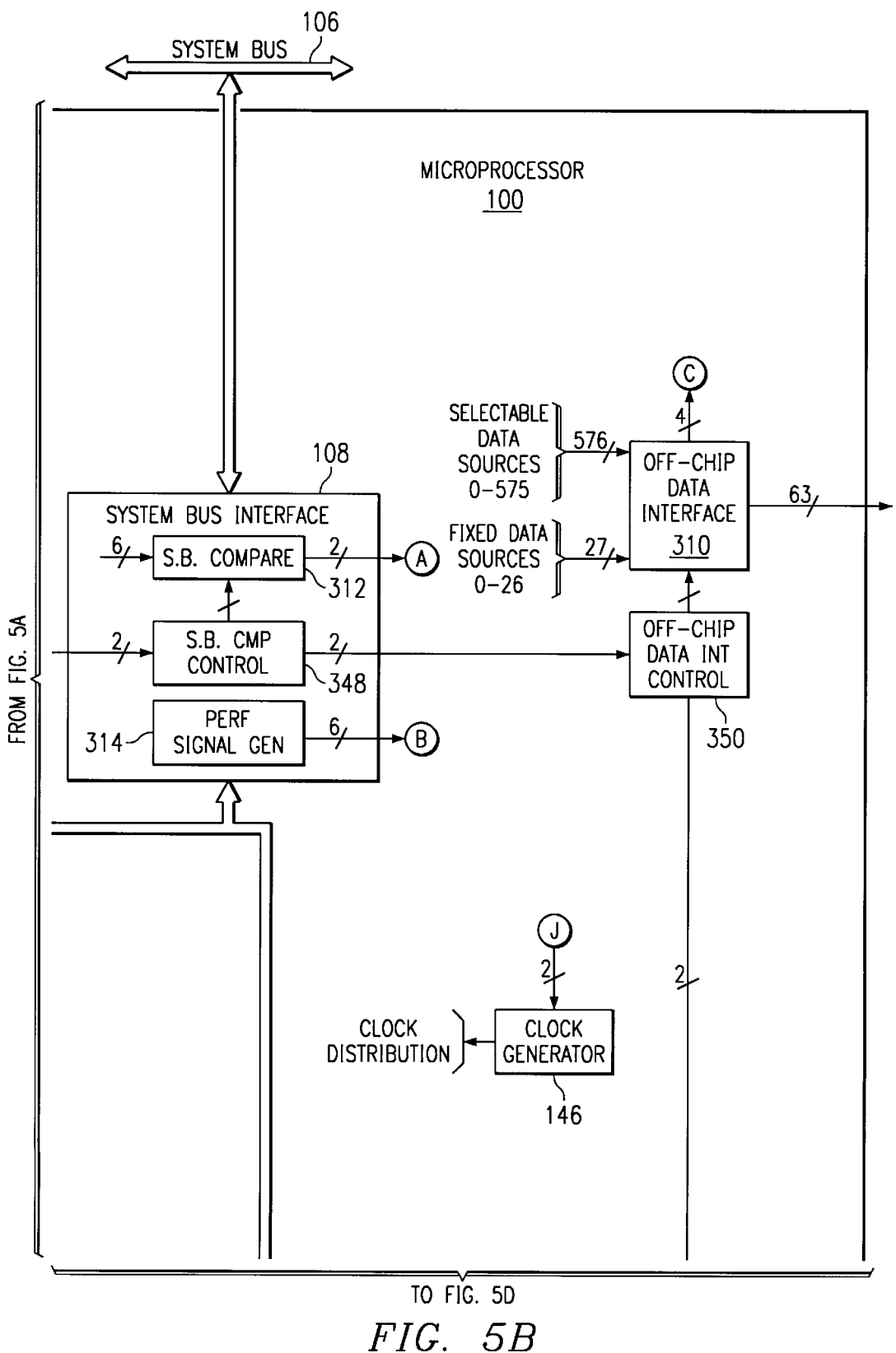
Figure 5C:
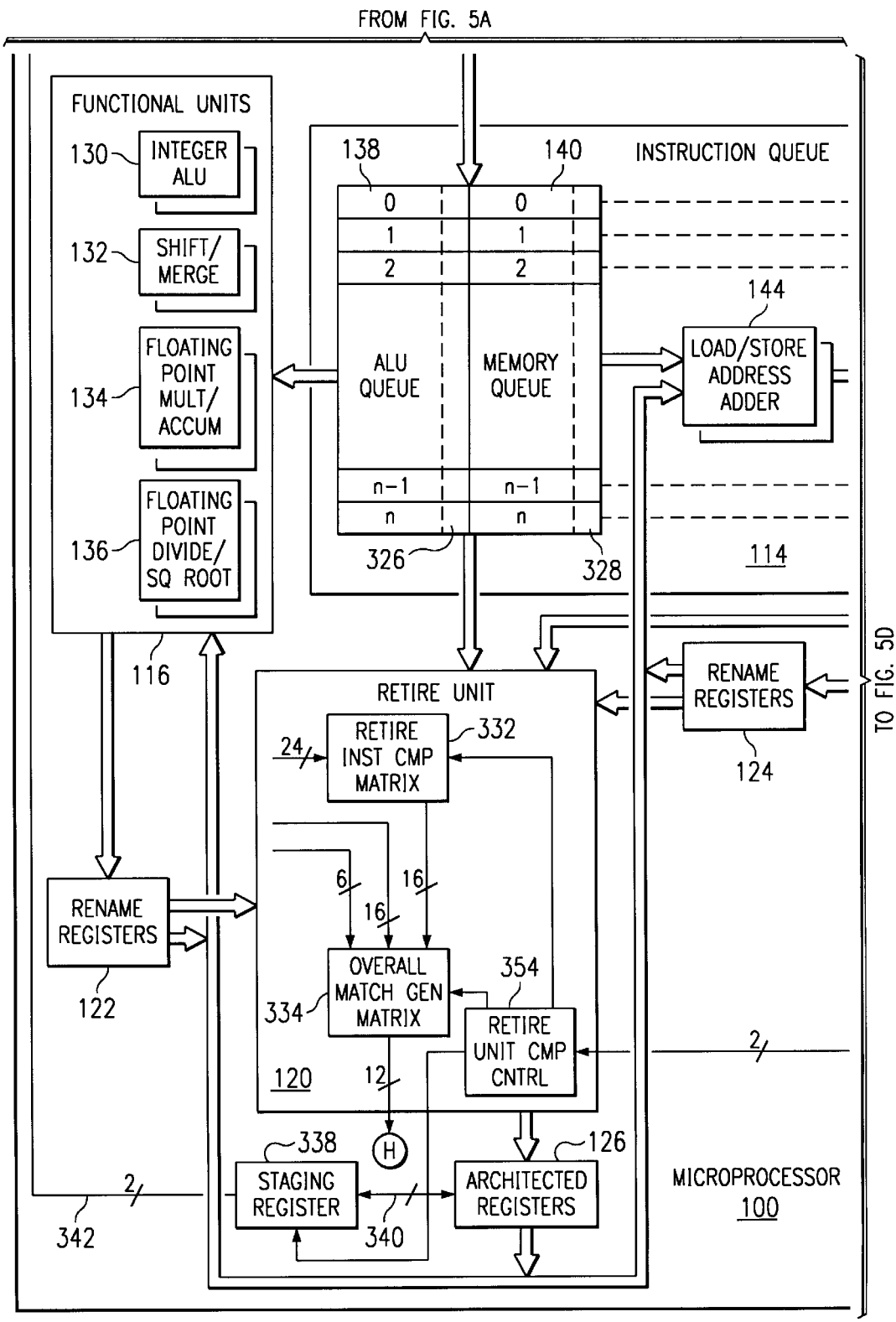
Figure 5D:
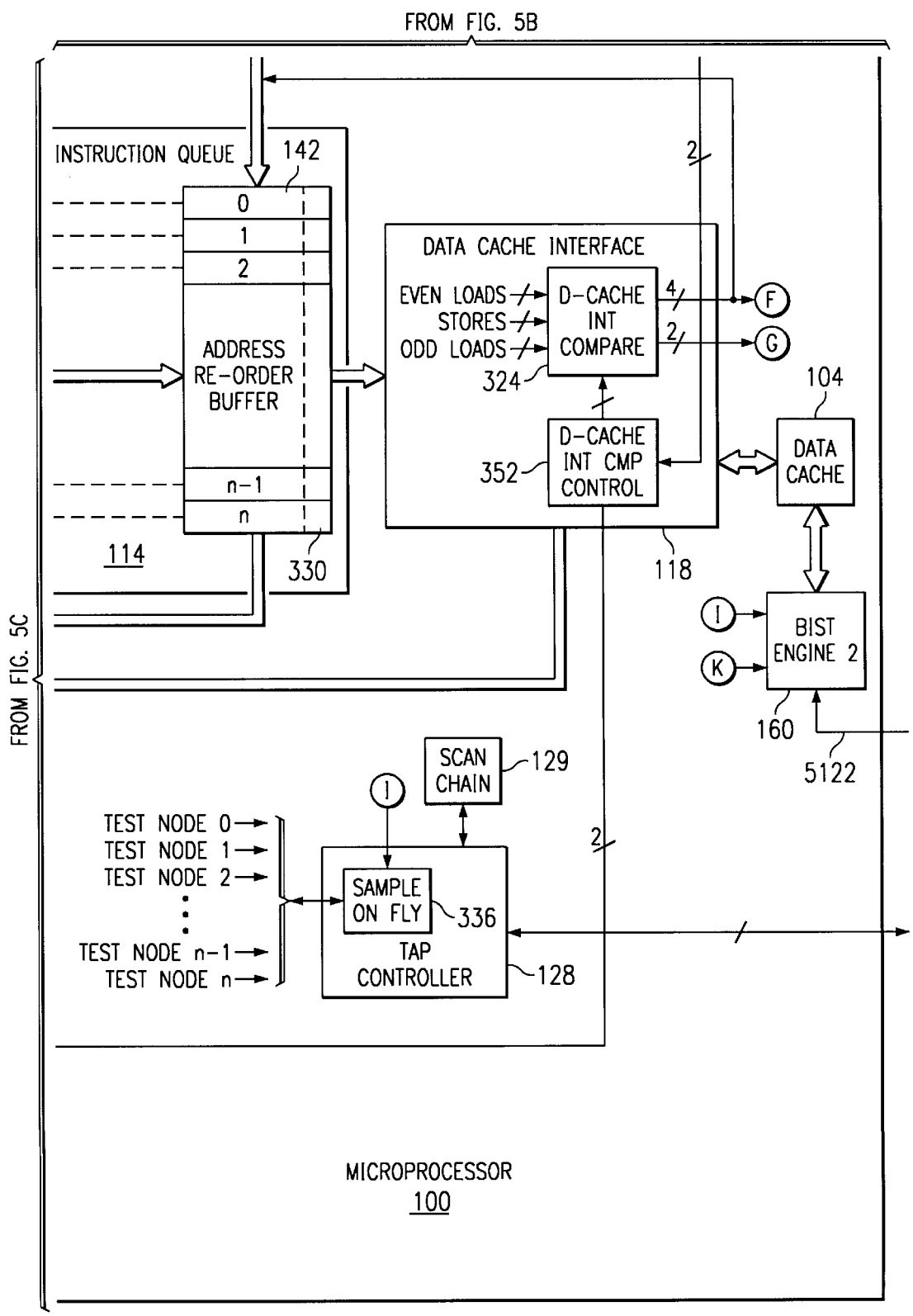

As can be seen in FIG. 6, a serial loop is formed by remote register circuitries 344–354 and staging register circuitry 338. Staging register circuitry 338 has a serial data output 400, a serial data input 402, and a control signal output 404. The staging register circuitry control signal output 404 is coupled via control line 406 to a corresponding control signal input 408 of remote register circuitry 344. Likewise, the staging register circuitry serial data output 400 is coupled via serial data line 410 to a corresponding serial data input 412 of remote register circuitry 344. Each of remote register circuitries 344–352 has a serial data input 412, a serial data output 414, a control signal input 408 and a control signal output 416. Remote register circuitry 354 has a serial data input 412, a serial data output 414 and a control signal input 408. Thus, the signal on serial data line 410 may be propagated in serial fashion from the serial data output 400 of staging register 338, through each of remote register circuitries 344–354 and back into the serial data input 402 of staging register circuitry 338. Similarly, the signal on control line 406 may be propagated from the control signal output 404 of staging register circuitry 338 to remote register circuitry 354 through each of the intervening remote register circuitries. Staging register circuitry 338 is coupled to general purpose register circuitry 126 via parallel data bus 340.

Figure 7:
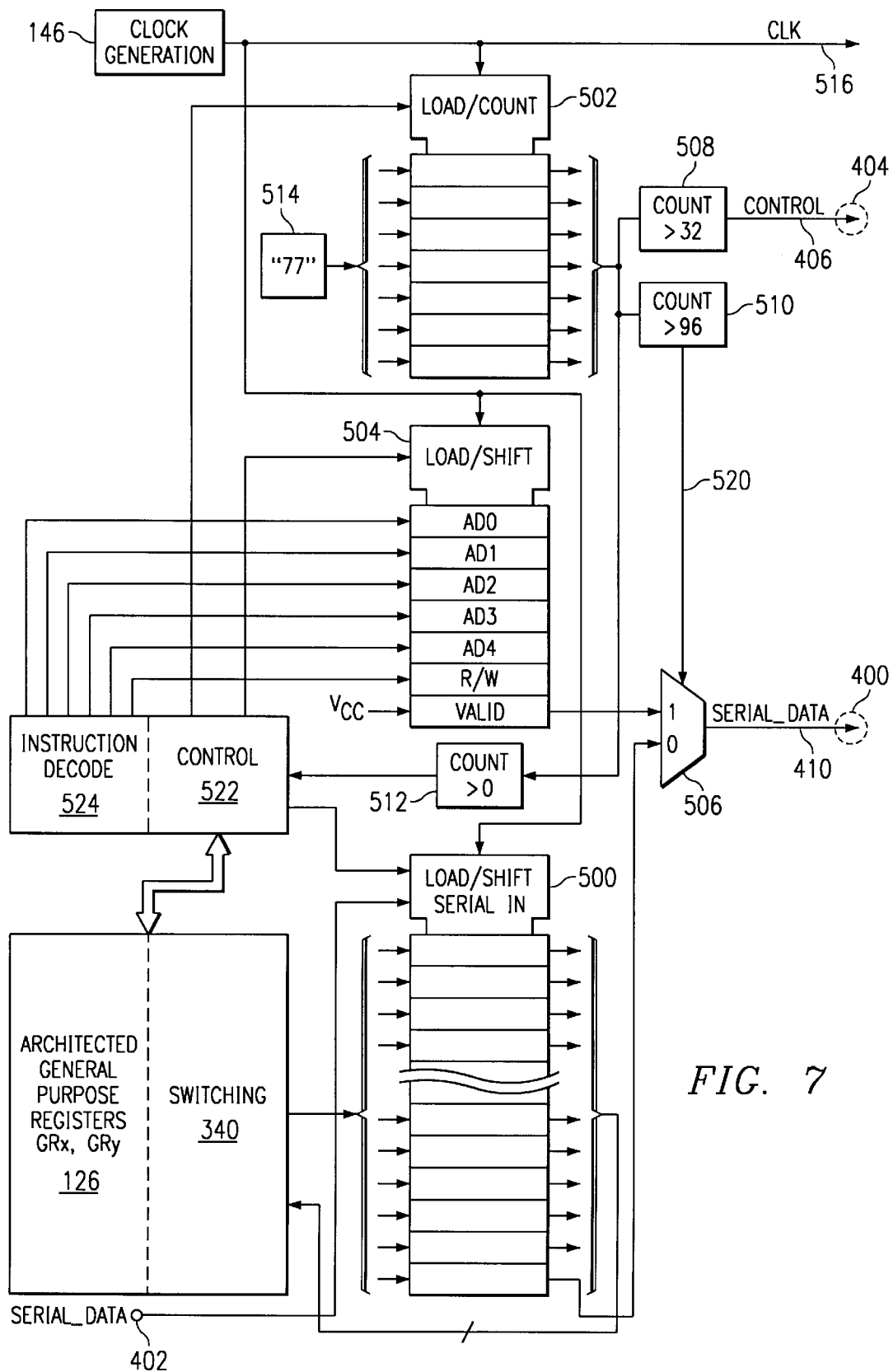
FIG. 7 is a block diagram illustrating the details of the staging register and general purpose registers of FIG. 6 and their associated logic.

FIG. 7 is a block diagram illustrating staging register circuitry 338 and general purpose register circuitry 126 in more detail. General purpose register circuitry 126 is coupled to staging register 500 via a parallel data bus 340. Data bus 340 is shown in FIG. 7 in the form of conventional switching circuitry appropriate for directing read and write data between staging register 500 and one of the general purpose registers within microprocessor 100's general purpose registers 126. Also shown in FIG. 7 is clock generation logic 146, counter 502, header generation register 504, multiplexer 506, comparators 508, 510 and 512, and ROM 514.

For the purpose of explaining the concept and preferred implementation of staging register circuitry 338 and control register circuitries 344–354 in this section 2.2, we will assume that the control registers contained in remote register circuitries 344–354 are each 64 bits deep. It will be apparent with reference to sections 2.3 et seq., however, that the number of actual bits contained in these control registers varies. Also, in actual implementations, the staging register need not be the same length as the remote registers. Moreover, the remote registers need not all be the same length as one another. (Multiple operations may be used to read and write remote registers that are longer than the staging register.)

ROM 514 may be implemented simply as hardwired connections to power supply and ground as required to present the binary equivalent of decimal "77" to the parallel data load inputs of counter 502. Counter 502 should be configured to count down whenever it receives a clock and its control input indicates count. When its control input indicates load, counter 502 will be reset to the value "77." Clock generation logic 146 generates clock signal 516, which may be used to drive clock inputs throughout the chip. Comparator.508 will assert control line 406 whenever the output of counter 502 exceeds decimal 6. Comparator 510 will assert main serial data multiplexer control line 520 whenever the output of counter 502 exceeds decimal 70. And comparator 512 will assert a signal to control logic 522 within microprocessor 100 whenever the output of counter 502 exceeds 0. As is indicated in the drawing, the control signals for counter 502, header generation register 504 and staging register 500 may be provided by control logic 522 within microprocessor 100. Also, the parallel data load inputs of header generation register 504 are provided by instruction decode logic 524 within microprocessor 100.

Figure 8:
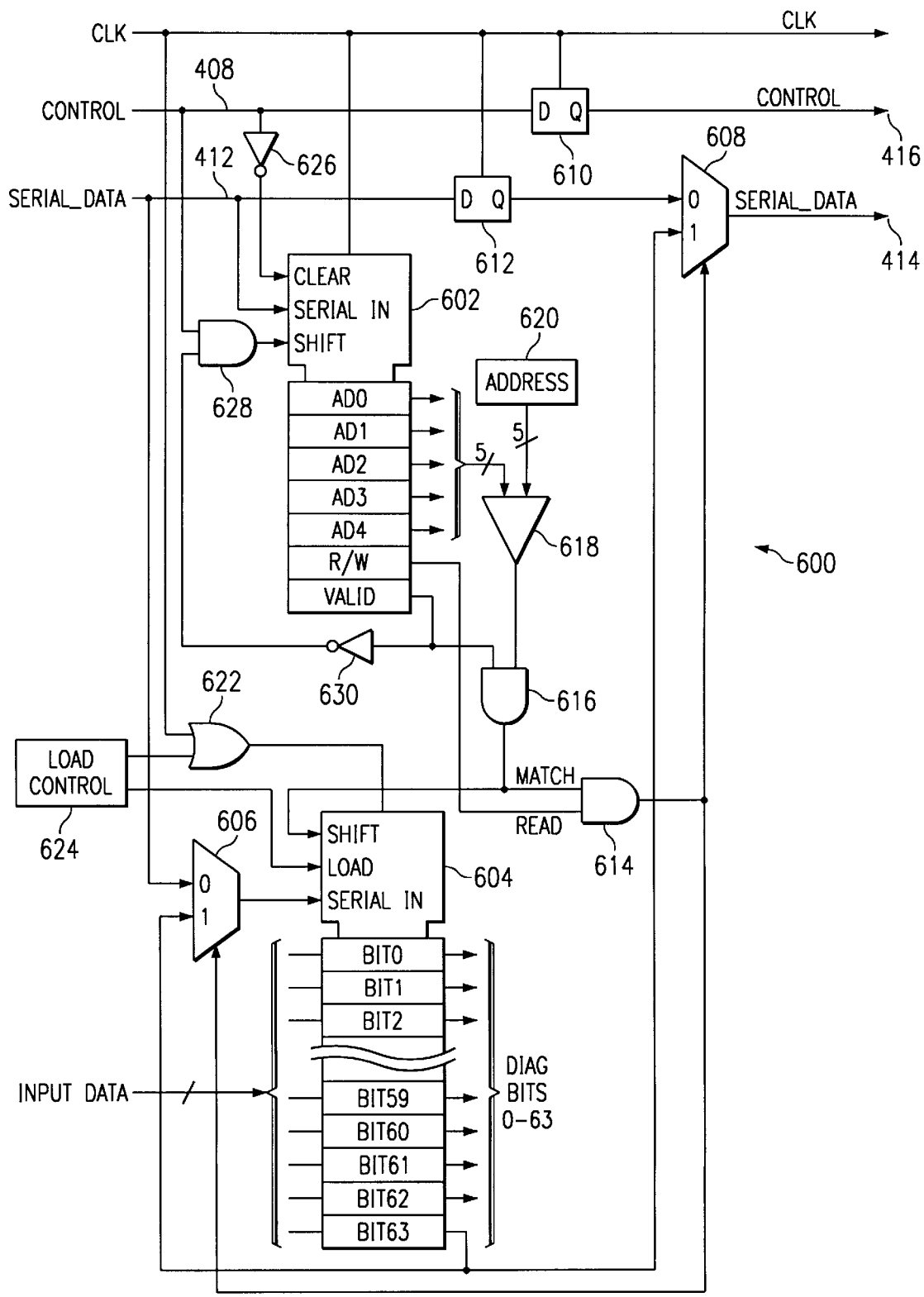
FIG. 8 is a block diagram illustrating the details of a representative one of the control registers of FIG. 6 and its associated logic.

FIG. 8 is a block diagram illustrating a representative one of remote register circuitries 344–354. (It should be understood that remote register circuitry 600 is representative of all remote register circuitries 344–354 shown in FIGS. 3 and 4, with the exception that remote register circuitry 354 does not include a control signal output.) Remote register circuitry 600 includes a header capture register 602, a remote register 604, an input multiplexer 606 and an output multiplexer 608. Control signal input 408 is coupled to control signal output 416 through one-bit latch 610. Serial data input 412 is coupled to one input of output multiplexer 608 through one-bit latch 612. The other input of output multiplexer 608 is coupled to the data shift output of remote register 604. Serial data output 414 is provided by the output of output multiplexer 608. The control input of output multiplexer 608 is provided by the output of a combinational logic system comprising AND gates 614 and 616, comparator 618 and ROM 620. ROM 620 stores the address that remote register circuitry 600 will respond to. (Preferably, each of remote register circuitries 344–354 will be configured to respond to a unique address.) Comparator 618 compares this address with bits AD0–4 from header capture register 602 and asserts one input of AND gate 616 if they are the same. A MATCH is indicated on the output of AND gate 616 if the output of comparator 618 is asserted and the VALID bit in header capture register 602 is also asserted. If MATCH is asserted and the RAN bit in header capture register 602 indicates a read, then the output of AND gate 614 will be asserted and the "1" inputs of both multiplexers 608 and 606 will be selected; otherwise, the "0" inputs of those multiplexers will be selected. OR gate 622 and load control logic 624 are provided to enable input data to be loaded into remote register 604 whenever desired.

Serial data input 412 is coupled to the "0" input of input multiplexer 606 and to the serial input of header capture register 602. The serial input of remote register 604 is coupled to the output of input multiplexer 606. The shift input of remote register 604 is coupled to the MATCH signal, while its load input is supplied by load control logic 624. Control input 408 is coupled to a clear input of header capture register 602 via inverter 626. The shift input of header capture register 602 is driven by the output of AND gate 628, whose first input is coupled to the control input 408, and whose second input is coupled to the VALID bit through inverter 630.

It is contemplated that microprocessor 100 will include within its instruction set certain opcodes for writing data to and reading data from specific remote registers. For example, one instruction may be designed to move the contents of a specified one of general purpose registers 126 into staging register 500. Another instruction may be designed to load header generation register 504 with the address of the desired remote register, to set the R/W bit in header generation register 504 to "R" in the case of a read or to "W" in the case of a write, and to shift the header out onto serial data line 410. A third instruction might be designed to move the contents of staging register 500 into a specified one of general purpose registers 126.

3.1.1 Writing to a Remote Register

Figure 9:
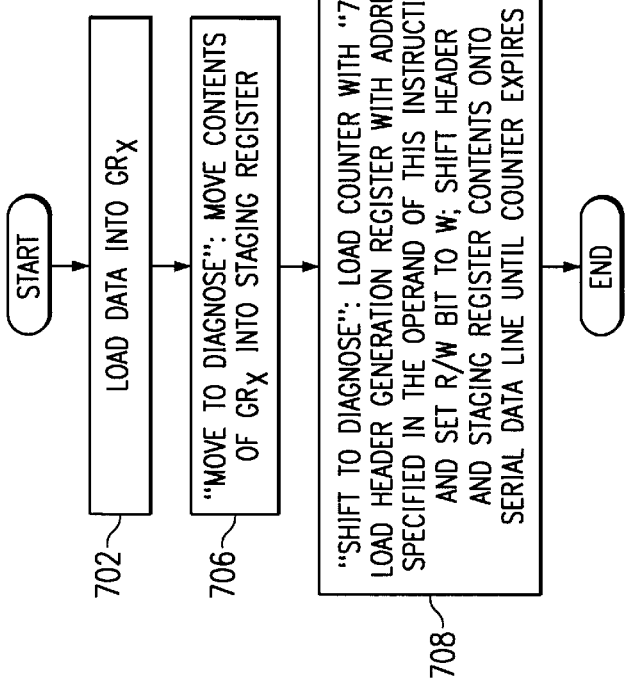
FIG. 9 is a flow diagram illustrating a preferred method for writing data to one of the control registers of FIG. 6.

FIG. 9 illustrates a preferred method for writing a data value to a remote register using the apparatus just described. In step 702, a microprocessor instruction is executed to load the data into general purpose register GRx. In. step 706, using another microprocessor instruction, the contents of GRx are loaded into staging register 500. In step 708, a "shift to diagnose" instruction is executed. Preferably, this instruction should contain the address of the target remote register as immediate information. The effect of the instruction is to load the address into bits AD0–4 of header generation register 504, and to set the R/W bit of that register to W. (The VALID bit in header generation register 504 always loads with VALID.) Then, after loading counter 502 with the number 77, the contents of header generation register 504 and staging register 500 are shifted onto serial data line 410 by supplying appropriate control signals to the two registers. The shifting ceases when counter 502 counts down to zero.

Figure 10:
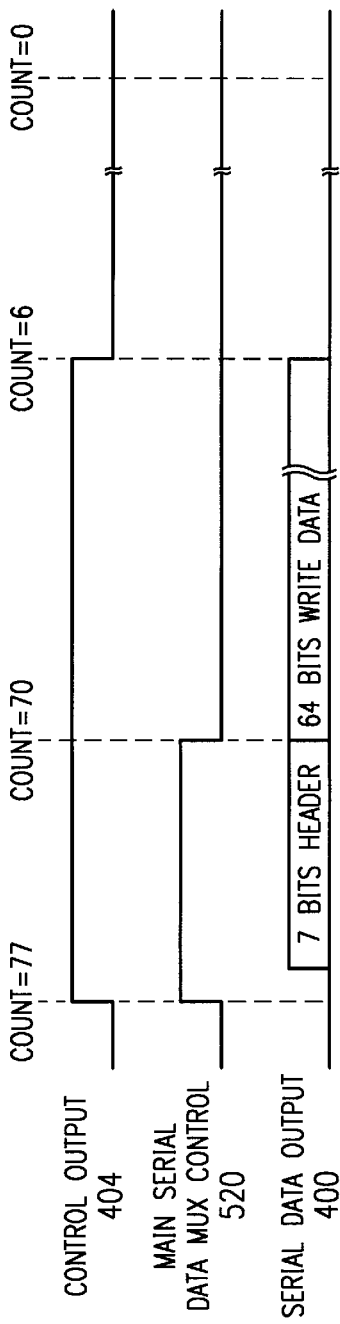
FIG. 10 is a timing diagram illustrating the states of various signals during the write operation of FIG. 9.

Because, when initially loaded, the value in counter 502 exceeds both 6 and 70, control signal 406 and multiplexer control line 520 are both asserted (as indicated at COUNT= 77 in FIG. 10). Thus, main serial data multiplexer 506 routes the serially shifting output from header generation register 504 onto serial data line 410. As soon as the seven header bits from header generation register 504 have been shifted onto serial data line 410, the count in counter 502 will have fallen to 69. At this time, main serial data multiplexer control line 520 is unasserted (as shown at COUNT=69 in FIG. 10). Thus, the data from staging register 500 is selected and begins to be shifted serially out onto serial data line 410. At the same time, data from serial data input 402 is shifted serially into staging register 500. Although the write data will have been completely shifted out of staging register 500 when COUNT=5 (as shown in FIG. 10), the write operation continues for several additional clock cycles until COUNT=0. This is necessary because each of remote register circuitries 344–354 interposes a one-bit latch on serial data line 410 and on control line 406. In the example being discussed, there are six remote registers. Thus, six additional shifts are necessary to assure that all bits are communicated to the 6th remote register in the serial loop before shifting ceases.

Activity at the remote registers can best be understood with reference to FIG. 8. It can be seen that header capture register 602 will have been cleared while CONTROL was unasserted. When CONTROL is asserted, header capture register will begin clocking bits in serially from serial data input 412. As soon as the VALID bit is clocked in, the shift input is disabled and no further shifting. occurs in header capture register 602. Instantaneously, a comparison is then made with address 620. If the address matches the header address bits, then remote register 604 begins clocking bits in serially from serial data input 412 until CONTROL is no longer asserted. The result will be that 64 data bits will have been written into remote register 604.

3.1.2 Reading from a Remote Register

Reading data from a particular remote register is very similar procedurally to writing data to the register, except that microprocessor 100 sets the R/W bit in header generation register 504 to R, and need not load any data value into staging register 500 before executing the read operation.

Figure 11:
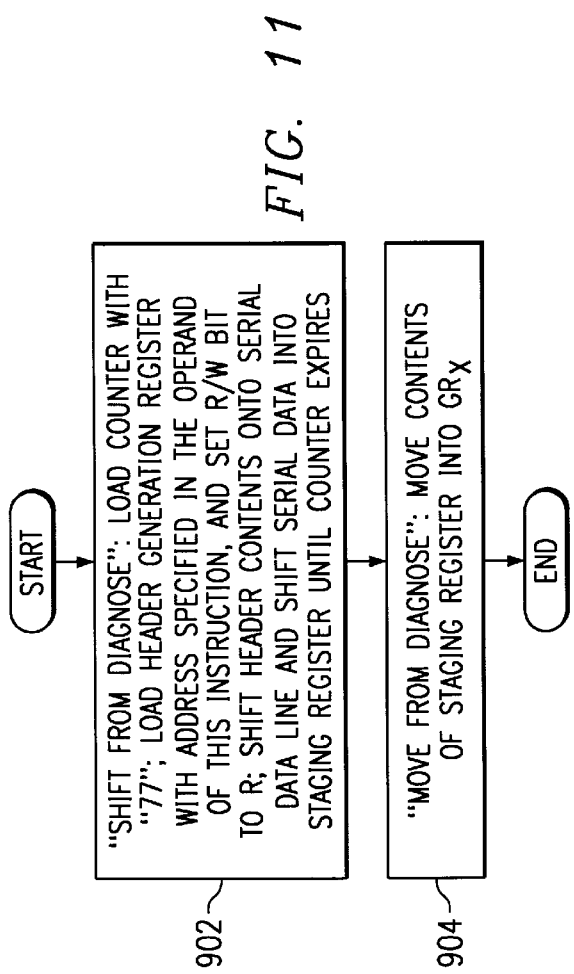
FIG. 11 is a flow diagram illustrating a preferred method for reading data from one of the control registers of FIG. 6.

FIG. 11 illustrates a preferred method for reading data from a remote register. In step 902, a "shift from diagnose" instruction is executed to load counter 506 with 77, load address bits AD0–4 of header generation register 504 with the address specified in the instruction, and set the R/W bit of that register to "R." The header is then shifted out onto serial data line 410, and at the same time serial data is shifted back into staging register 500 from serial data input 402. The shifting ceases when counter 502 counts down to zero. In step 904, another microprocessor instruction is executed to move the contents of staging register 500 into a specified one of architected registers 126, thus completing the read operation.

Figure 12:
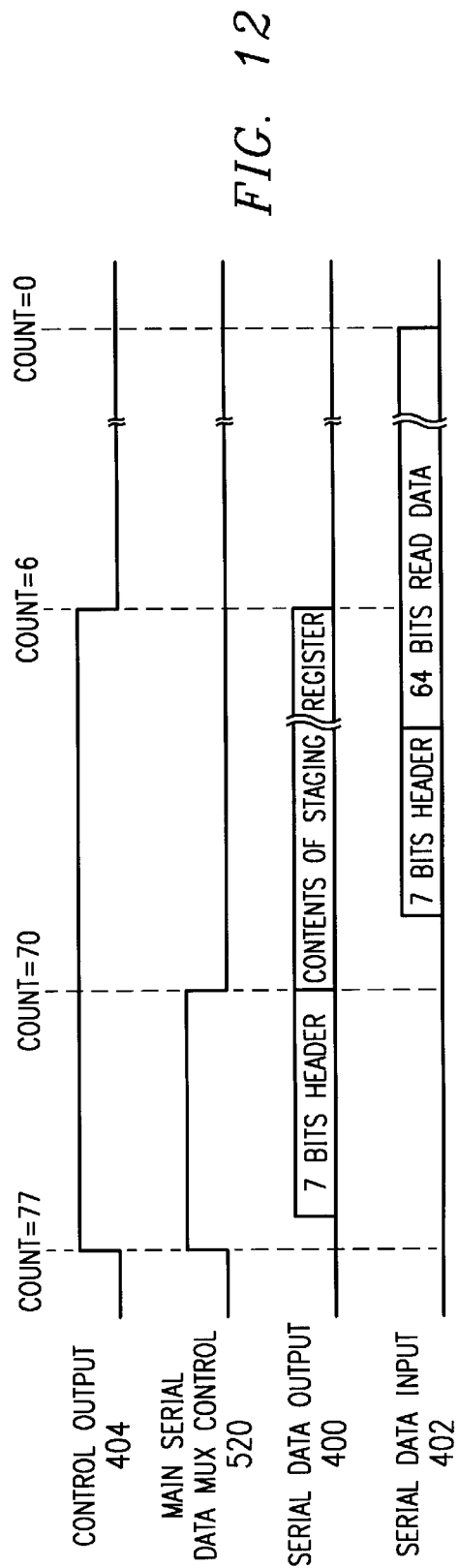
FIG. 12 is a timing diagram illustrating the states of various signals during the read operation of FIG. 11.

As can be seen in FIG. 12, the 6-bit latency caused by the latches in the serial loop of remote register circuitries causes the last of the read data to be clocked into staging register 500 from serial data input 402 when COUNT=0. As the header is propagated through the loop of remote register circuitries 344–354, each of the remote register circuitries compares bits AD0–4 in the header with its own address to determine if it has been selected. If the addresses are the same, then MATCH is asserted. The R/W having been set to R causes READ also to be asserted. The result is that multiplexer 608 routes data from remote register 600 onto serial data line 414, enabling the data to be shifted serially back into serial data input 402 of staging register circuitry 338 as desired. The control inputs of remote register 604 are also controlled so that data shifted out of the register is recirculated to the serial input, thus making non-destructive reads possible if the remote register is either 64 bits long or an evenly divisible submultiple of 64.

When implementing the invention on a die that is already dense with other circuitry, the reader will find that the apparatus and procedures discussed in this section 2.2 provide important advantages. For example, the remote registers can be quite large (on the order of 1,000 bits or more) and very numerous, and yet only two interconnect lines are necessary to access all of them. Also, the apparatus can be expanded to include many more or less than the six remote registers used in the example discussed herein, simply by adding to or subtracting from the number of bits used in the header address field (bits AD0–4). Moreover, addition of a remote register, no matter its size, adds only one bit of latency to the serial loop.

3.2 Programmable State Machine, Counters, CPU Core and Off-chip Trigger Interfaces Programmable state machine 302, counters 304, off-chip trigger interface 306 and CPU core interface 308 will now be described with reference to FIGS. 11–21.

Figure 13:
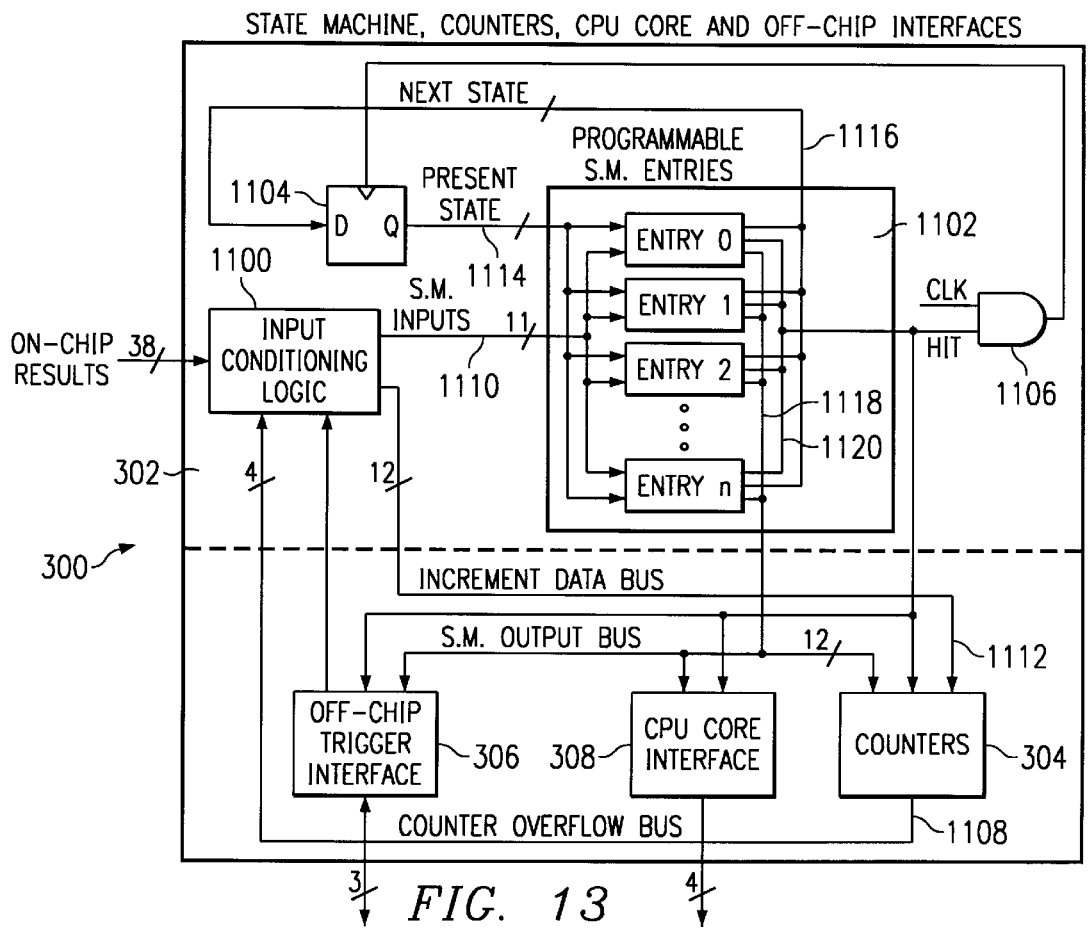
FIG. 13 is a block diagram illustrating the state machine, counters, CPU core and off-chip trigger interfaces of FIG. 5.

FIG. 13 illustrates the contents of block 300 in detail. Block 300 contains programmable state machine 302, counters 304, CPU core interface 308 and off-chip trigger interface 306. Programmable state machine 302 includes input conditioning logic 1100, programmable state machine entries 1102, multi-bit present state latch 1104 and AND gate 1106. The inputs to input conditioning logic 1100 include thirty-eight bits from on-chip results A–H, four bits from counters 304 (via counter overflow bus 1108), and one bit from off-chip trigger interface 306. Input conditioning logic 1100 provides twenty-three total output bits. Eleven of these are provided to programmable state machine entries 1102 as state machine inputs 1110. The other twelve are provided to counters 304 via increment data bus 1112. As can be seen in the drawing, the inputs of each of programmable state machine entries 0–n are coupled to multi-state latch 1104 via present state bus 1114 and also to state machine inputs 1110. The outputs of each of programmable state machine entries 0–n are coupled to next state bus 1116, state machine output bus 1118 and HIT bus 1120. The HIT signal is combined with CLK by AND gate 1106 to derive a signal that is used to control multi-state latch 1104.

Figure 14:
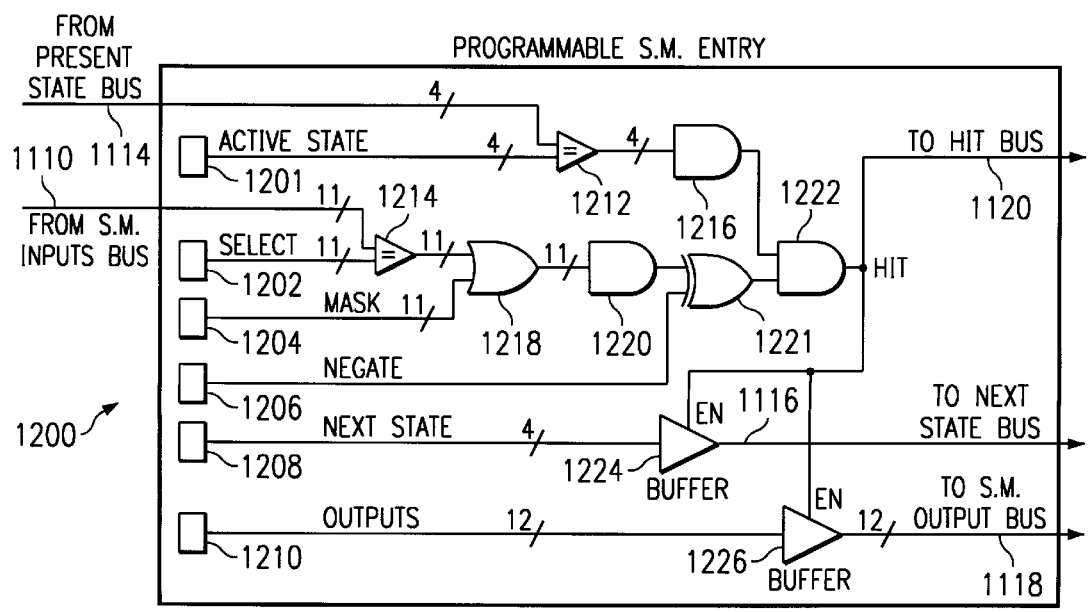
FIG. 14 is a block diagram illustrating a representative one of the programmable state machine entries of FIG. 13.

FIG. 14 illustrates a representative one of programmable state machine entries 0–n. It is contemplated that storage elements 1201–1210 would be included within state machine/counters control register circuitry 346. Thus, storage elements 1201–1210 would be loaded with data by writing to state machine/counters control register circuitry 346 using the method and apparatus described above in section 2.2.

The four bits of present state bus 1114 are provided to one of the inputs of comparator 1212 so that they may be compared with the contents of storage element 1201, which specifies the present state during which entry 1200 will become active. The four bits that are output from comparator 1212 are ANDed together at AND gate 1216, yielding a one-bit match result for present state. Similarly, the contents of storage element 1202 (bit-wise select) are compared with the eleven bits of state machine input bus 1110 by comparator 1214. OR gate 1218 is used to mask the output bits of comparator 1214 with the contents of storage element 1204 (bit-wise mask). The results of this masking operation are ANDed together using AND gate 1220, resulting in a match result for the state machine input bus. By setting negate bit 1206 to "1," this match result may be inverted. The match results for present state and for the state machine input bus are ANDed together by AND gate 1222 to produce the HIT signal, which is coupled to HIT bus 1120. If HIT happens to become asserted as a result of the match results for present state and the state machine input bus, then tri-state buffers 1224 and 1226 are enabled, allowing the contents of storage elements 1208 and 1210 to drive next state bus 1116 and state machine output bus 1118, respectively.

FIG. 15 illustrates counters 304 in detail. As can be seen in the drawing, counters block 304 includes four separate counters labeled counter 0–3. On the input side, each of counters 0–3 is coupled to increment data bus 1112, state machine output bus 1118 and HIT bus 1120. Specifically, bits 0–2 of increment data bus 1112 are coupled to counter 0, bits 3–5 are coupled to counter 1, bits 6–8 are coupled to counter 2, and bits 9–11 are coupled to counter 3. Bit 8 of state machine output bus 1118 is coupled to counter 0, bit 9 to counter 1, bit 10 to counter 2, and bit 11 to counter 3. The HIT signal is coupled to each counter. Each of counters 0–3 also generates an overflow bit, labeled OV 0–3 in the drawing. These four overflow bits constitute counter overflow bus 1108.

FIG. 16 illustrates counter 0 in detail. (Counter 0 is representative of each of counters 0–3.) It is contemplated that storage elements 1406 and 1407 would be included within state machine/counters control register circuitry 346. Thus, storage element 1406 would be loaded with data by writing to state machine/counters control register circuitry 346 using the method and apparatus described above in section 2.2. Storage element 1407 may be loaded from latches 1414 and 1416 using logic such as load control logic 624, and may be read by reading from state machine/counters control register circuitry 346 using the method and apparatus described above in section 2.2 (section 2.2.2 in particular).

Counter 0 contains a thirty-two bit adder 1400, which has two addend inputs 1401 and 1403. Addend input 1401 is coupled to the output of multiplexer 1402. One input of multiplexer 1402 is coupled to a latched copy of the sum output (RSLT) of adder 1400, as shown. The other input of multiplexer 1402 is coupled to the output of storage element 1406 (initial value). Thus, depending on the state of the INIT signal, addend input 1401 will be coupled either to RSLT or to the initial value stored in storage element 1406. (Preferably, the INIT signal is generated whenever storage element 1406 is written to.) The least significant three bits of addend input 1403 are coupled to three-bit latch 1404. The twenty-nine most significant bits are coupled to ground. The input of latch 1404 is coupled to the output of multiplexer 1408. One input of multiplexer 1408 is coupled to ground, yielding an input value of "000." The other input of multiplexer 1408 is coupled to bits 0–2 of increment data bus 1112. Thus, depending on the output of AND gate 1410, the input of latch 1404 is provided either by bits 0–2 of increment data bus 1112 or by ground. The former will be selected whenever HIT is asserted and bit 8 of state machine output bus 1118 is asserted. Thus, counter 0 may be incremented by any value between 0 and 7 depending on the content of increment data bus bits 0–2.

"1-detector" 1412 (constructed by conventional means) is provided to catch asynchronously any assertions of the overflow signal OV by adder 1400. In turn, this signal is latched by latch 1414. "1-detector" 1412 will be cleared upon the assertion of the INIT signal. The sum output RSLT of adder 1400 is latched by latch 1416. The contents of latches 1414 and 1416 are preferably stored by storage element 1407 for later retrieval as previously discussed. Overflow signal OV is also supplied to counter overflow bus 1108.

Figure 17:
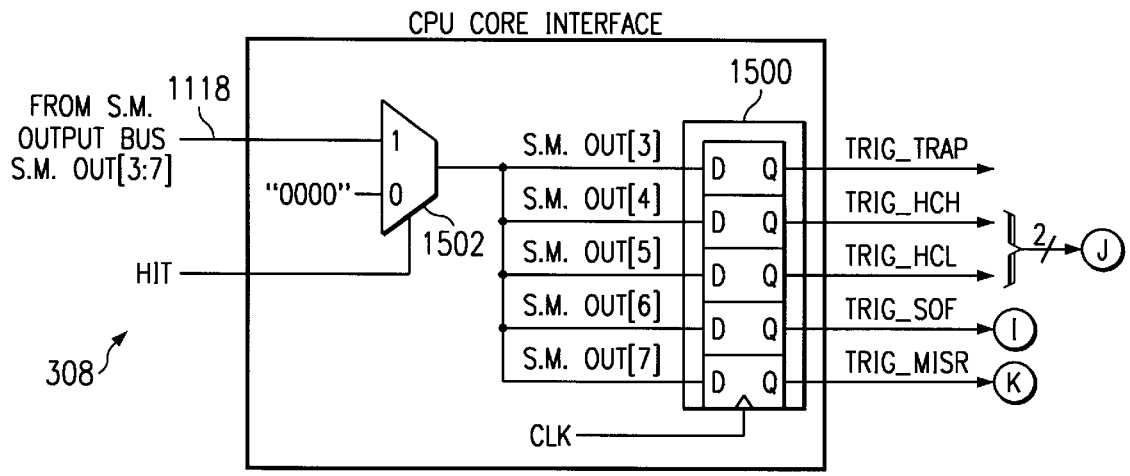
FIG. 17 is a block diagram illustrating the CPU core interface of FIG. 13.

Referring now to FIG. 17, CPU core interface 308 includes 5-bit latch 1500, whose inputs are coupled to the output of 5-bit multiplexer 1502. One 5-bit input of multiplexer 1502 is coupled to ground, yielding the input value "00000." The other input is coupled to bits 3–8 of state machine output bus 1118. The select input of multiplexer 1502 is provided by the HIT signal. When TRIG_TRAP is asserted, fetch unit 110 will preferably begin fetching instructions from the address associated with the trap routine. When TRIG_HCH (TRIG_HCL) is asserted, clock generator 146 will hold the system clock high (low). When TRIG_SOF is asserted, sample-on-the-fly logic 336 will latch the state of test nodes 0–n for later retrieval by an external system via conventional TAP controller 128 and FIFOs of microprocessor 100, including FIFOs within the BIST engines 150, 160 can be stopped by SOF signal 1, as will be described below. When TRIG_MISR is asserted, MISRs of microprocessor 100, including MISRs within BIST engines 150, 160 can be controlled by MISR control signal K as described below.

Figure 18:
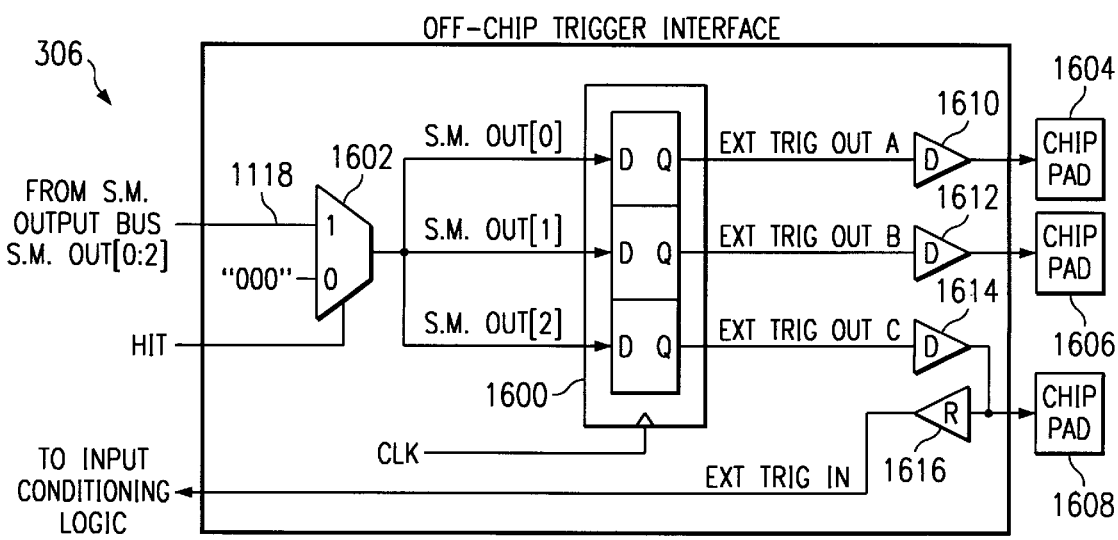
FIG. 18 is a block diagram illustrating the off-chip trigger interface of FIG. 13

Referring now to FIG. 18, off-chip trigger interface 306 includes 3-bit latch 1600, whose inputs are coupled to the output of 3-bit multiplexer 1602. One 3-bit input of multiplexer 1602 is coupled to ground, yielding the input value "000." The other input is coupled to bits 0–2 of state machine output bus 1118. The select input of multiplexer 1502 is provided by the HIT signal. The outputs of latch 1600 are called EXT_TRIG_OUT A, B and C. EXT_TRIG_OUT A, B and C are coupled to chip pads 1604, 1606 and 1608, respectively, via output driver buffers 1610, 1612 and 1614. While chip pads 1604 and 1606 constitute output signals for microprocessor 100, chip pad 1608 is bidirectional by virtue of the fact that it is coupled not only to output driver buffer 1614, but also to receive buffer 1616. The output of receive buffer 1616 is designated EXT_TRIG_IN and constitutes one of the inputs of input conditioning logic 1100 (which will be discussed next).

Figure 19:
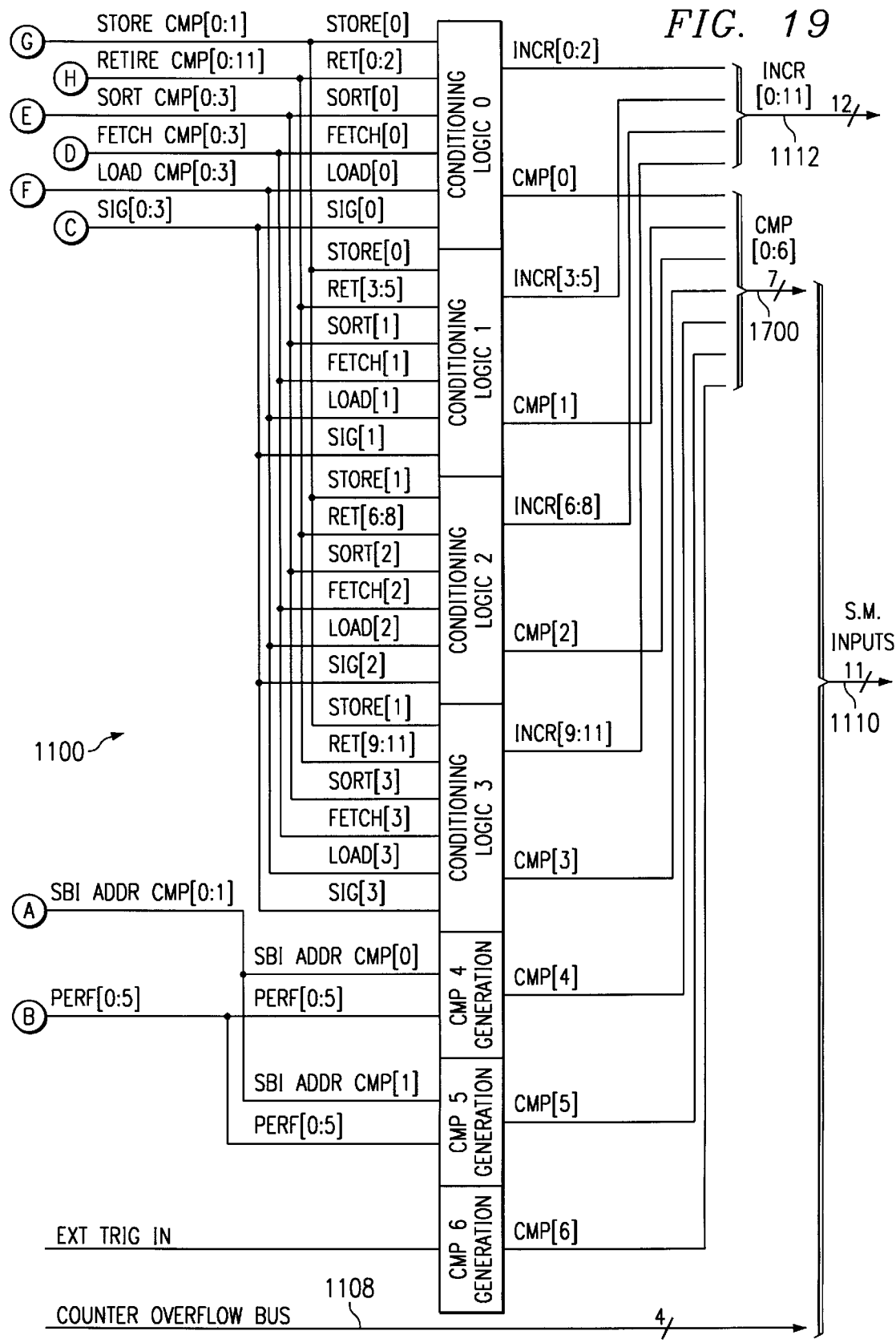
FIG. 19 is a block diagram illustrating the input conditioning logic of FIG. 13

FIG. 19 illustrates input conditioning logic 1100 in detail. The chief purpose of input conditioning logic 1100 is to allow the programmer to select which information will be used as inputs to programmable state machine 302. A secondary purpose of input conditioning logic is to determine which increment values will be used to increment counters 0–3. Input conditioning logic 1100 includes conditioning logic blocks 0–3 and CMP generation blocks 4–6. Signal sets C, D, E, F, G and H are provided to conditioning logic blocks 0–3 as shown. Signal sets A and B are provided to CMP generation blocks 4 and 5 as shown. The only input for CMP generation block 6 is the EXT_TRIG_IN signal previously discussed in relation to FIG. 18. Counter overflow bus 1108 is fed straight through to the output of input conditioning logic 1100 without manipulation. Each of conditioning logic blocks 0–3 provides three of the twelve total bits that comprise increment data bus 1112, as shown. Also, each of input conditioning logic blocks 0–3 provides one of the seven total bits that comprise comparator result bus 1700. The other three bits of comparator result bus 1700 are provided by CMP generation blocks 4–6. Together, comparator result bus 1700 and counter overflow bus 1108 comprise state machine input bus 1110.

Figure 20:
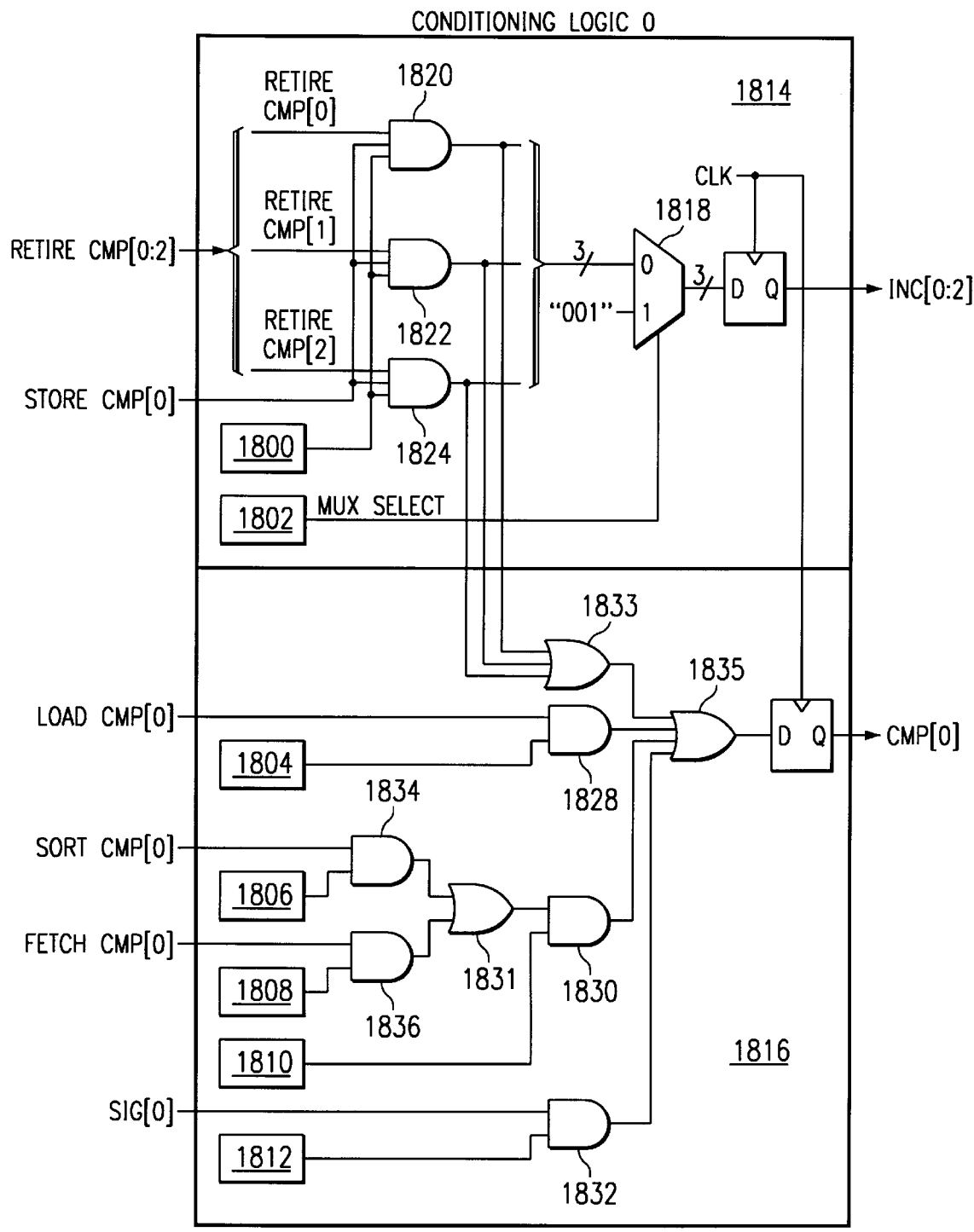
FIG. 20 is a block diagram illustrating a representative one of the conditioning logics 0–3 shown in FIG. 19.
Figure 21:
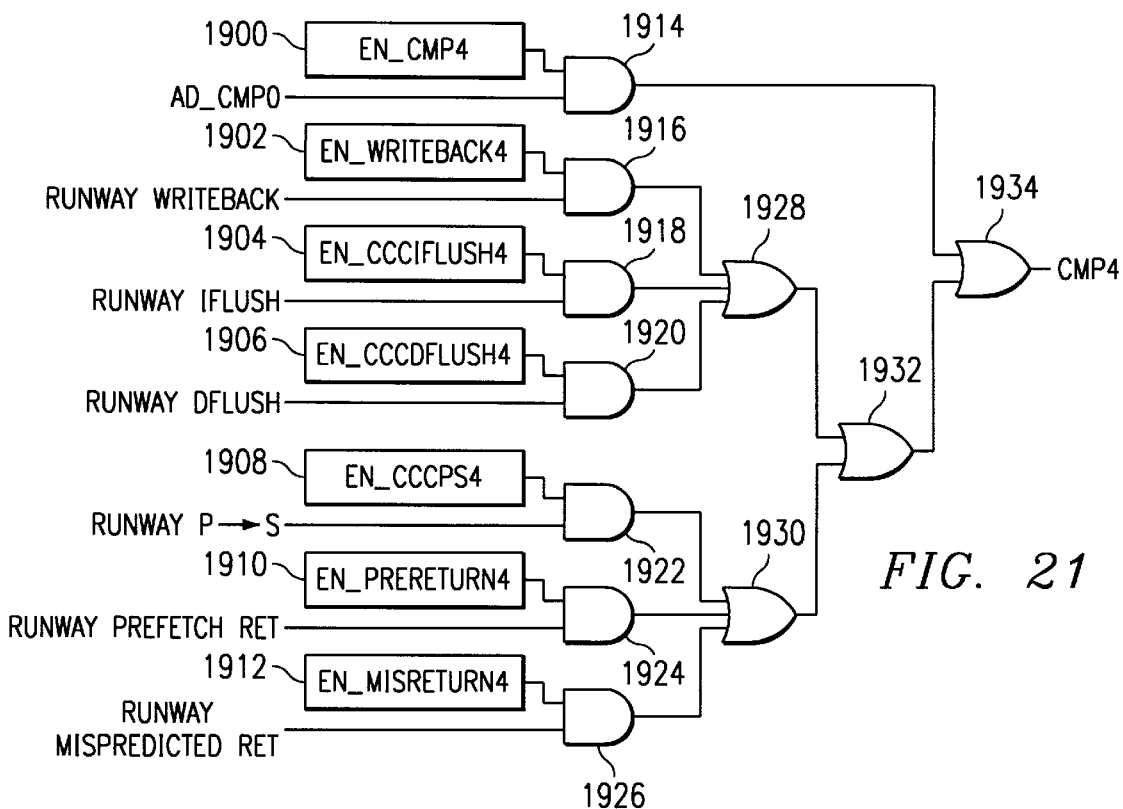
FIG. 21 is a block diagram illustrating the CMP4 generation logic of FIG. 19
Figure 22:
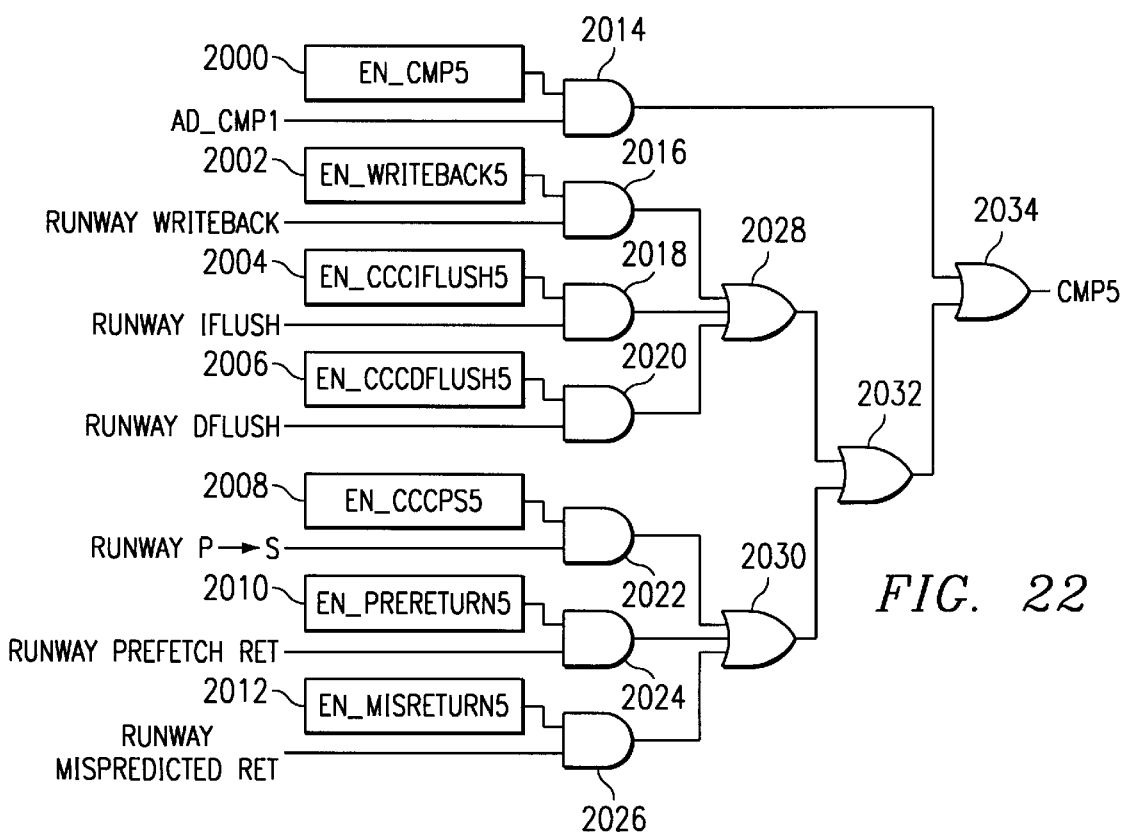
FIG. 22 is a block diagram illustrating the CMP5 generation logic of FIG. 19

FIG. 20 illustrates the contents of conditioning logic 0 in detail. (Conditioning logic 0 is representative of conditioning logic 0–3). It is contemplated that storage elements 1800–1812 would be included within state machine/counters control register circuitry 346. Thus, storage elements 1800–1812 would be loaded with data by writing to state machine/counters control register circuitry 346 using the method and apparatus described above in section 2.2. The purpose of the circuitry within sub-block 1814 is to produce one of the four 3-bit increment values that are placed on increment data bus 1112. The ROM value "001" is coupled to the "1" input of multiplexer 1818 so that, by storing a "1" in storage element 1802, the increment value can be forced to "001." Otherwise, the increment value will be determined by the state of overall match generator output bits 0, 1 and 2, as shown. These overall match generator output bits are gated by AND gates 1820–1824. In this manner, they may be enabled or disabled by setting the value in storage element 1800 as desired. STORE_MATCH is also provided to AND gates 1820–1824 to enable the programmer to focus exclusively on store-type instructions. If this is not desired, then STORE_MATCH may be forced to a "1" in a manner to be explained below in relation to FIG. 34.

As can be seen in FIG. 20, the programmer is free to generate CMP[0] by using various combinations of the following: overall match generator results, load match information from data cache interface comparators 324, validated instruction match information from validate logic 320, unvalidated instruction match information from fetch unit comparators 316, and user-selected signals taken from a variety of possible locations within microprocessor 100 by off-chip data interface 310. These combination possibilities are provided by AND gates 1834, 1836, 1828, 1830 and 1832; OR gates. 1831, 1833 and 1835; and the enable bits stored in storage elements 1800–1812.

FIGS. 19 and 20 illustrate the generation logic for CMP 4 and 5, respectively. It is contemplated that storage elements 1900–1912 and 2000–2012 would be included within state machine/counters control register circuitry 346. Thus, storage elements 1900–1912 and 2000–2012 would be loaded with data by writing to state machine/counters control register circuitry 346 using the method and apparatus described above in section 2.2. Once again, the purpose of this circuitry is to enable the programmer to select which information will be used as an input to programmable state machine 302. As can be seen in FIGS. 19 and 20, the programmer may use AND gates 1914–1926 (2014–2026) and storage elements 1900–1912 (2000–2012) to construct an OR term using any or all of the following signals: System Bus Writeback, System Bus I-Flush, System Bus D-Flush, System Bus Private-to-Shared, System Bus Interface Prefetch Buffer Hit, System Bus Interface Misprediction Buffer Hit, and the outputs from system bus address/data comparators 312. (The meaning of the six system bus performance signals just mentioned will be discussed below in connection with FIGS. 22–25.) The generation options for CMP5 are identical to those for CMP 4 except that, in the case of CMP5, the output of system bus address/data comparator 1 is used instead of the output of system bus address/data comparator 0. (System bus address/data comparators 0 and 1 are discussed in the next section.)

Figure 23:
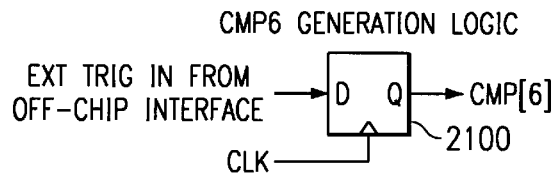
FIG. 23 is a block diagram illustrating the CMP6 generation logic of FIG. 19

FIG. 23 illustrates the generation logic for CMP6. Latch 2100 is provided to store the state of the EXT_TRIG_IN signal. CMP6 tracks the state of the output of latch 2100.

3.3 System bus Interface Components

System bus interface comparators 312 and performance signal generation logic 314 will now be discussed with reference to FIGS. 22–25.

Figure 24:
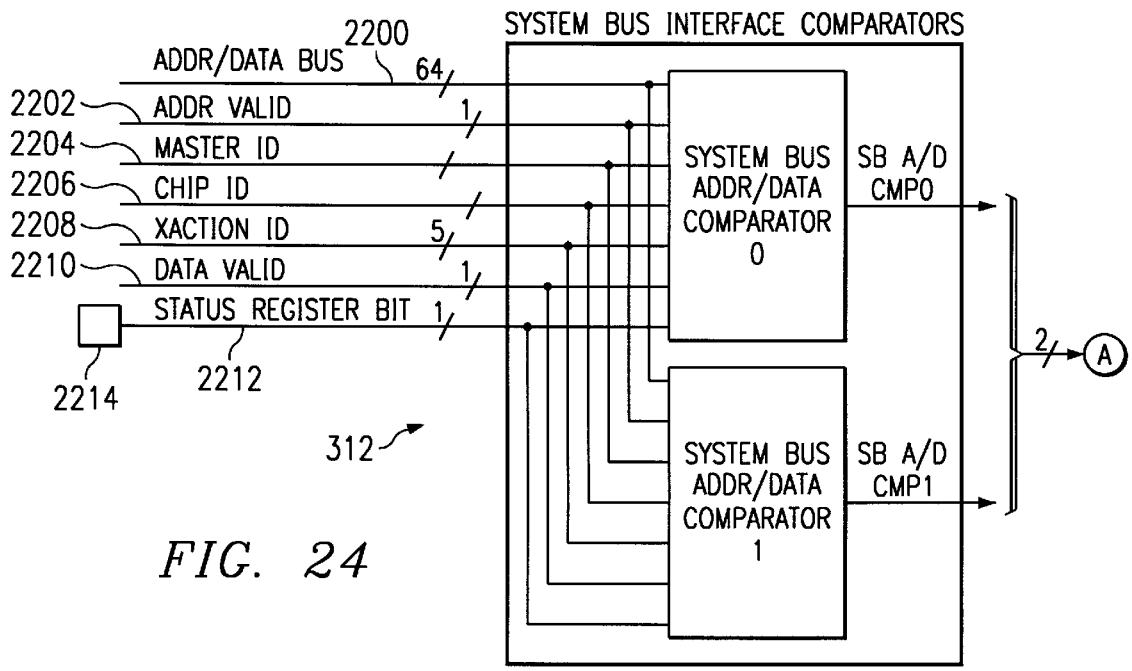
FIG. 24 is a block diagram illustrating the system bus interface comparator shown in FIG. 5.

As shown in FIG. 24, system bus interface comparators block 312 includes system bus address/data comparators 0 and 1. Each of system bus address/data comparators 0 and 1 is coupled to the 64-bit system address/data bus 2200, an address valid bit 2202, a master ID bus 2204, a chip ID bus 2206, a transaction ID bus 2208, a data valid bit 2210 and a status register bit 2212 stored in storage element 2214. The outputs of the two system bus address/data comparators are labeled SBA/DCMP 0 and 1, and are coupled to programmable state machine 302 at A.

As was discussed above, system bus 106 operates according to the protocol of the well-known PA-7200 microprocessor manufactured and sold by Hewlett Packard Company. Consequently, address and data pertinent to a given bus transaction may be presented on address/data bus 2200 in non-contiguous bus cycles. Thus, a transaction ID is associated with each bus transaction and is presented on transaction ID bus 2208 in conjunction with each presentation of address or data so that the components interfaced to the bus can determine to which transaction the address or data belongs. In addition, a master ID is presented on master ID bus 2204 to indicate which microprocessor or other chip in the computer system is initiating the bus transaction. A chip ID for microprocessor 100 is stored in a storage element and is communicated to system bus interface 108 via chip ID bus 2206. System bus interface 108 uses the chip ID to determine, based on a comparison between the chip ID and the information present on master ID bus 2204, whether the information then-present on the bus is intended for microprocessor 100.

Figure 25:
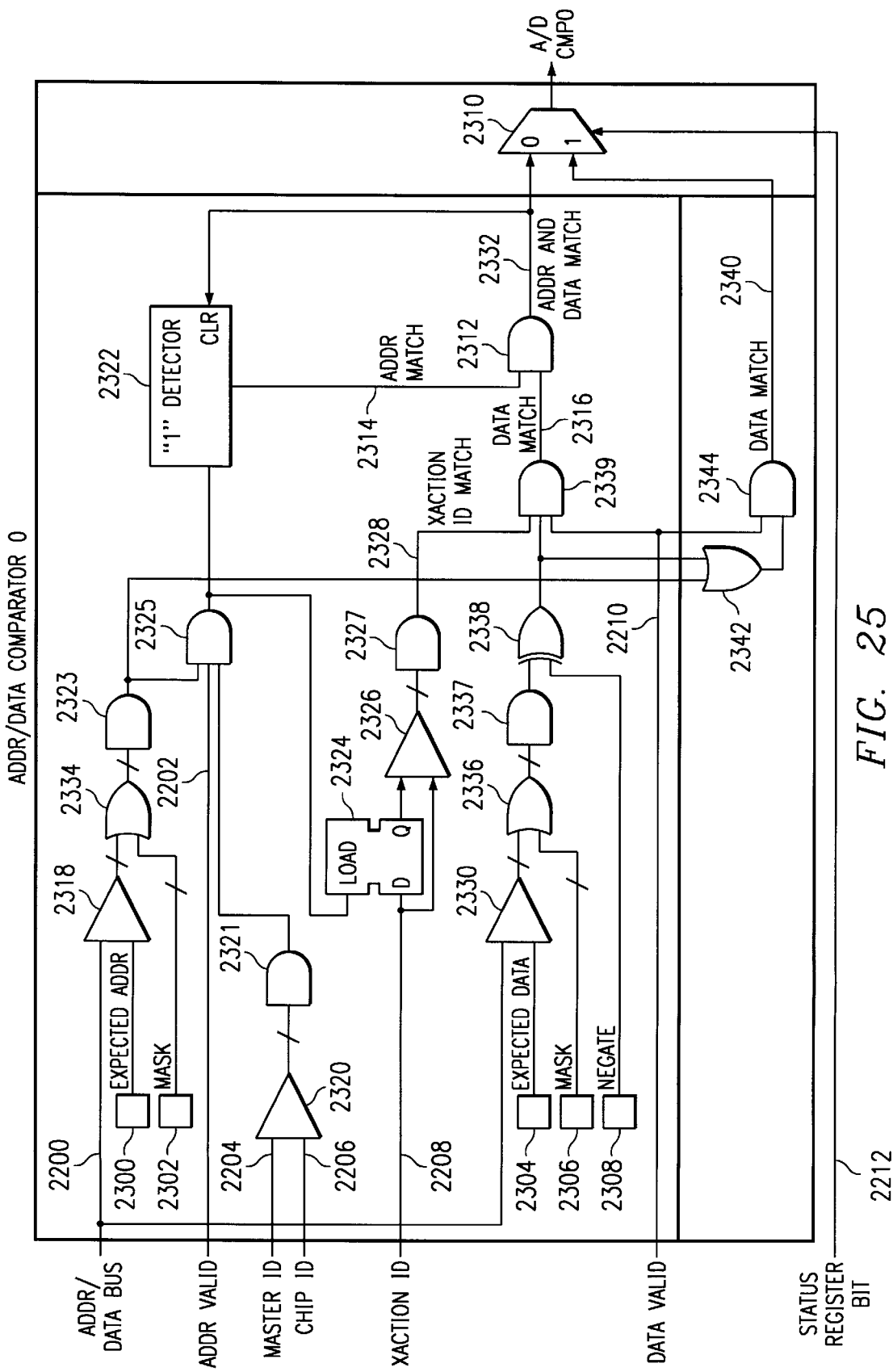
FIG. 25 is a block diagram illustrating addr/data comparator 0 shown in FIG. 24.

FIG. 25 illustrates system bus address/data comparator 0 in detail. It is contemplated that storage elements 2300–2308, as well as storage element 2214, would be included within system bus interface comparators control register circuitry 348. Thus, storage elements 2300–2308, as well as storage element 2214, would be loaded with data by writing to system bus interface comparators control register circuitry 348 using the method and apparatus described above in section 2.2.

System bus address/data comparator 0 is operable in two different modes, depending on the state of status register bit 2212. (Status bit 2212 determines the mode by selecting which signal will be presented on the output of multiplexer 2310.) When status register bit 2212 is "0," system bus address/data comparator 0 operates in a "normal" mode. When status register bit 2212 is "1," system bus address/data comparator 0 operates in an "alternate" mode.

In the normal mode, the output of address/data comparator 0 indicates whether a match has occurred on both the expected address stored in storage element 2300 and the expected data stored in storage element 2304. To accomplish this, the output of AND gate 2312 is presented on the output of multiplexer 2310. The inputs of AND gate 2312 are ADDR MATCH 2314 and DATA MATCH 2316. ADDR MATCH 2314 is asserted when: (1) the information present on addr/data bus 2200 matches the expected address information stored in storage element 2300, as indicated by the output of comparator 2318; (2) address valid bit 2202 is asserted, indicating that the information present on addr/data bus 2200 is in fact a valid address; and (3) comparator 2320 indicates that there is a match between master ID 2204 and chip ID 2206. When all three of these conditions occur, the match is stored by conventional "1 detector" 2322 for later use by AND gate 2312 in determining the overall addr/data match. Also, because the data corresponding to the address of interest may not be presented on addr/data bus 2200 on the next bus cycle, the transaction ID is stored in latch 2324 for later use by comparator 2326.

Once the transaction ID is stored in latch 2324, a recurrence of the same transaction ID on transaction ID bus 2208 (which presumably will occur when the awaited data is presented on address/data bus 2200) will cause XACTION ID MATCH 2328 to be asserted. DATA MATCH 2316 is asserted when: (1) XACTION ID MATCH 2328 is asserted; (2) comparator 2330 indicates that the information present on addr/data bus 2200 matches the expected data stored in storage element 2304; and (3) data valid bit 2210 is asserted, indicating that the information present on addr/data bus 2200 is in fact valid data.

Once both ADDR MATCH 2314 and DATA MATCH 2316 are asserted, the overall ADDR/DATA MATCH signal 2332 is asserted. When this occurs, "1 detector" 2322 is cleared. Additional flexibility is provided by OR gates 2334 and 2336, which allow the programmer to mask certain of the bits from the comparisons made by comparators 2318 and 2330, respectively. Also, exclusive OR gate 2338 is provided, allowing the programmer optionally to negate the output of OR gate 2336.

In the alternate mode, expected data is stored not only in storage element 2304, but also in storage element 2300, and the output of system bus address/data comparator 0 is indicative of data matches only. Moreover, in the alternate mode, no consideration is given to the transaction ID. (In this mode, multiplexer 2310 presents only the DATA MATCH 2340 signal on the output of system bus address/data comparator 0.)

Figure 26:
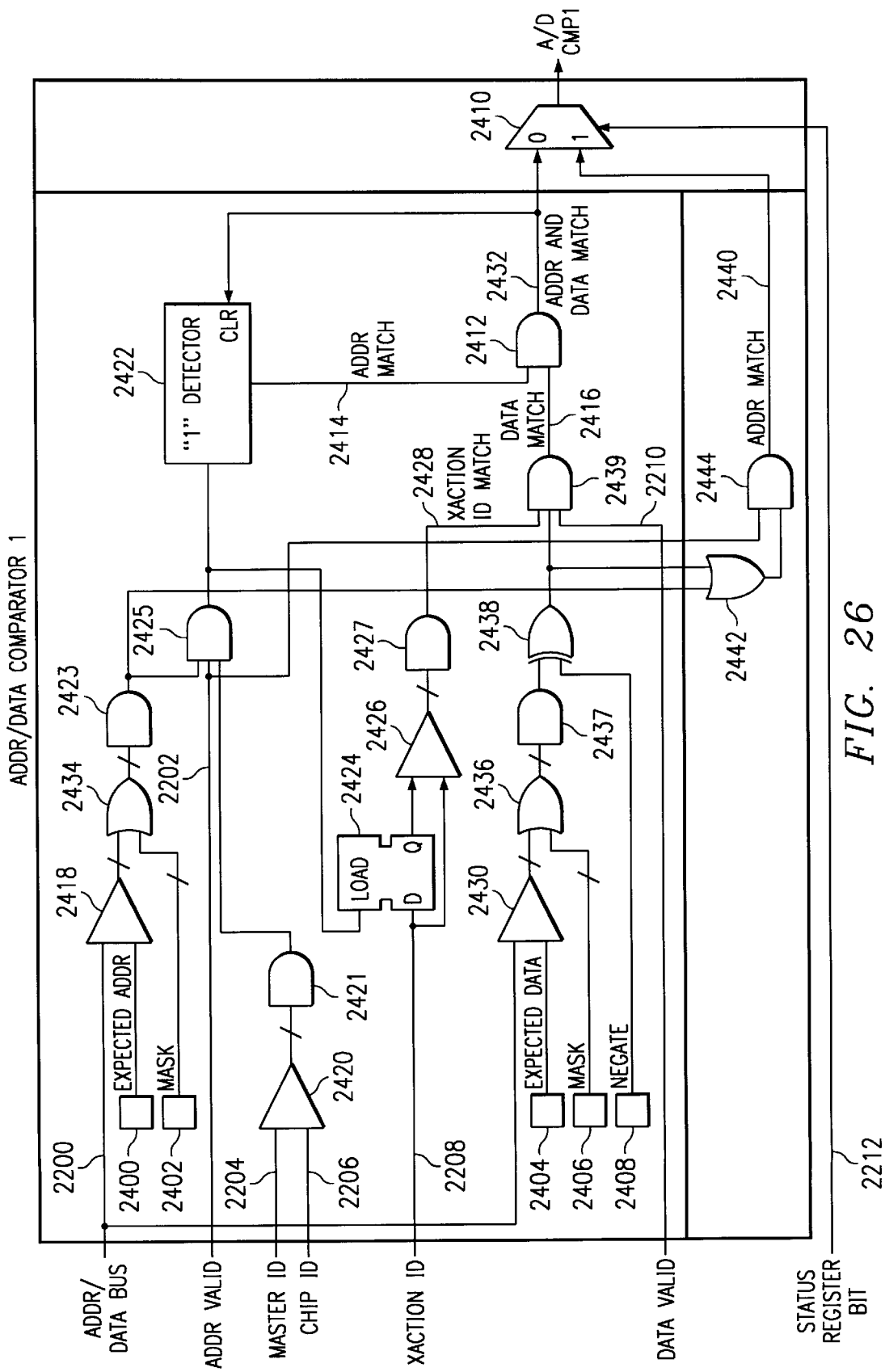
FIG. 26 is a block diagram illustrating addr/data comparator 1 shown in FIG. 24.

FIG. 26 illustrates system bus address/data comparator 1 in detail. As is apparent from the drawing, system bus address/comparator 1 is constructed and operates exactly like system bus address/data comparator 0, except for the following: In the alternate mode, address/data comparator 1 is used for address comparisons only (as opposed to data comparisons only). Thus, in the alternate mode for system bus address/data comparator 1, expected address is stored not only in storage element 2400, but also in storage element 2404. Again, in the alternate mode, transaction ID information is disregarded, and address matches are reported on ADDR MATCH signal 2440 whenever they have occurred in both comparators 2418 and 2430.

Figure 27:
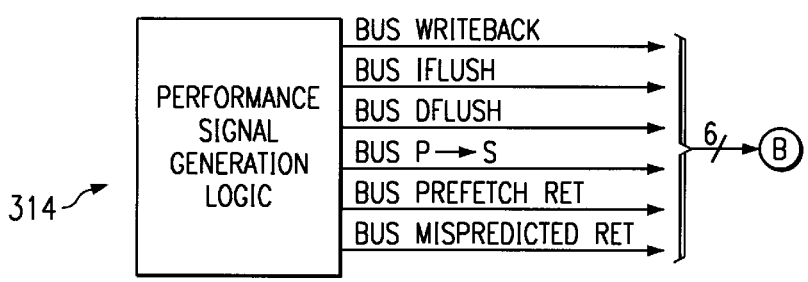
FIG. 27 is a block diagram illustrating the performance signal generation logic shown in FIG. 5.

FIG. 27 illustrates in detail the signals that are generated by performance signal generation logic 314. It is contemplated that the generation of the signals shown in FIG. 27 may be accomplished by conventional means, and that numerous alternative methods for doing so will be apparent to those having ordinary skill in the art based on the following signal descriptions:

BUS WRITEBACK: This signal is asserted when a "dirty" cache line is being written back to main memory 208.

BUS I-FLUSH: This signal is asserted when a line from instruction cache 102 has just been flushed in response to a command received over system bus 106 from another component in the computer system. This activity is commonly done in connection with maintaining cache coherency with main memory 208.

BUS D-FLUSH: This signal is asserted when a line from data cache 104 has just been flushed in response to a command received over system bus 106 from another component in the computer system. This activity is commonly done in connection with maintaining cache coherency with main memory 208.

BUS P>S: This signal is asserted when a previously-private cache line is changed to shared (or is flushed, if dirty, to main memory).

BUS PREFETCH BUFFER HIT: System bus interface 108 is equipped with a buffer for instructions that have been prefetched from main memory 208 but not yet requested by fetch unit 110. Once fetch unit 110 does request such a prefetched instruction, a hit occurs on the prefetch buffer, and the BUS PREFETCH BUFFER HIT signal is asserted at this time.

BUS MISPREDICTED BUFFER HIT: System bus interface 108 is also equipped with a buffer for instructions that have been fetched speculatively, but turn out to have been mispredicted. In the event fetch unit 110 eventually requests such an instruction while it is still in the mispredicted instruction buffer, a hit occurs on the buffer. When this happens, BUS MISPREDICTED BUFFER HIT is asserted.

All six of the signals generated by performance signal generation logic 314 are coupled to programmable state machine 302 at B.

3.4 Fetch Unit Components

Figure 28:
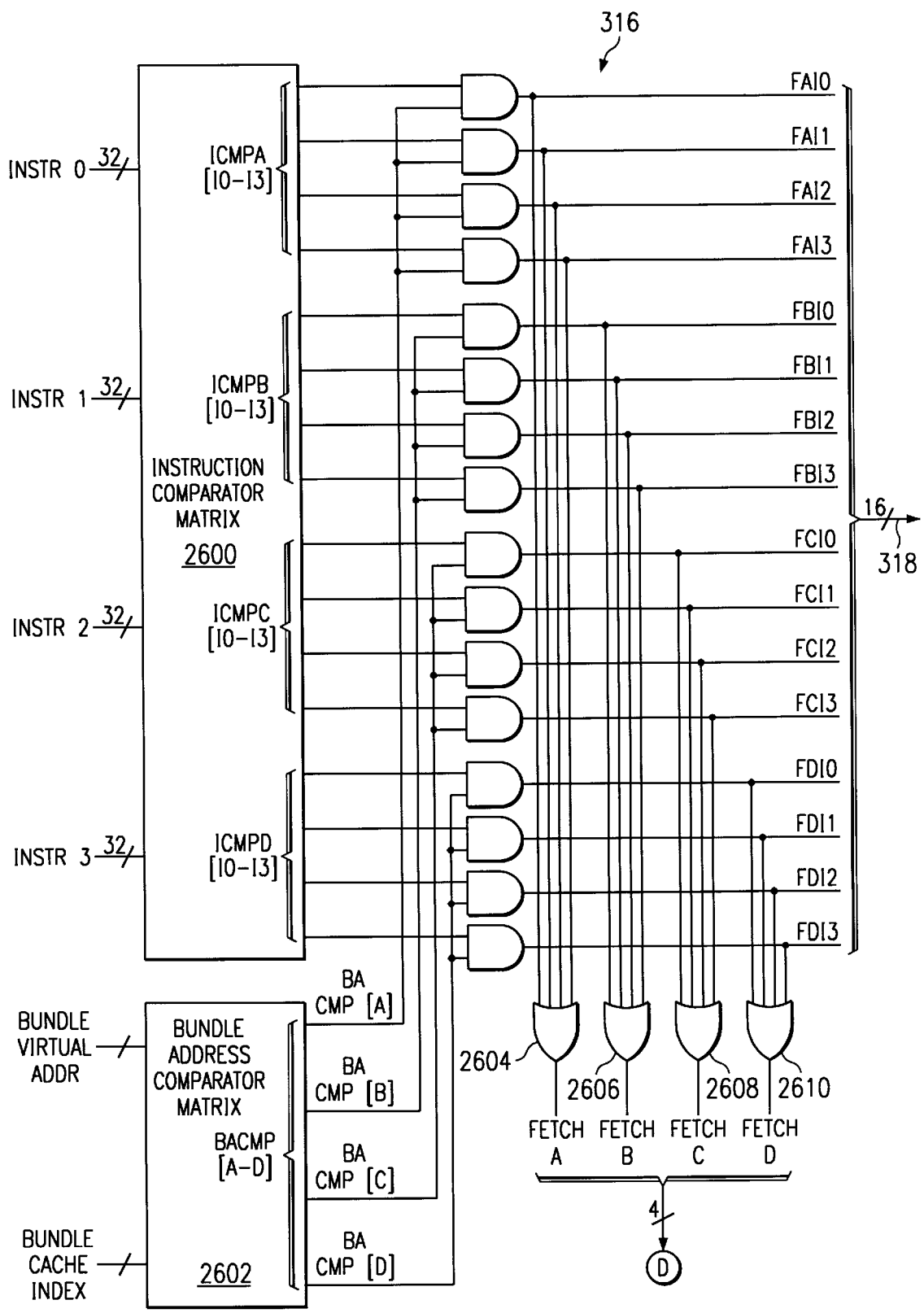
FIG. 28 is a block diagram illustrating the fetch unit comparators of FIG. 5.

Fetch unit comparators 316 will now be discussed with reference to FIGS. 26–30. FIG. 28 illustrates the content of fetch unit comparator block 316. As each bundle of four instructions I0–I3 is fetched by fetch unit 110, the instructions are provided to instruction comparator matrix 2600. Simultaneously, the cache index and certain bits of the virtual address for the bundle of four instructions are provided to address comparator matrix 2602. As will be discussed in more detail below, instruction comparator matrix 2600 contains four instruction comparators called instruction comparators A–D. Each of instruction comparators A–D provides one result for each of the four instructions in the bundle (four results total). Thus, instruction comparator matrix 2600 provides sixteen total results for each bundle of instructions. For convenience, the results for instruction comparator A are called ICMPA[I0], ICMPA[I1], ICMPA[I2], and ICMPA[I3]. The four complete sets of results from instruction comparator matrix 2600 are labeled as follows in FIG. 28: ICMPA[I0–I3], ICMPB[I0–I3], ICMPC[I0–I3] and ICMPD[I0–I3].

Address comparator matrix 2602 contains four bundle address comparators A–D. Because there is only one address associated with each bundle of four instructions, bundle address comparator matrix 2602 provides only one set of results for each bundle of instructions. In the drawing, these results are labeled BACMP[A–D].

As is shown, the result from BACMP[A] is ANDed with all four of the results from ICMPA. Likewise, the result from BACMP[B] is ANDed with all four of the results from ICMPB; the result from BACMP[C] is ANDed with all four of the results from ICMPC; and the result from BACMP[D] is ANDed with all four of the results from ICMPD. The sixteen results from these AND operations are provided to validate logic 320 via bus 318. In addition, each group of four AND results is ORed together by OR gates 2604–2610. The resulting four bits, labeled FETCHA-D in the drawing, are provided to programmable state machine 302 at D.

Figure 29:
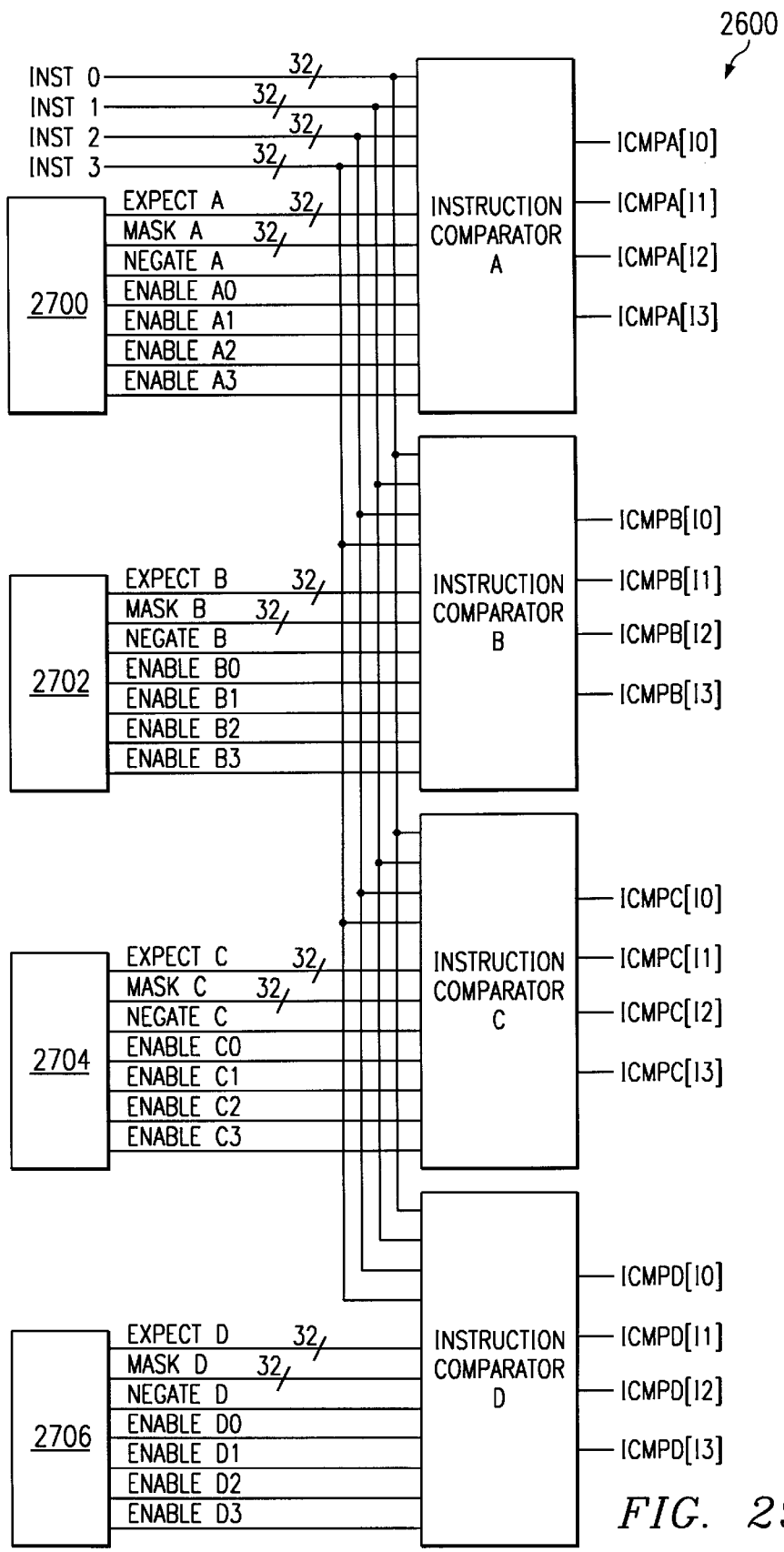
FIG. 29 is a block diagram illustrating the instruction comparator matrix of FIG. 28.

FIG. 29 illustrates instruction comparator matrix 2600 in detail. It is contemplated that storage elements 2700–2706 would be included within fetch comparators control register circuitry 344. Thus, storage elements 2700–2706 would be loaded with data by writing to fetch comparators control register circuitry 344 using the method and apparatus described above in section 2.2. As is shown, instructions I0–I3 are provided to each of instruction comparators A–D. But each of instruction comparators A–D compares instructions I0–I3 with different expected instructions A–D stored in storage elements 2700–2706, respectively. For additional flexibility, each instruction comparator is also provided with a separate set of mask, negate and enable bits, as shown.

Figure 30:
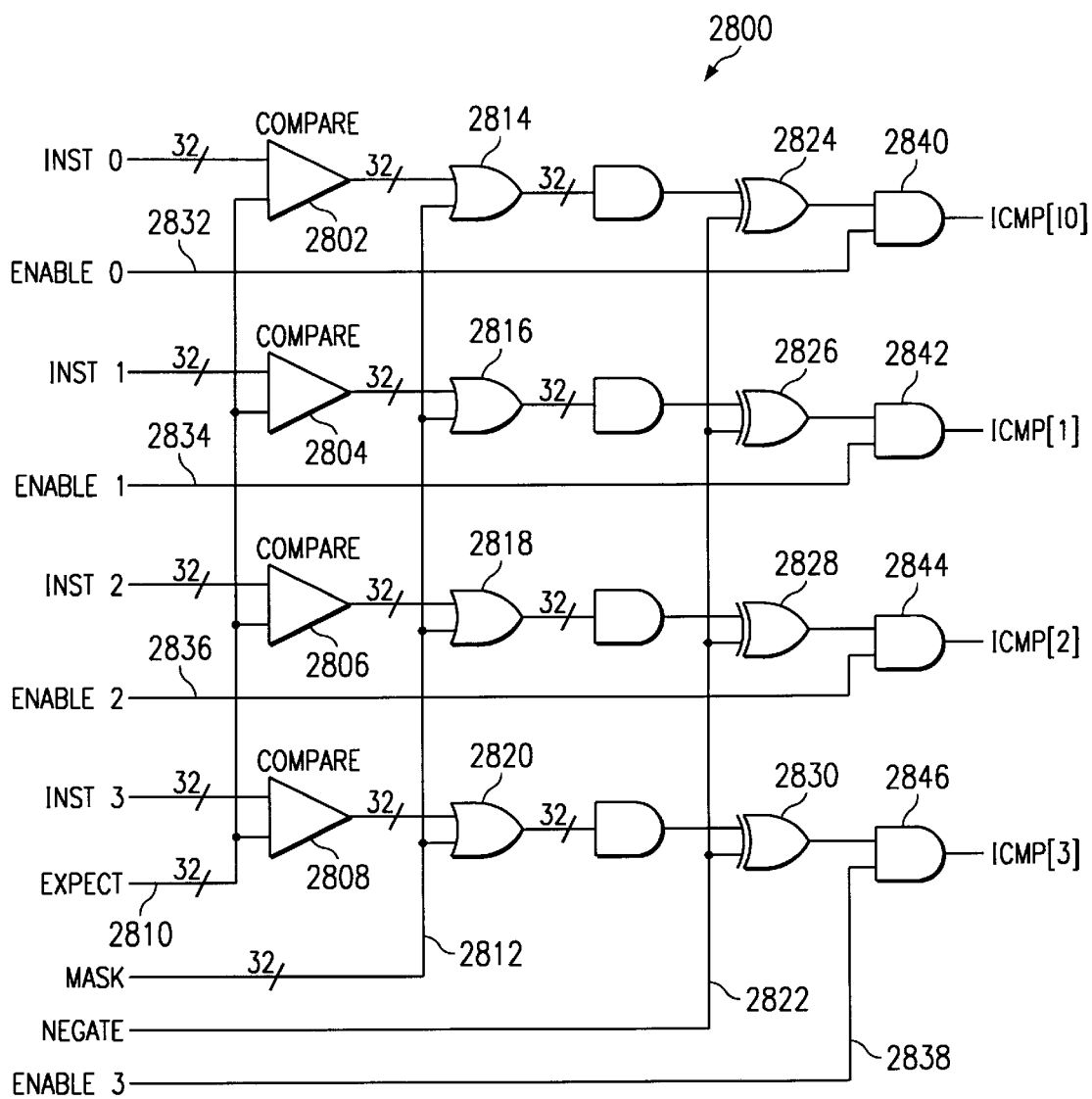
FIG. 30 is a block diagram illustrating a representative one of the instruction comparators of FIG. 29.

FIG. 30 illustrates in detail a representative one of instruction comparators A–D. Instruction comparator 2800 contains four 32-bit comparators 2802–2808. One 32-bit input of each comparator 2802–2808 is coupled to 32-bit EXPECTed instruction 2810. The other input of each comparator 2802–2808 is coupled to a different one of the four instructions I0–3. A thirty-two bit MASK 2812 is provided to each of OR gates 2814–2820, allowing the programmer the option of bit-wise masking certain of the bits from each instruction comparison result. A NEGATE bit 2822 is provided to exclusive OR gates 2824–2830, allowing the programmer the option of negating each of the instruction comparison results. Finally, a set of ENABLE bits 2832–2838 is provided to AND gates 2840–2846, allowing the programmer the option of individually enabling or disabling each of the instruction comparison results.

Figure 31:
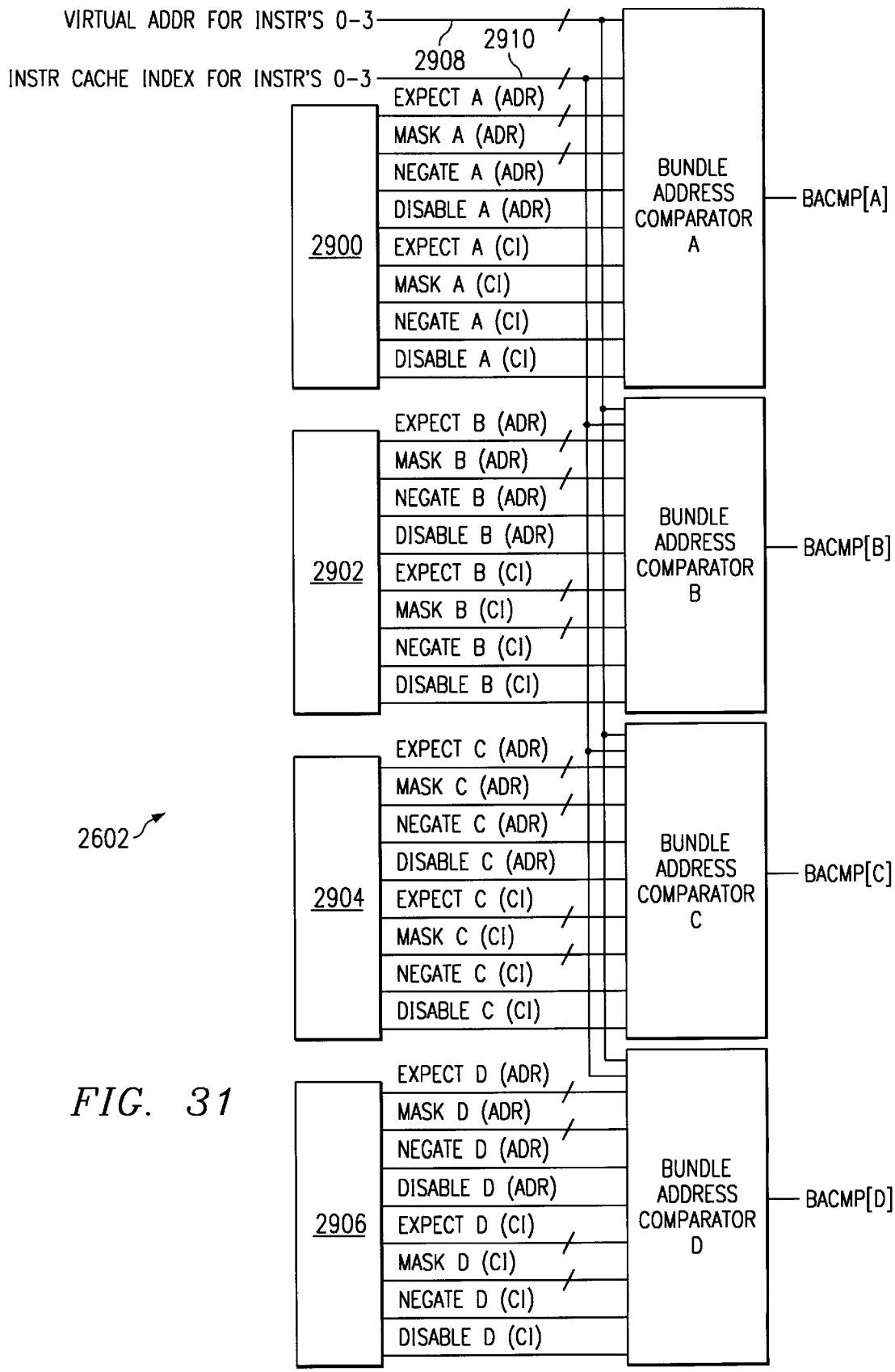
FIG. 31 is a block diagram illustrating the address comparator matrix of FIG. 28.

FIG. 31 illustrates address comparator matrix 2602 in detail. It is contemplated that storage elements 2900–2906 would be included within fetch comparators control register circuitry 344. Thus, storage elements 2900–2906 would be loaded with data by writing to fetch comparators control register circuitry 344 using the method and apparatus described above in section 2.2. As mentioned above, bundle address comparator matrix 2602 contains four bundle address comparators A–D. Each of bundle address comparators A–D is coupled to selected bits 2908 of the virtual address for the bundle of instructions I0–I3. Each of bundle address comparators A–D is also coupled to the cache index 2910 for the bundle of instructions I0–I3. But each of bundle address comparators A–D compares the virtual address bits 2908 and the cache index 2910 with different expected addresses A–D stored in storage elements 2900–2906, respectively. For additional flexibility, each address comparator is also provided with a separate set of mask, negate and enable bits, as shown.

Figure 32:
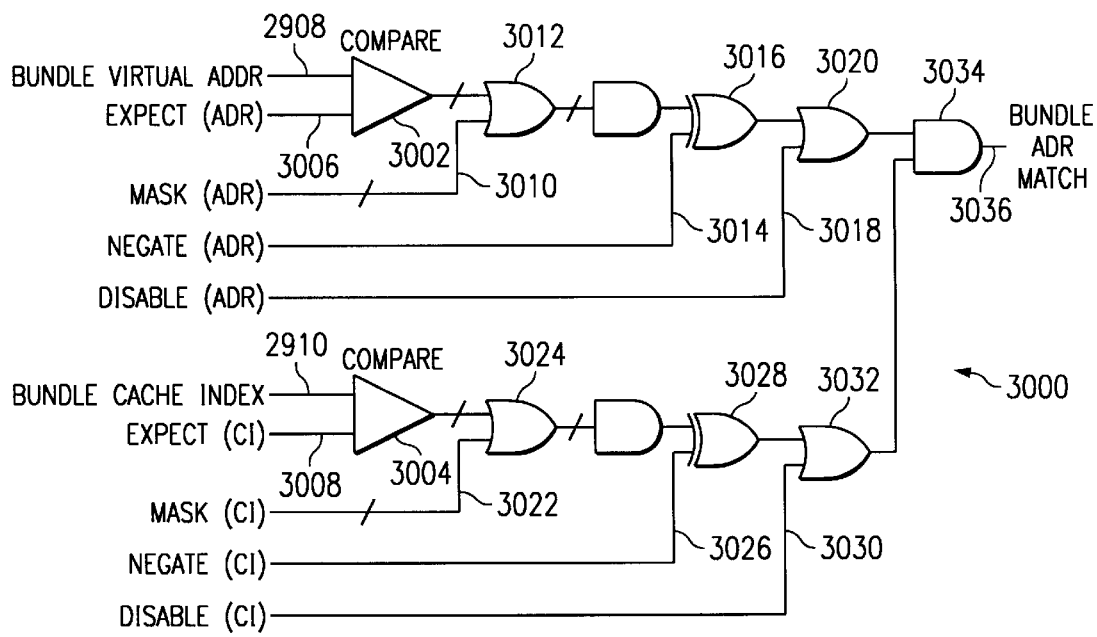
FIG. 32 is a block diagram illustrating a representative one of the address comparators of FIG. 31.

FIG. 32 illustrates in detail a representative one of bundle address comparators A–D. Bundle address comparator 3000 contains comparators 3002 and 3004. Comparator 3002 is used to compare bundle virtual address bits 2908 with EXPECTed bundle virtual address bits 3006. Comparator 3004 is used to compare bundle cache index 2910 with EXPECTed bundle cache index 3008. A MASK 3010 is provided to OR gate 3012, allowing the programmer the option of masking certain of the bits from the bundle virtual address comparison. A NEGATE bit 3014 is provided to exclusive OR gate 3016, allowing the programmer the option of negating the result of the bundle virtual address comparison. And a DISABLE bit 3018 is provided to OR gate 3020, allowing the programmer the option of enabling or disabling the result of the bundle virtual address comparison. Similarly, a MASK 3022 is provided to OR gate 3024, allowing the programmer the option of masking certain of the bits from the bundle cache index comparison. A NEGATE bit 3026 is provided to exclusive OR gate 3028, allowing the programmer the option of negating the result of the bundle cache index comparison. And a DISABLE bit 3030 is provided to OR gate 3032, allowing the programmer the option of enabling or disabling the result of the bundle cache index comparison. Finally, the results of the bundle virtual address comparison and the bundle cache index comparison are ANDed by AND gate 3034, yielding a BUNDLE ADDR MATCH signal 3036. This latter signal corresponds to the BACMP signals shown in FIG. 31.

3.5 Data Cache Interface Components

Figure 33:
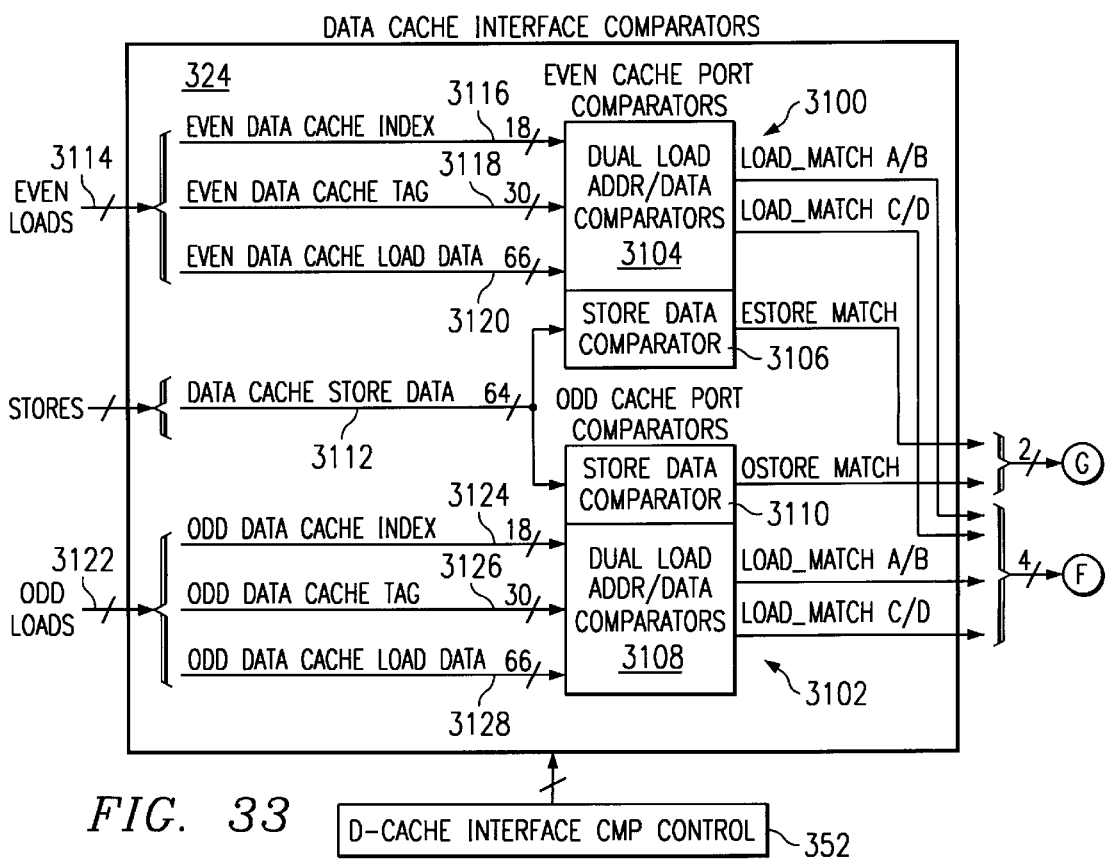
FIG. 33 is a block diagram illustrating the data cache interface comparators of FIG. 5.

Data cache interface comparators 324 will now be discussed with reference to FIGS. 33–36. FIG. 33 illustrates the content of data cache interface comparators 324 in detail. As is shown, data cache interface comparators block 324 contains even cache port comparators 3100 and odd cache port comparators 3102. Even cache port comparators block 3100 contains dual load address/data comparators 3104 and store data comparator 3106. Odd cache port comparators block 3102 contains dual load address/data comparators 3108 and store data comparator 3110. Sixty-four bit data cache store data bus 3112 is provided to both store data comparators 3106 and 3110. (Microprocessor 100 is designed to be capable of executing two load operations simultaneously—one odd and one even. Store operations, on the other hand, may only be executed one at a time.)

Even loads bus 3114 includes even data cache index bus 3116, even data cache tag bus 3118 and even data cache load data bus 3120. All three of these busses are provided to dual load address/data comparators 3104. Odd loads bus 3122 includes odd data cache index bus 3124, odd data cache tag bus 3126 and odd data cache load data bus 3128. All three of these buses are provided to dual load address/data comparators 3108.

Dual load address/data comparators 3104 provide two output signals, ELOADMATCH0 and ELOADMATCH1. Dual load address/data comparators 3108 provide two output signals, OLOADMATCH0 and OLOADMATCH1. These four bits are provided to programmable state machine 302 at F. In addition, these four bits are also stored in address reorder buffer 330, as will be discussed in more detail below in relation to FIG. 38. Store data comparator 3106 provides one output signal, ESTOREMATCH. Store data comparator 3110 provides one output signal, OSTOREMATCH. These two bits are provided to programmable state machine 302 at G.

Figure 34:
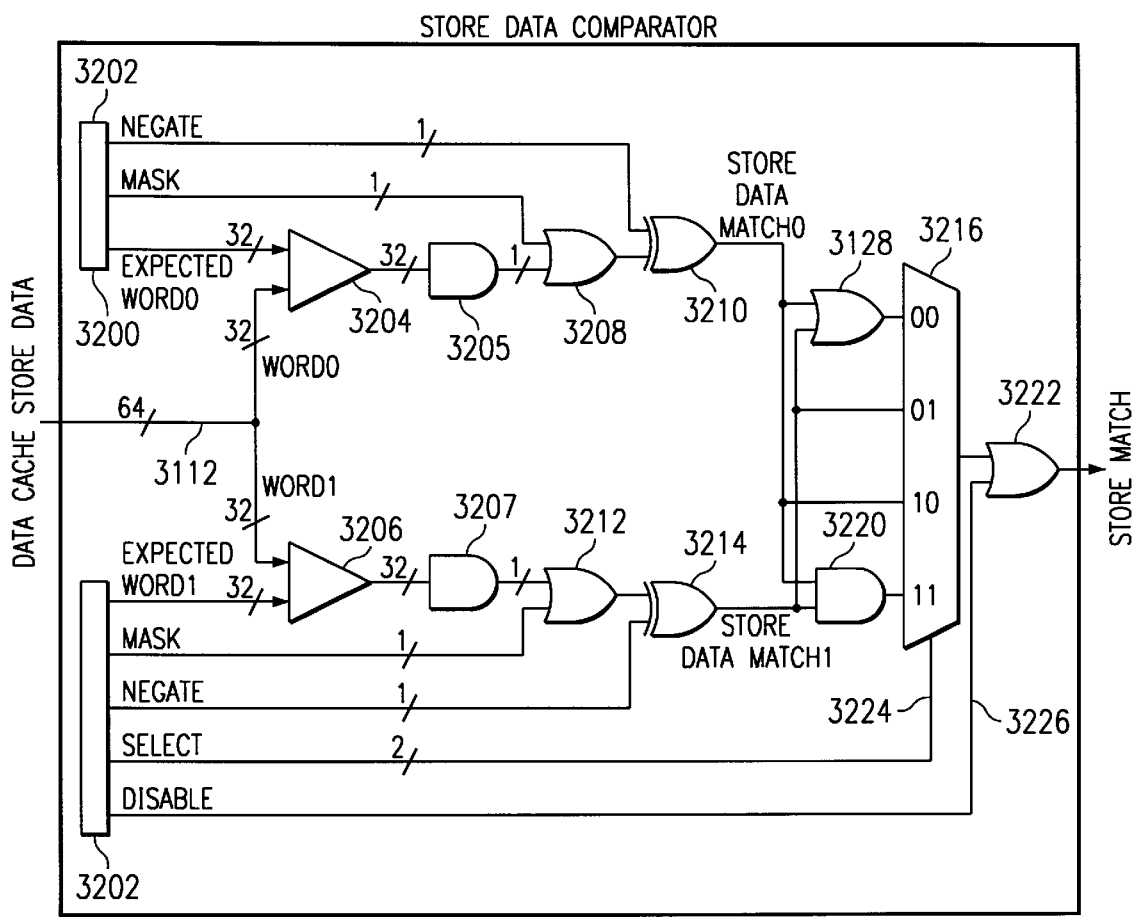
FIG. 34 is a block diagram illustrating a representative one of the store comparators of FIG. 33.

FIG. 34 illustrates in detail a representative one of store data comparators 3106 and 3110. It is contemplated that storage elements 3200 and 3202 would be included within data cache interface comparators control register circuitry 352. Thus, storage elements 3200 and 3202 would be loaded with data by writing to data cache interface comparators control register circuitry 352 using the method and apparatus described above in section 2.2. Each 32-bit word of 64-bit data bus 3112 is sent to a different one of comparators 3204 and 3206. Comparator 3204 compares word 0 with EXPECTed word 0, and comparator 3206 compares word 1 with EXPECTed word 1. The result of the comparison for word 0 may be masked by OR gate 3208 and negated by exclusive OR gate 3210, at the option of the programmer. The result of the comparison for word 1 may be masked by OR gate 3212 and negated by exclusive OR gate 3214, at the option of the programmer.

Additional flexibility is provided by multiplexer 3216, OR gate 3218, AND gate 3220 and OR gate 3222. SELECT bits 3224 may be set by the programmer so that STOREMATCH (the output of the store data comparator) reflects any one of the following: (0) the logical OR of store data match 0 and store data match 1; (1) just store data match 1; (2) just store data match 0; or (3) the logical AND of store data match 0 and store data match 1. Moreover, by setting DISABLE bit 3226 appropriately, the programmer may choose to override all of the previously mentioned results, effectively "forcing" a match.

Figure 35:
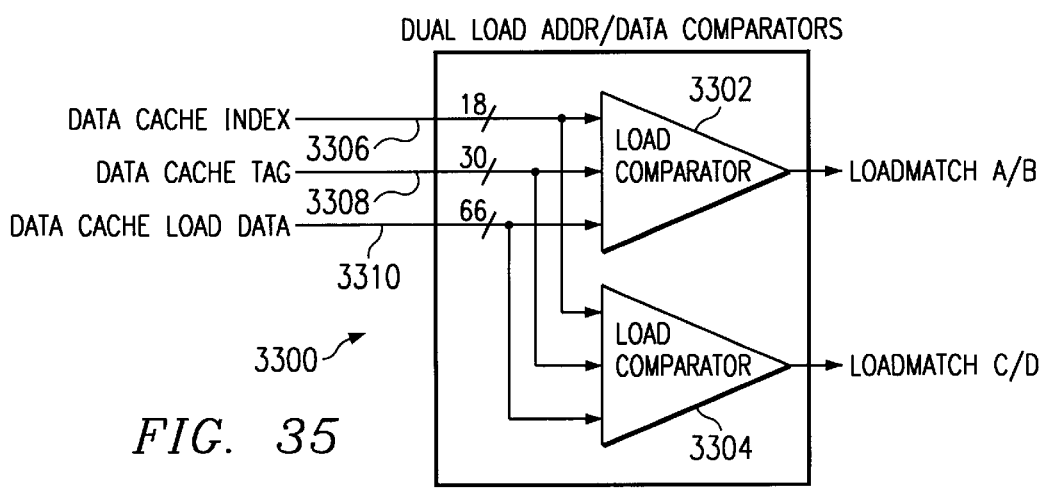
FIG. 35 is a block diagram illustrating a representative one of the dual load addr/data comparators of FIG. 33.

FIG. 35 illustrates in detail a representative one of dual load address/data comparators 3104 and 3108. As is shown, dual load address/data comparator 3300 contains load comparators 3302 and 3304. Each is coupled to data cache index bus 3306, data cache tag bus 3308 and data cache load data bus 3310. The outputs of load comparators 3302 and 3304 are LOADMATCH0 and LOADMATCH1, respectively.

Figure 36:
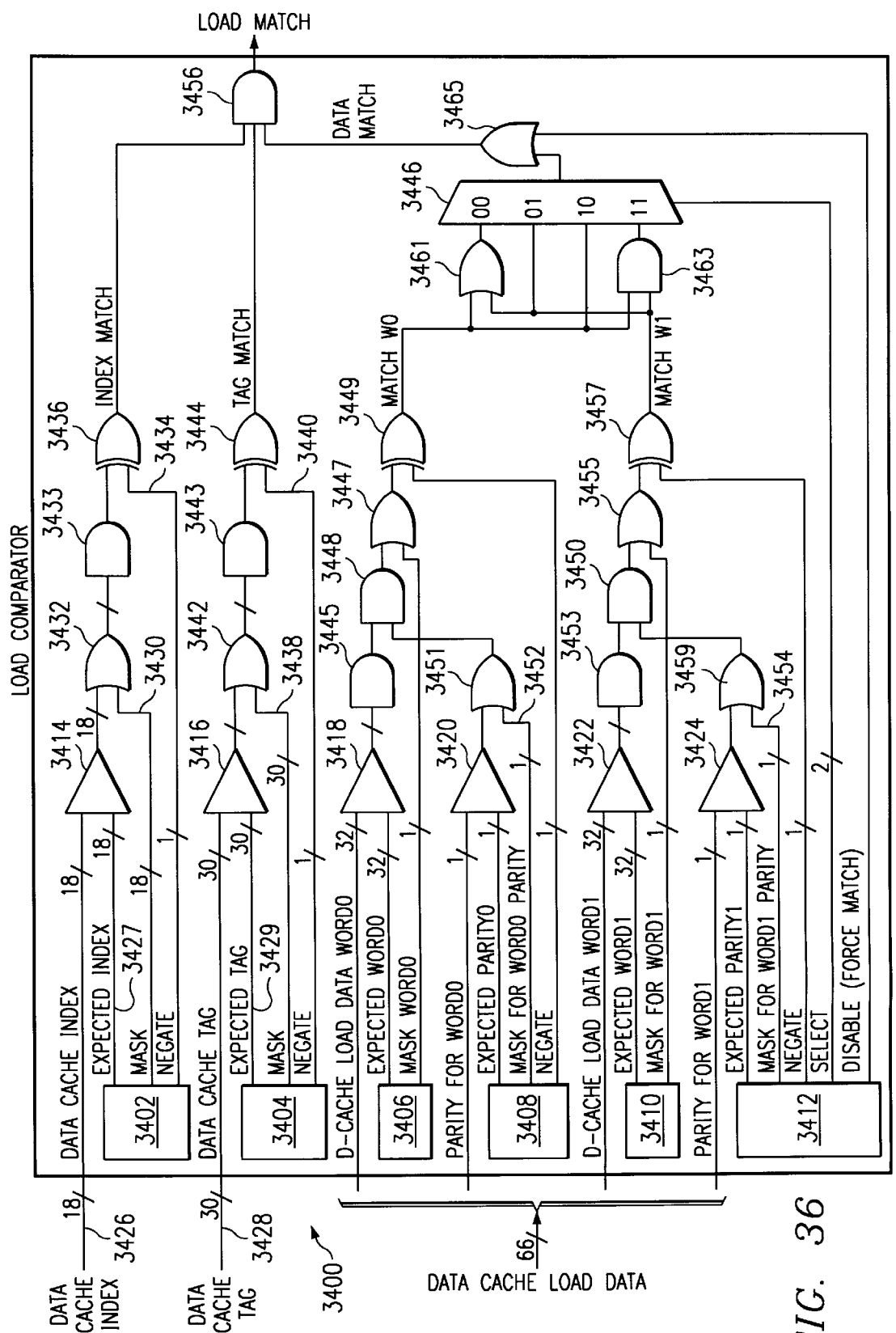
FIG. 36 is a block diagram illustrating a representative one of the load comparators of FIG. 35.

FIG. 36 illustrates in detail a representative one of load comparators 3302 and 3304. It is contemplated that storage elements 3402–3412 would be included within data cache interface comparators control register circuitry 352. Thus, storage elements 3402–3412 would be loaded with data by writing to data cache interface comparators control register circuitry 352 using the method and apparatus described above in section 2.2. Comparator 3414 compares data cache index 3426 with EXPECTed data cache index 3427. Comparator 3416 compares data cache tag 3428 with EXPECTed data cache tag 3429. For additional flexibility, MASK bits 3430 are provided to OR gate 3432, allowing the programmer to mask individual bits from the data cache index comparison results. And NEGATE bit 3434 is provided to exclusive OR gate 3436, allowing the programmer to negate the data cache index comparison result. In respect of the data cache tag comparison results, the same flexibility is provided to the programmer by MASK bits 3438, OR gate 3442, NEGATE bit 3440 and exclusive OR gate 3444.

Comparators 3418 and 3422 and multiplexer 3446 are used to produce DATA MATCH in exactly the same manner as comparators 3204 and 3206 and multiplexer 3216 are used to produce STOREMATCH, with one exception: Comparators 3420 and 3424 are added to consider whether there is also a match between the parity bits for cache load data words 0 and 1 and the corresponding EXPECTed parity bits. The results of the parity comparisons are merged with the data comparisons by AND gates 3448 and 3450. MASK bits 3452 and 3454 are provided for parity word 0 and 1 comparisons, respectively, providing the programmer with additional flexibility. Ultimately, INDEXMATCH, TAGMATCH and DATAMATCH are ANDed together by AND gate 3456 to produce LOADMATCH.

3.6 Sort Unit Components

Figure 37:
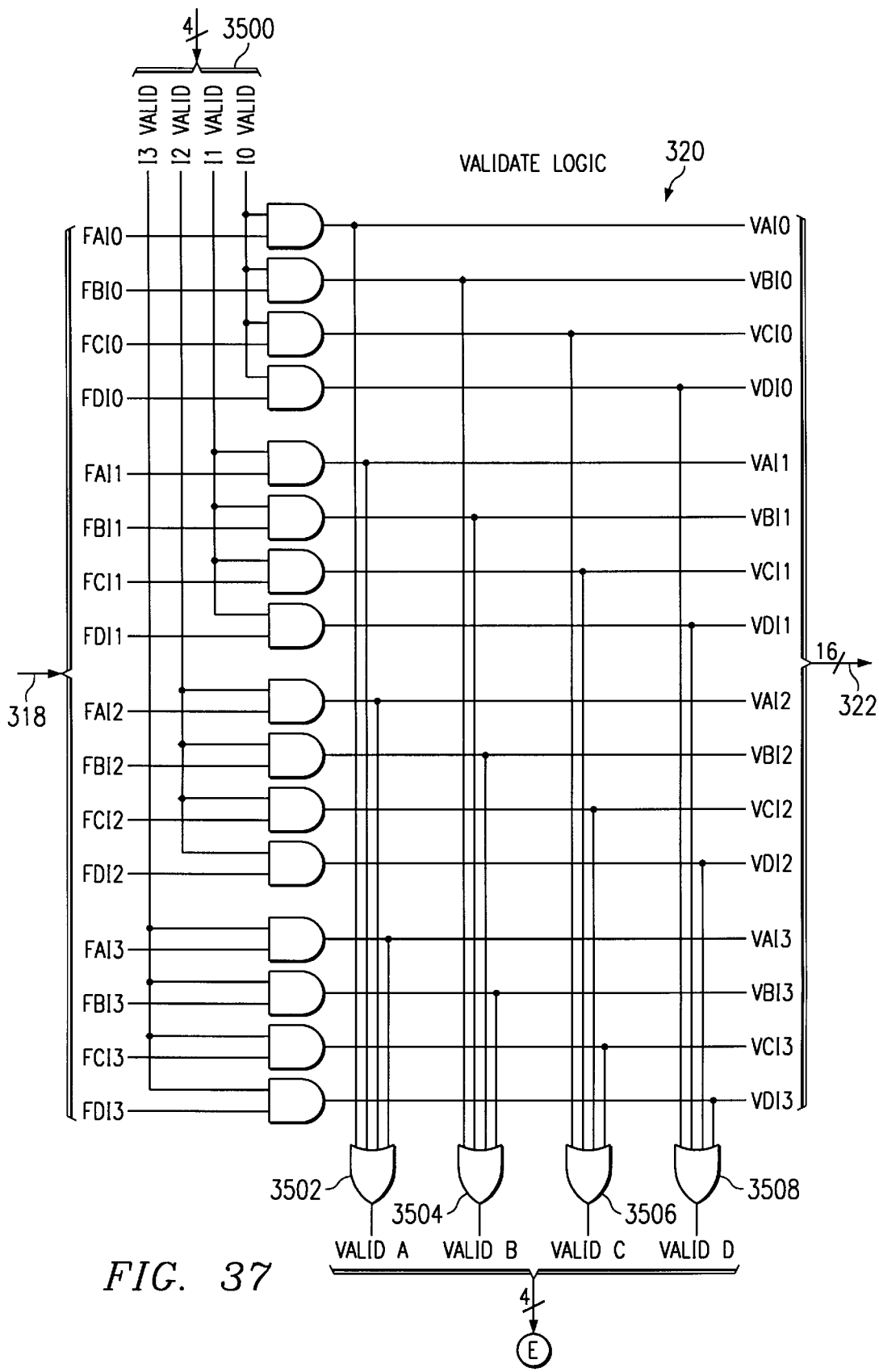
FIG. 37 is a block diagram illustrating the validate logic of FIG. 5.

FIG. 37 illustrates validate logic 320 in detail. As was discussed above, one of the functions of sort unit 112 is to determine which of the four instructions in a fetched bundle were actually requested and are therefore "valid," versus which of them were not requested and are therefore "invalid." It is contemplated that four bits (one "valid/invalid" bit for each instruction) will be produced by conventional means within sort unit 112 in order to convey this information to validate logic 320. In FIG. 37, these bits are labeled I0VALID, I1VALID, I2VALID and I3VALID. Bus 318 carries sixteen result bits from fetch unit comparators 316 over to validate logic 320. The VALID bits are ANDed with the corresponding fetch unit comparator results, as shown, resulting in the validate logic results. For example, all of the fetch unit comparator results for instruction 0 (FAI0, FBI0, FCI0 and FDI0) are ANDed with the I0VALID bit. The resulting four bits are called VAI0, VBI0, VCI0 and VDI0. Sixteen bits result from this ANDing operation. They are provided via bus 322 to instruction queue 114 for storage along with the instructions to which they correspond. In addition, the validated results for each fetch unit comparator A–D are ORed together, instruction by instruction, by OR gates 3502–3508. The outputs of these OR gates are provided to programmable state machine 302 at E.

3.7 Retire Unit Components

A maximum of four instructions may retire from instruction queue 114 during any given clock cycle—two from ALU queue 138 and two from memory queue 140. For the remainder of this discussion, these retiring instructions will be referred to as ALU instructions 0 and 1, and MEM instructions 0 and 1 (hereinafter denoted ALU[0], ALU[1], MEM[0] and MEM[1]). The reader should note that these retiring instructions do not necessarily correspond to the instructions I0–I3 discussed previously. Rather, during any given clock cycle, a bundle of four instructions I0–I3 may be fetched, and at the same time a group of four instructions ALU[0], ALU[1], MEM[0] and MEM[1] may be retired.

Figure 38:
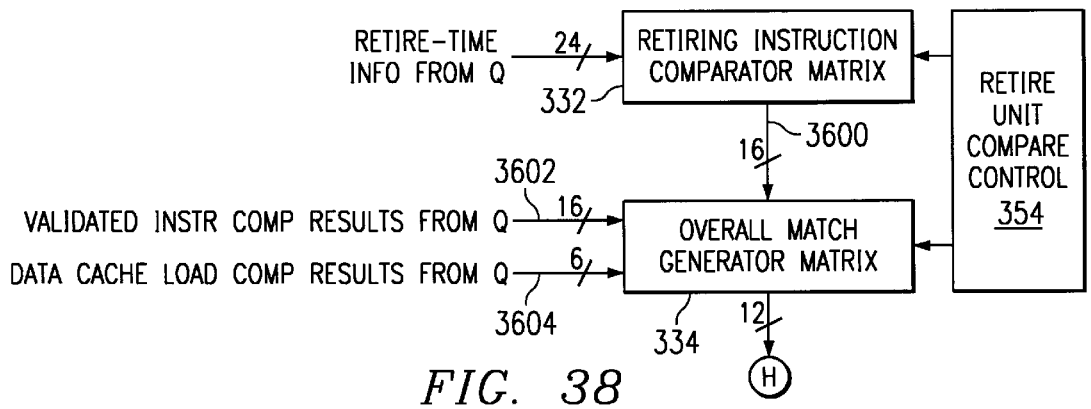
FIG. 38 is a block diagram illustrating the retire unit components shown in FIG. 5.

FIG. 38 illustrates the components of the invention that reside within retire unit 120. As was discussed previously, retiring instruction comparator matrix 332 takes, as its inputs, 24 bits of "retire-time information" from instruction queue 114. Retiring instruction comparator matrix 332 provides sixteen output bits 3600 to overall match generation matrix 334. Overall match generation matrix 334 takes these sixteen bits as inputs, as well as 22 other bits from instruction queue 114. The latter 22 bits include validated instruction comparison results 3602 (which correspond to the 16 bits 322 from validation logic 320 that were previously placed in bit fields 326, 328), and data cache load comparison results 3604 (which correspond to the 6 bits deriving from data cache interface comparators 324 that were previously placed in bit field 330). Based on these inputs, overall match generation matrix 334 provides 12 output bits H to programmable state machine 302.

Figure 39:
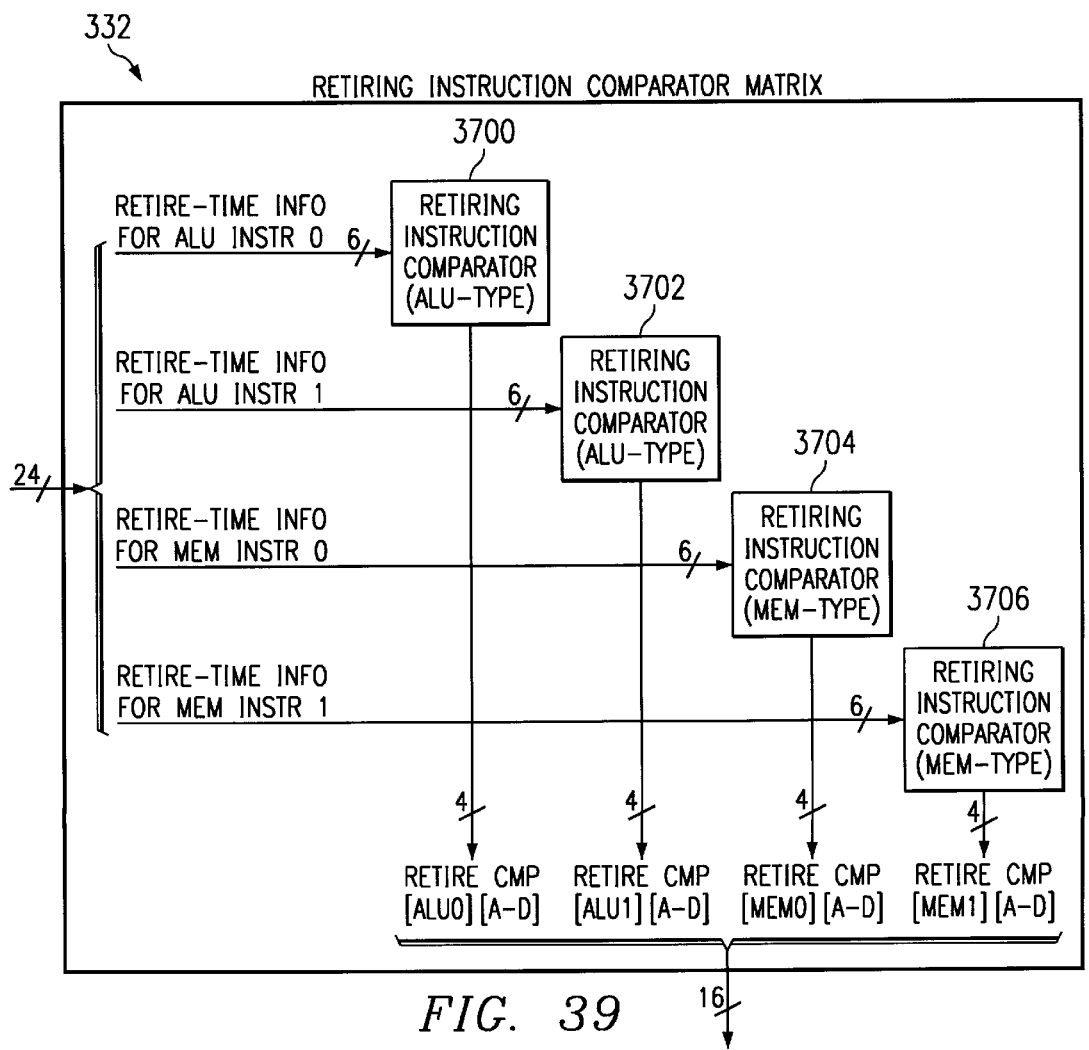
FIG. 39 is a block diagram illustrating the retiring instruction comparator matrix of FIG. 38.

FIG. 39 illustrates retiring instruction comparator matrix 332 in detail. Retiring instruction comparator matrix 332 contains four retiring instruction comparators 3700–3706, one for each of the four possible retiring instructions. Because a maximum of two ALU-type instructions and a maximum of two MEM-type instructions may retire at once, retiring instruction comparators 3700 and 3702 are dedicated to ALU-type retiring instructions, while retiring instruction comparators 3704 and 3706 are dedicated to MEM-type retiring instructions. Six bits of RETIRE-TIME INFO are supplied to each retiring instruction comparator. Each set of six bits corresponds to one of the retiring instructions, as shown. Within each of the four retiring instruction comparators are four retire match generators A–D. (This will be discussed in more detail below in relation to FIGS. 38 and 39.) Thus, each of the retiring instruction generators 3700–3706 produces four retire match bits. It follows that the total output for matrix 332 is sixteen total bits of match results presented as four different 4-bit sets—one set for each of the possible retiring instructions. In the drawing, these sets are denoted RETIRE_CMP [ALU0] [A–D], RETIRE_CMP [ALU1] [A–D], RETIRE_CMP [MEM0] [A–D] and RETIRE_CMP [MEM1] [A–D].

Figure 40:
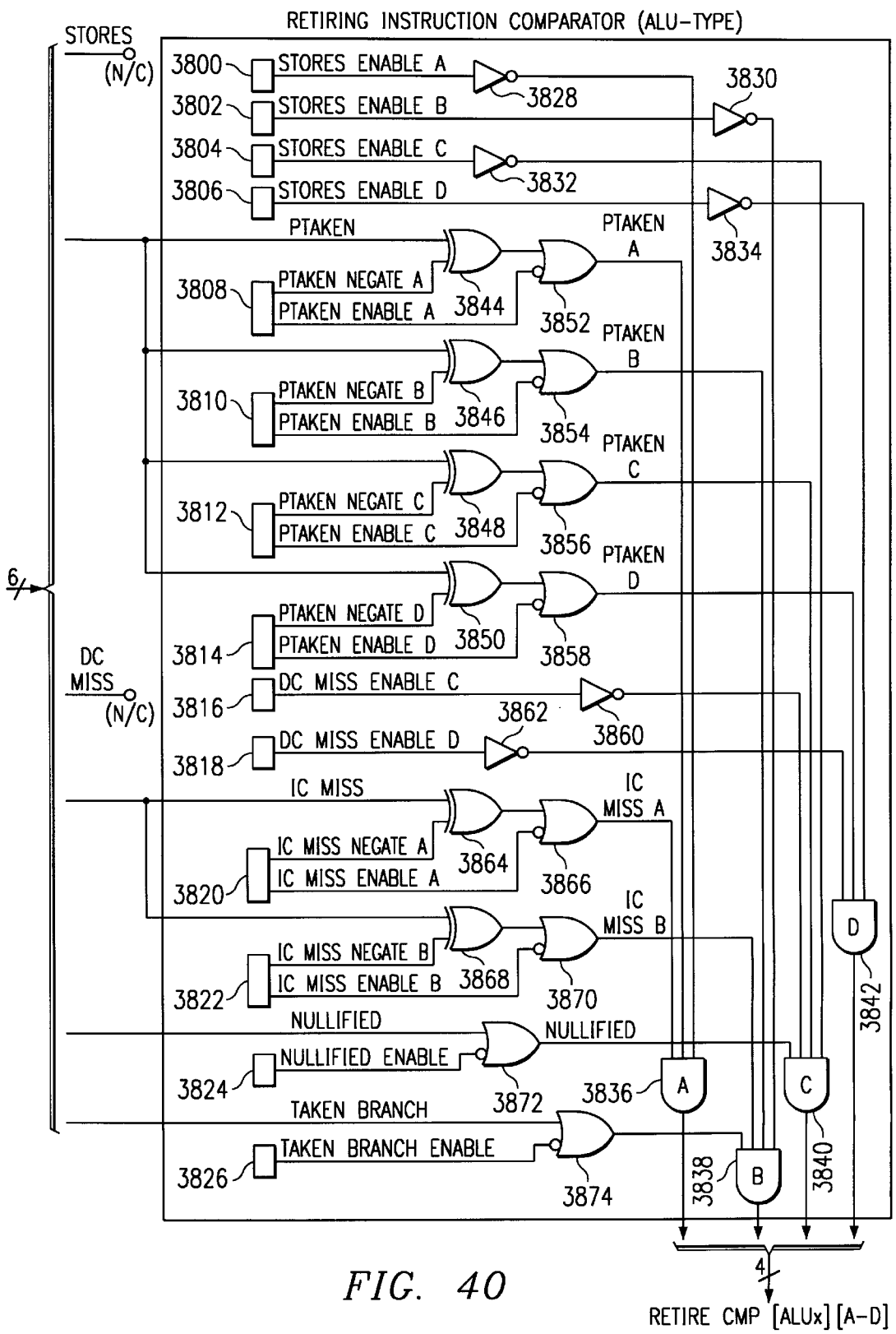
FIG. 40 is a block diagram illustrating a retiring instruction comparator representative of the ALU-type retiring instruction comparators of FIG. 39.

FIG. 40 illustrates in detail a representative one of ALU-type retiring instruction comparators 3700 and 3702. It is contemplated that storage elements 3800–3826 would be included within retire unit comparators control register circuitry 354. Thus, storage elements 3800–3826 would be loaded with data by writing to retire unit comparators control register circuitry 354 using the method and apparatus described above in section 2.2. The generation of the six "retire-time info" signals shown in FIG. 40 may be accomplished by any conventional means. Numerous alternative methods for doing so will be apparent to those having ordinary skill in the art based on the following signal descriptions:

STORES: This bit indicates whether the associated retiring instruction was a store-type memory instruction. (This information is pertinent only to MEM-type instructions.)

PTAKEN: For every conditional branch or jump-type instruction encountered, microprocessor 100 makes a prediction about whether the (upcoming) evaluation of the condition will cause the branch or jump to be taken. This bit indicates whether the associated instruction was a branch instruction whose branch was predicted to be taken.

DCMISS: This bit indicates whether the associated instruction caused a data cache miss. (This information is pertinent only to MEM-type instructions.)

ICMISS: This bit indicates whether the associated instruction caused an instruction cache miss.

NULLIFIED: The instruction set of microprocessor 100 includes the capability to "nullify" certain instructions in the instruction stream based on the outcome of other instructions or conditions within microprocessor 100. This bit indicates whether the associated instruction was nullified for any reason.

TAKENBRANCH: This bit indicates whether the associated instruction was a branch instruction whose branch was actually taken. (This information is pertinent only to ALU-type instructions.) Bits 3800–3826 are provided for the programmer's flexibility. By setting them appropriately, the programmer may configure the retiring instruction comparator to produce a variety of different kinds of results at its outputs. Four STORES enable bits 3800–3806 are provided. Each is coupled to one of the inputs of one of AND gates 3836–3842 through inverters 3828–3834. (This is done so that the ALU-type retiring instruction comparator will not produce any match indications when the programmer is interested in store-type memory instructions.) Storage elements 3808–3814 contain PTAKEN negate and enable bits for each of AND gates 3836–3842, respectively. The negate function is achieved by exclusive OR gates 3844–3850. The enable function is achieved by OR gates 3852–3858 (each of which has an inverted input for the enable bit). Two DCMISS enable bits are provided. One is provided to an input of AND gate 3840 through inverter 3860. The other is provided to an input of AND gate 3842 through inverter 3862. Storage elements 3820–3822 contain ICMISS negate and enable bits for each of AND gates 3836–3838, respectively. The negate function is achieved by exclusive OR gates 3864–3868. The enable function is achieved by OR gates 3866–3870 (each of which has an inverted input for the enable bit). Storage element 3824 contains a NULLIFIED enable bit for AND gate 3840. The enable function is performed by exclusive OR gate 3872, which has an inverted input for the enable bit. Storage element 3826 contains a TAKEN_BRANCH enable bit for AND gate 3838. The enable function is performed by exclusive OR gate 3874, which has an inverted input for the enable bit.

Figure 41:
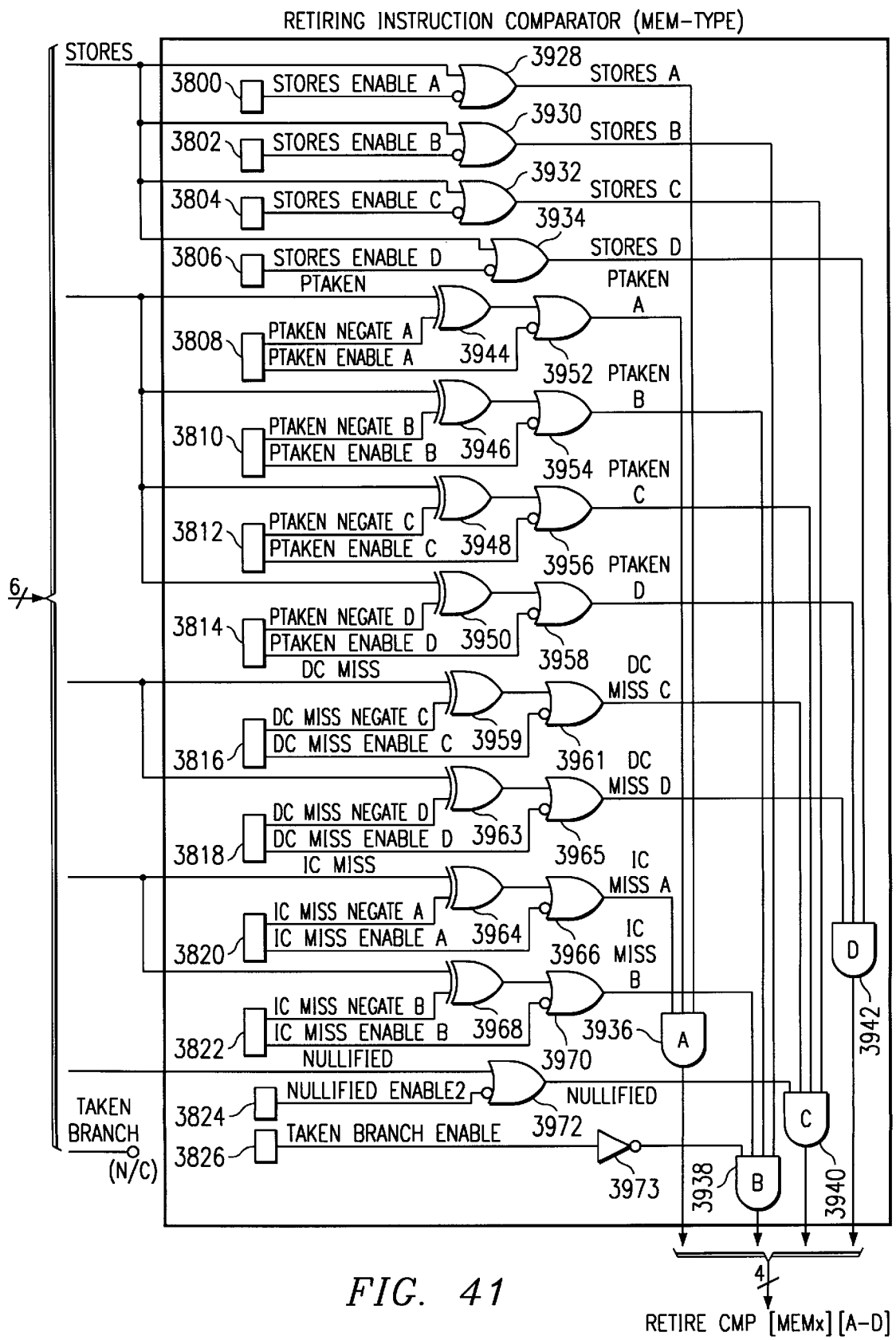
FIG. 41 is a block diagram illustrating a retiring instruction comparator representative of the MEM-type retiring instruction comparators of FIG. 39.

FIG. 41 illustrates in detail a representative one of MEM-type retiring instruction comparators 3704 and 3706. The same bits contained in storage elements 3800–3826 that were provided to comparators 3700–3702 are also provided to comparators 3704–3706, as shown. The STORES enable bits 38003806 are used for all four of AND gates 3936–3942. The enable function is provided by OR gates 3928–3934, all of which have an inverted input for the enable bit. The PTAKEN negate and enable bits 3808–3814 are used in exactly the same manner as they are used in the ALU-type comparator shown in FIG. 40, as are the ICMISS negate and enable bits 3820–3822 and the NULLIFIED enable bit 3824. The two sets of DCMISS negate and enable bits are used for AND gates 3940 and 3942. The negate function is provided by exclusive OR gates 3959 and 3963. The enable function is provided by OR gates 3961 and 3965, each of which has an inverted input for the enable bit. The TAKEN_BRANCH enable bit 3826 is provided to one input of AND gate 3938 through inverter 3973.

Figure 42:
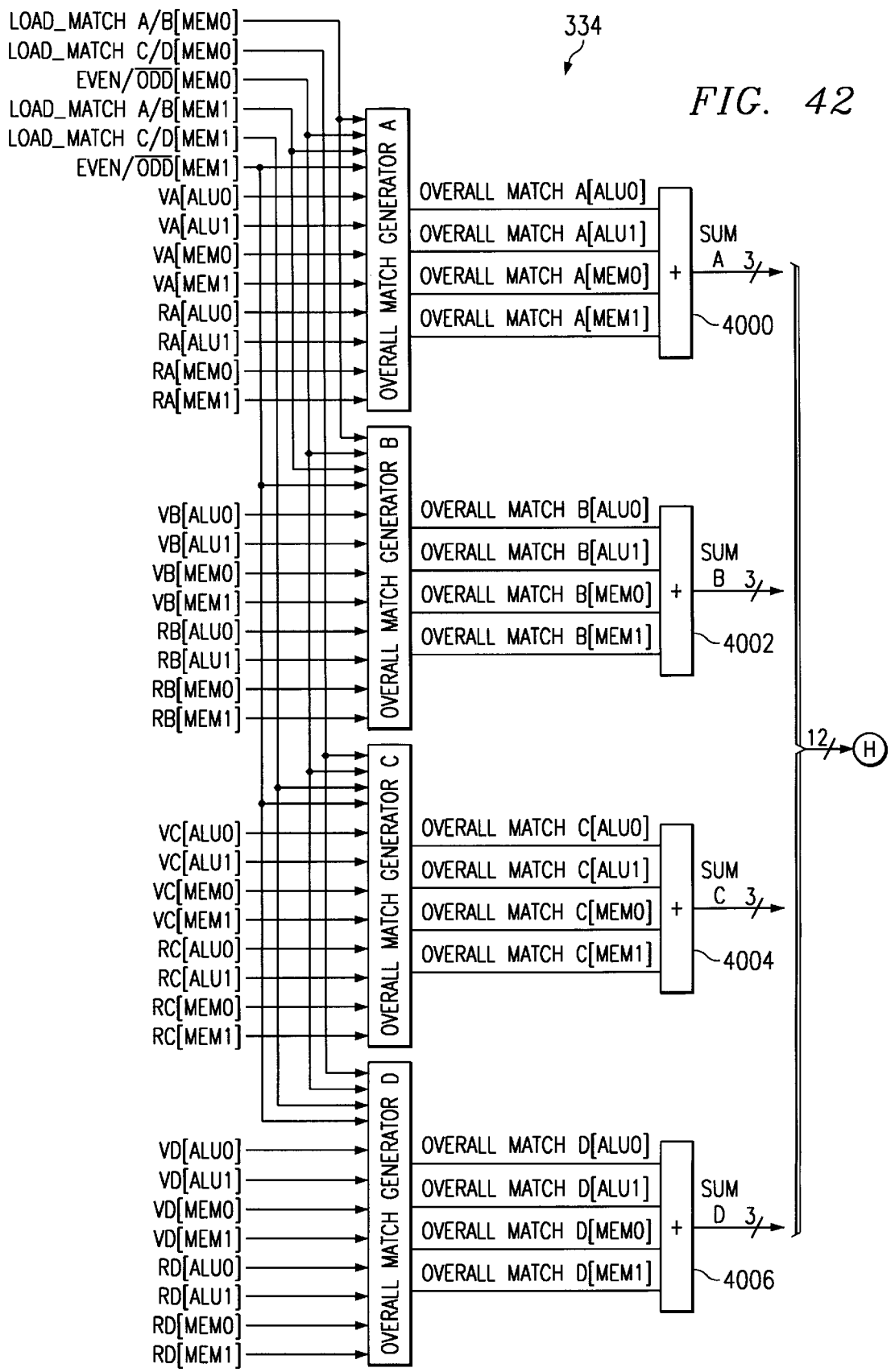
FIG. 42 is a block diagram illustrating the overall match generator matrix of FIG. 38.

FIG. 42 illustrates overall match generator matrix 334 in detail. Overall match generator matrix 334 includes overall match generators A–D. A total of thirty-eight input bits are provided to overall match generator matrix 334. For each of the four possible retiring instructions MEM[0], MEM[1], ALU[0] and ALU[1], there are the following inputs: 4 bits from retiring instruction matrix 332, labeled R[A–D]; and 4 bits from validated instruction comparison results 3602, labeled V[A–D]. In addition, the 6 bits from data cache load comparison results 3604 are distributed as follows: The LOAD_MATCH A/B result bits for instructions MEM[0] and MEM[1] go to overall match generators A and B. The LOAD_MATCH C/D result bits for instructions MEM[0] and MEM[1] go to overall match generators C and D. The EVEN/ODD bits for instructions MEM[0] and MEM[1] go to each of overall match generators A–D.

Based on these inputs, each of the overall match generators produces one overall match bit for each of instructions ALU[0], ALU[1], MEM[0] and MEM[1], as shown. These four sets of overall match results are provided to adders 4000–4006. The purpose of each adder is to determine how many of its four input bits were asserted. Thus, SUM A indicates how many retiring instructions produced a match at the end of comparator chain A. SUM B indicates how many retiring instructions produced a match at the end of comparator chain B, and so on. The twelve bits comprising SUMs A–D are provided to the input of programmable state machine 302 at H.

Figure 43:
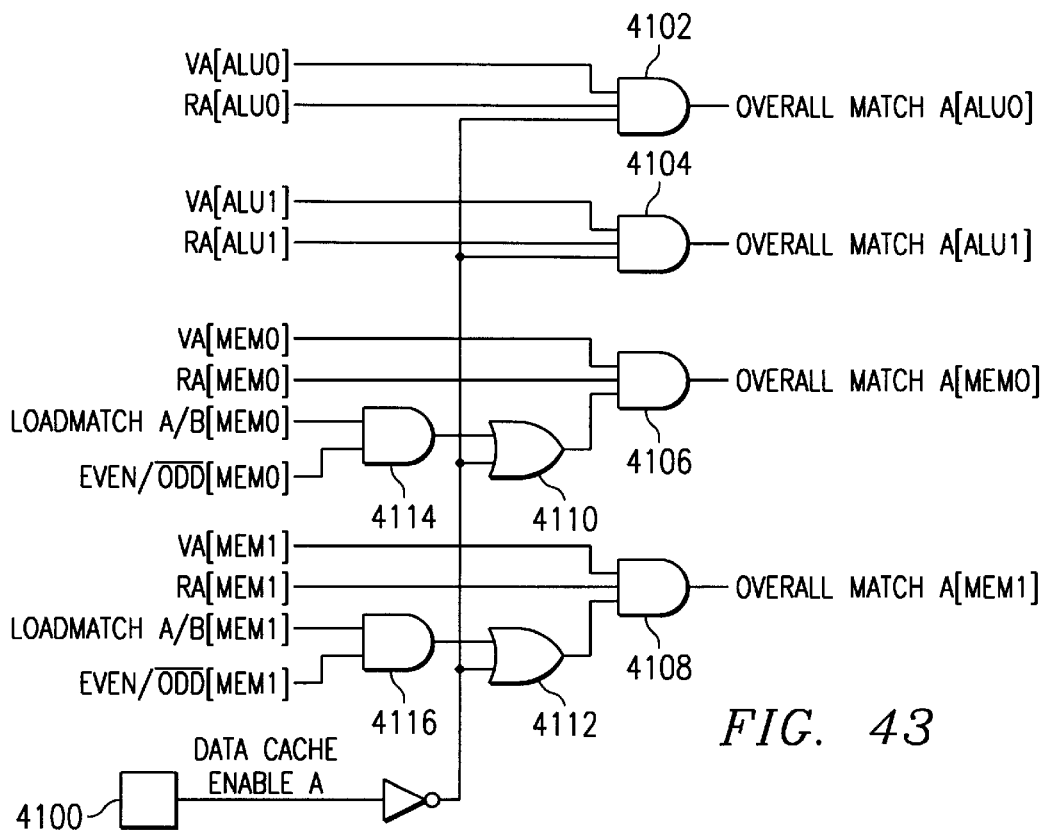
FIG. 43 is a block diagram illustrating overall match generator A shown in FIG. 42.

Each of overall match generators A–D is slightly different from the others. FIG. 43 illustrates overall match generator A in detail. It is contemplated that storage elements 4100 would be included within retire unit comparators control register circuitry 354. Thus, storage element 4100 would be loaded with data by writing to retire unit comparators control register circuitry 354 using the method and apparatus described above in section 2.2. Overall match generator A contains AND gates 4102–4108. The output of each one of these four AND gates provides the "A" overall match result for one of the four retiring instructions. Thus, these outputs are labeled OVERALL_MATCH_A [ALU0], OVERALL_MATCH_A [ALU1], OVERALL_MATCH_A [MEM0] and OVERALL_MATCH_A [MEM1]. An inverted version of data cache enable A is provided to AND gates 4102 and 4104 directly, and to AND gates 4106 and 4108 through OR gates 4110 and 4112. This is done so that, when data cache enable A is asserted (meaning the programmer is interested in MEM-type instructions on comparator chain A), there will be no overall match results generated for ALU-type instructions on comparator chain A. Results for MEM-type instructions, on the other hand, will be enabled. The EVEN/ODD bits for MEM[0] and MEM[1] are provided to AND gates 411 inversion. Thus, overall match generator A is configured to derive its MEM[0] and MEM[1] match results from the LOAD_MATCH A/B comparison result of even memory load instructions only.

Figure 44:
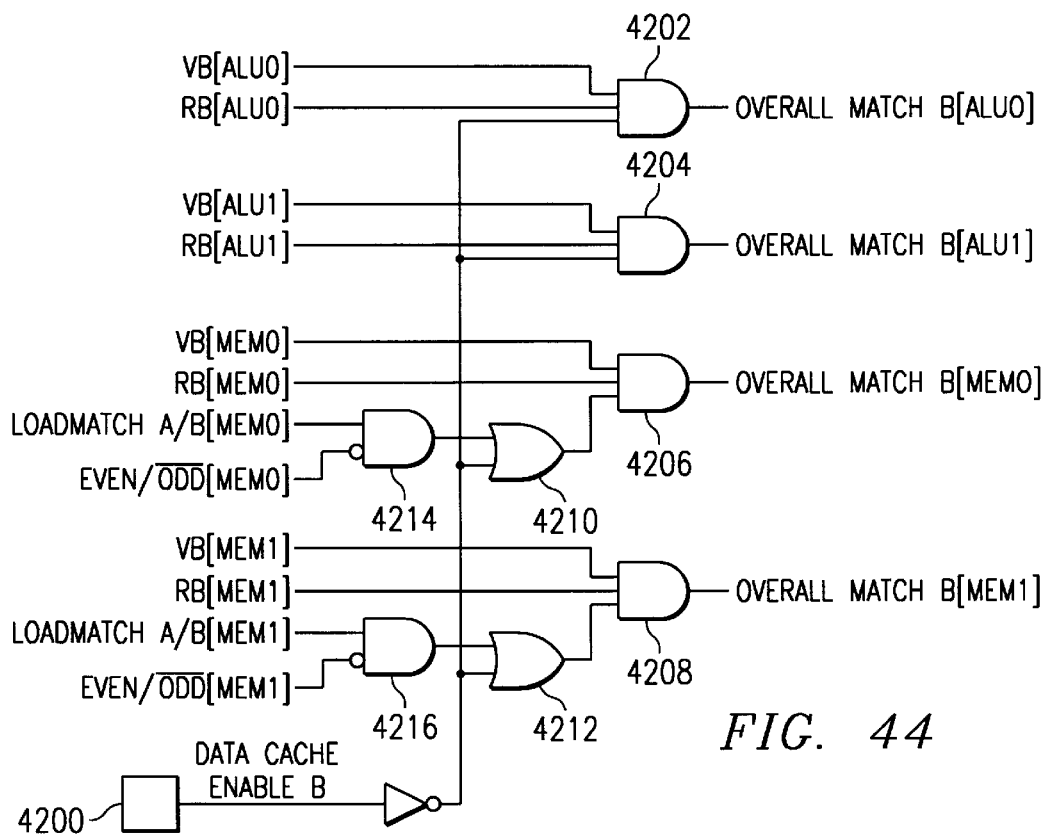
FIG. 44 is a block diagram illustrating the overall match generator B shown in FIG. 42.

FIG. 44 illustrates overall match generator B in detail. As can be seen, its structure is completely analogous to that of overall match generator A. The difference is that overall match generator B is configured to derive its MEM[0] and MEM[1] match results from the LOAD_MATCH A/B comparison result of odd memory load instructions only (by virtue of the inverted input on AND gates 4214 and 4216).

Figure 45:
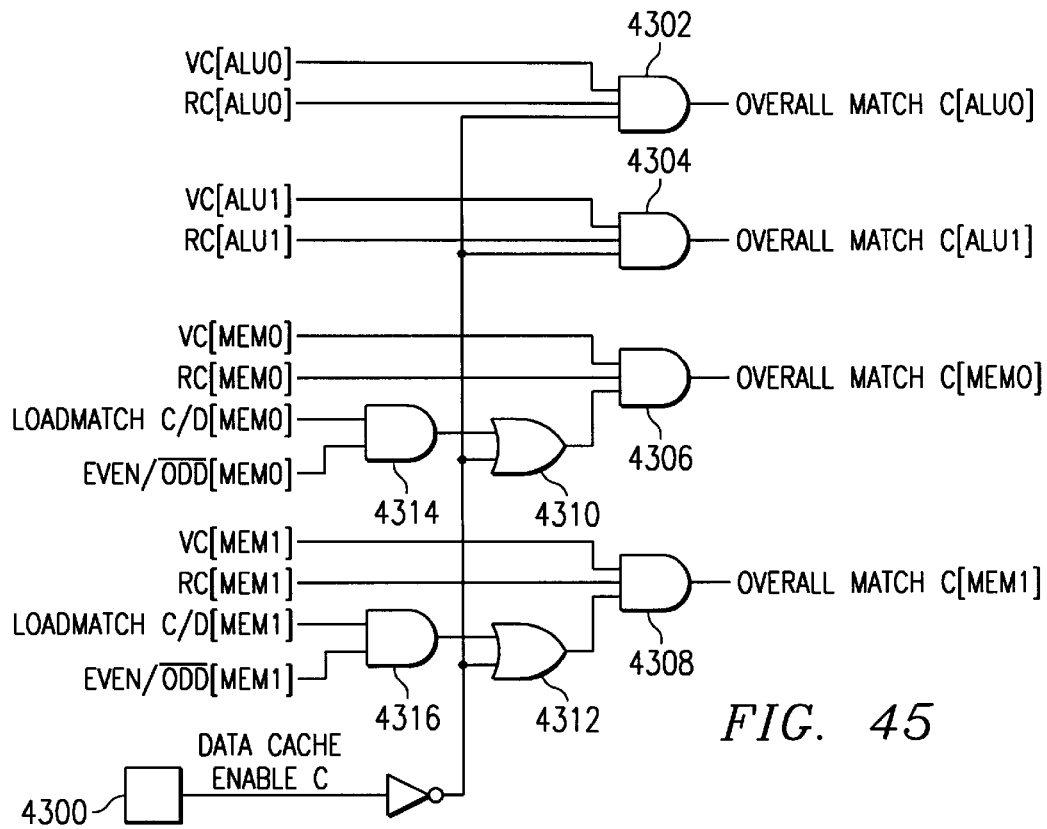
FIG. 45 is a block diagram illustrating the overall match generator C shown in FIG. 42.

FIG. 45 illustrates overall match generator C in detail. As can be seen, its structure is completely analogous to that of overall match generator A. The difference is that overall match generator C is configured to derive its MEM[0] and MEM[1] match results from the LOAD_MATCH C/D comparison result of even memory load instructions only (as opposed to deriving them from the LOAD_MATCH ANB result for even memory load instructions).

Figure 46:
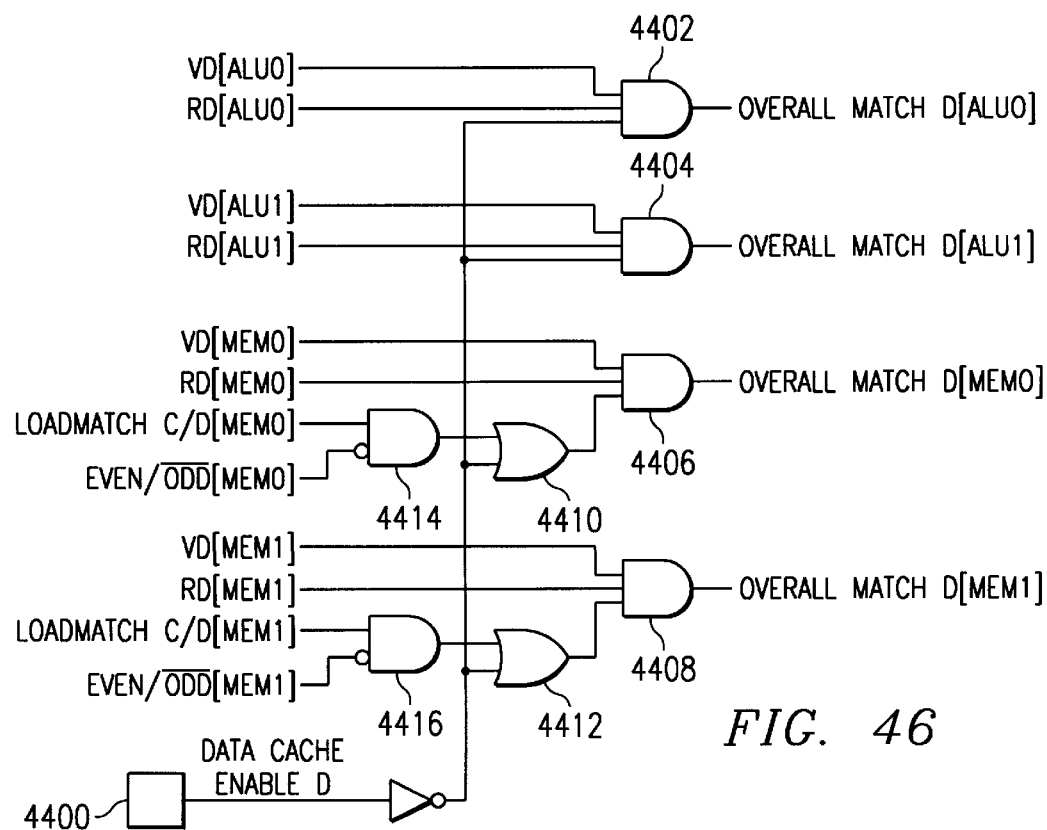
FIG. 46 is a block diagram illustrating the overall match generator D shown in FIG. 42.

FIG. 46 illustrates overall match generator D in detail. As can be seen, its structure is completely analogous to that of overall match generator C. The difference is that overall match generator C is configured to derive its MEM[0] and MEM[1] match results from the LOAD_MATCH C/D comparison result of odd memory load instructions only (as opposed to even ones), by virtue of the inverted inputs on AND gates 4414 and 4416.

3.8 Off-chip Data Interface

Figure 47:
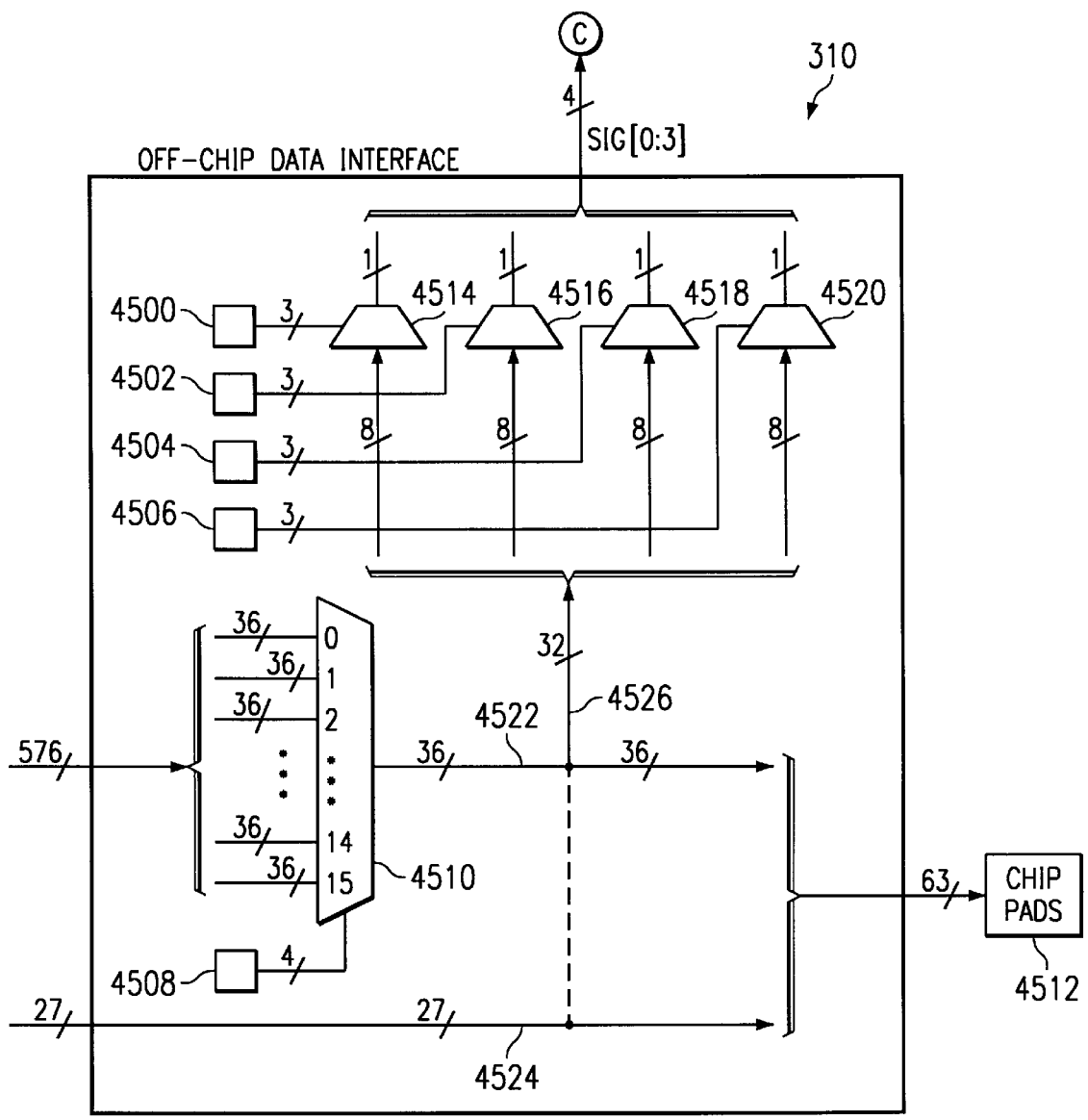
FIG. 47 is a block diagram illustrating the off-chip data interface shown in FIG. 5.

FIG. 47 illustrates the contents of off-chip data interface 310 in detail. It is contemplated that storage elements 4500–4508 would be included within off-chip data interface control register circuitry 350. Thus, storage elements 4500–4508 would be loaded with data by writing to off-chip data interface control register circuitry 350 using the method and apparatus described above in section 2.2. Five hundred and seventy-six test nodes from various points within microprocessor 100 are routed to the inputs of multiplexer 4510 in groups of 36. The programmer uses the value in storage element(s) 4508 to select which set of 36 test nodes will be coupled to chip pads 4512. In addition to the 36 signals so selected, 27 additional signals (preselected and fixed) are always routed to chip pads 4512, as shown, so as to be visible off-chip under all circumstances. Of the 36 selected signals 4522 and the 27 fixed signals 4524, 32 of them (4526) are routed to multiplexers 4514–4520 in four groups of eight, as shown. The programmer uses the values in storage elements 4500–4506 to select one bit from each of these four groups to be routed back to programmable state machine 302 at C.

Figure 48:
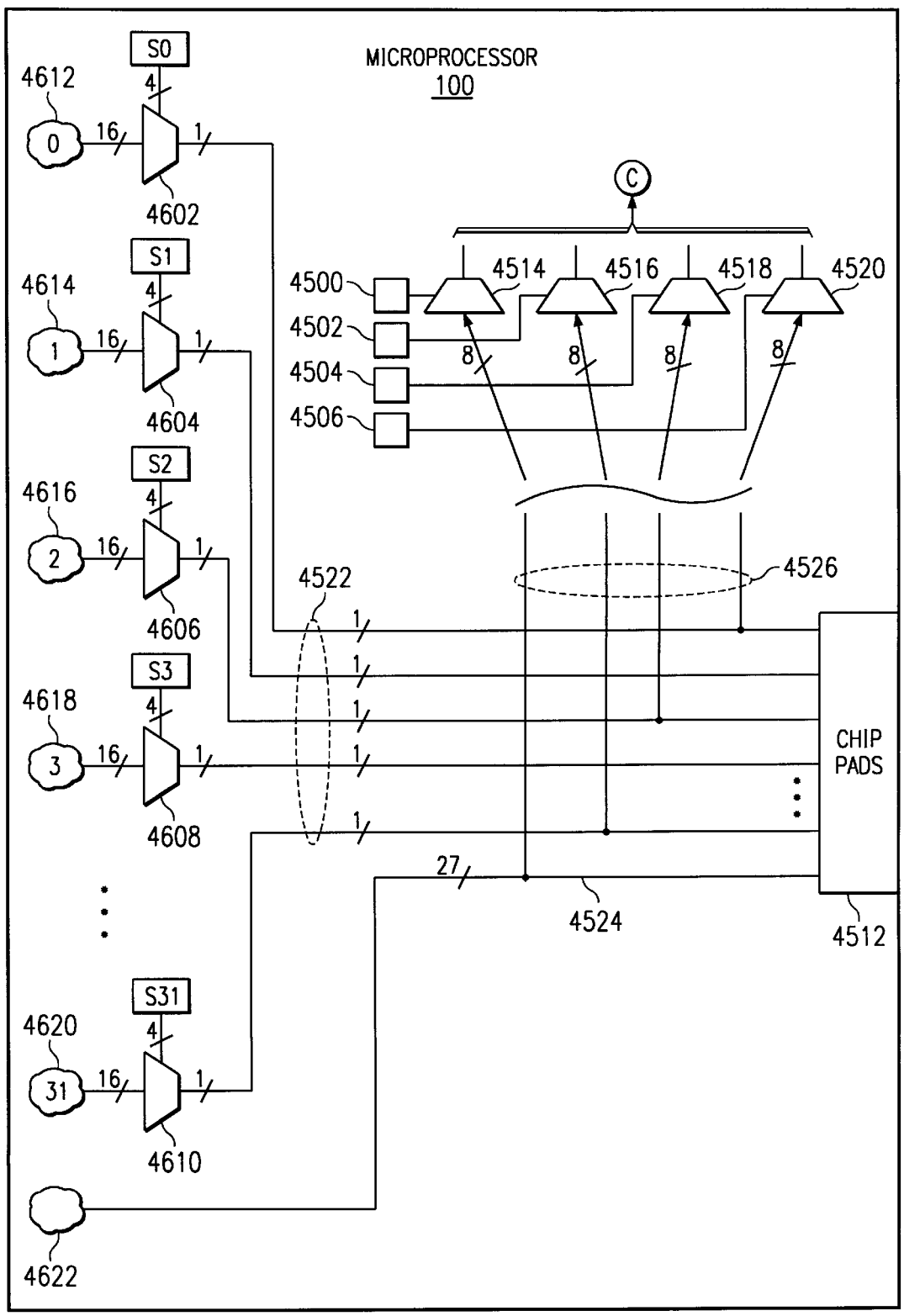
FIG. 48 is a block diagram illustrating a second preferred implementation of the functionality shown in FIG. 47.

FIG. 48 illustrates a second preferred implementation of the functionality just described. In the implementation of FIG. 48, multiplexer 4510 is replaced by 32 different 16:1 multiplexers, indicated generally in the drawing by multiplexers 4602–4610. The various 16:1 multiplexers are physically located at various remote locations around microprocessor 100. Each has its inputs coupled to a set of test nodes, indicated generally in the drawing at 4612–4620. Each has its select inputs coupled to storage elements, indicated generally in the drawing at S0–S31. The outputs of the 16:1 multiplexers comprise bus 4522. Bus 4524 is coupled to 27 fixed nodes 4622. Preferably, fixed nodes 4622 are chosen as those nodes that a programmer would most likely want to see at chip pads 4512 under all circumstances. For example, fixed nodes 4622 may correspond to the minimum set of signals from which the state of microprocessor 100 can be reconstructed by external equipment. It is further contemplated that storage elements S0–S31 would either be included within off-chip data interface control register circuitry 350, or would constitue a new set of control registers that may be coupled into the serial loop of control registers 344–354. In yet another variation, the same four bits 4508 may be used as select inputs for each of the 16:1 multiplexers throughout the chip. One advantage of the implementation of FIG. 48 is that, by multiplexing closer to the test nodes, fewer interconnect traces need to be run across the chip to multiplexers 4514–4520 and to chip pads 4512.

In yet another preferred embodiment, any combination of storage elements 4500–4508 and S0–S31 may be implemented as latches whose inputs are coupled to state machine output bus 1118. In this manner, the selection of which signals are routed to chip pads 4512 and to state machine inputs C may be changed automatically and "on the fly" by state machine 302 in response to user-defined events having occurred.

4. The BIST Engine

The BIST engine of the present invention improves upon previous BIST design and methodology by adapting desirable features characteristic of DAT external testers for high-speed on-chip memory array structures. At-speed, flexible on-chip testing of the memory arrays is provided, an advantage not typically offered by DAT because of the large bandwidth required by today's on-chip memory arrays. The DAT requirement for external tester equipment to test the memory array is thereby eliminated, obviating the need for expensive external test resources. The present invention provides full access to, and monitoring of, on-chip memory arrays as well. The BIST engine of the present invention is illustrated in FIGS. 49–55 as described below.

The BIST engine resides at the interface between the instruction or data caches 102,104 and the rest of microprocessor 100, as shown in FIG. 5. In the particular implementation of FIG. 5, each cache has its own BIST engine but it is noted that one BIST engine may service both the instruction and data caches if so desired. Control of the BIST engine is accomplished through several physically separate local control blocks, called address local control blocks (ALCs) and data local control blocks (DLCs), of address generation blocks (AGBs) and data generation blocks (DGBs), respectively, that are in turn controlled by one BIST main or global control block (BMC), with each local control block having its own instruction control register to control the operation of one or more associated data registers. Flexibility in test vector generation is provided by programming the BIST engine through privileged CPU read and write instructions, or through a dedicated interface to the BMC like a serial JTAG TAP interface. A distributed programming model is used for the BIST engine to reduce the number of signals and simplify the control logic required for test vector generation. All programming of the BIST engine is therefore accomplished through reading and writing to and from various BIST registers within the BIST engine, whether via the interface from the BMC to the AGBs and DGBs or by interfacing with the CPU.

A BIST program is generated by independently programming each of the local control blocks to define the operations to take place in the individual data blocks controlled by the local control blocks. The term "independently" is meant to denote that the ALC and DCL local control blocks may be programmed to perform unrelated functions and may be programmed separately, independently, and in any order with respect to each other; the ALC blocks do not necessarily have to be programmed prior to the DLC blocks, for instance. After the local control blocks are programmed, the BMC is then programmed by either the dedicated interface to the BMC, shown as 5122 of FIG. 49, or by the CPU and is used to coordinate when the local control blocks are to start and stop executing their programmed instructions and to provide an interface to the CPU core. If desired, the BMC can be programmed by privileged CPU instructions to ensure that BIST engine operation is launched synchronously with the CPU core of the integrated circuit chip. If the BMC is programmed by dedicated interface 5122 it would operate independently of the other, non-BIST engine and non-memory array circuitry of the chip, such as the CPU core, thereby allowing the BIST engine and on-chip memory arrays to be tested and monitored even when the CPU core is not operational.

The BIST engine is programmed using a remote diagnose register (RDR) approach or other programming methodology. In the case of RDR programming, all BIST registers utilize a staging register that provides non-destructive reads and single-cycle updates for RDR writes, even for registers, such as multiple-input-shift-registers (MISRs), that require multiple diagnose shift operations. In this manner, non-intrusive read or write access is available for all address and data patterns, signature analysis MISR registers, redundancy registers, and control for local programming of the AGB and DGB blocks.

4.1 A basic BIST Engine Implementation

Figure 49:
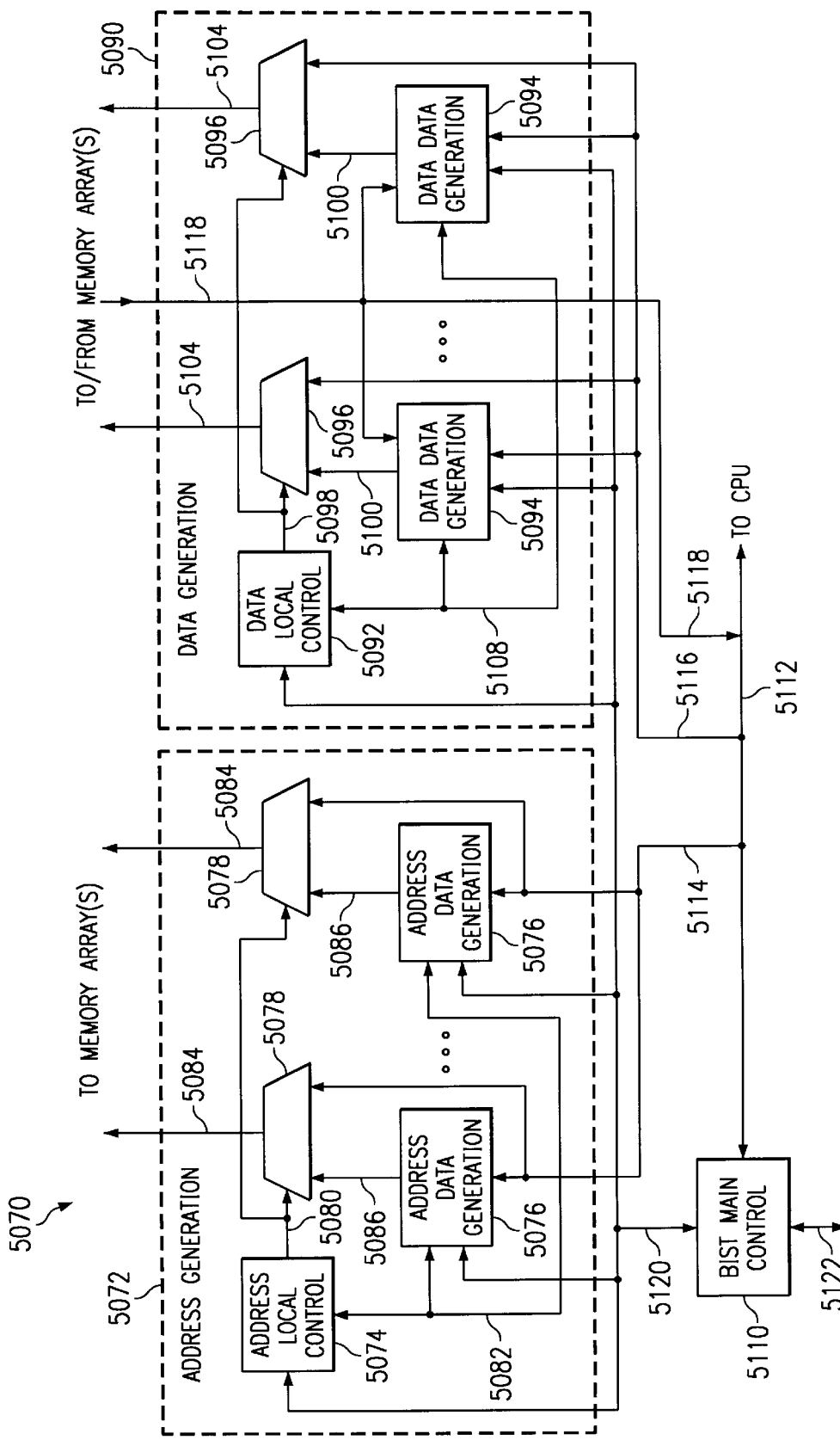
FIG. 49 illustrates a high-level block diagram of a BIST engine, according to the present invention.
Figure 55:
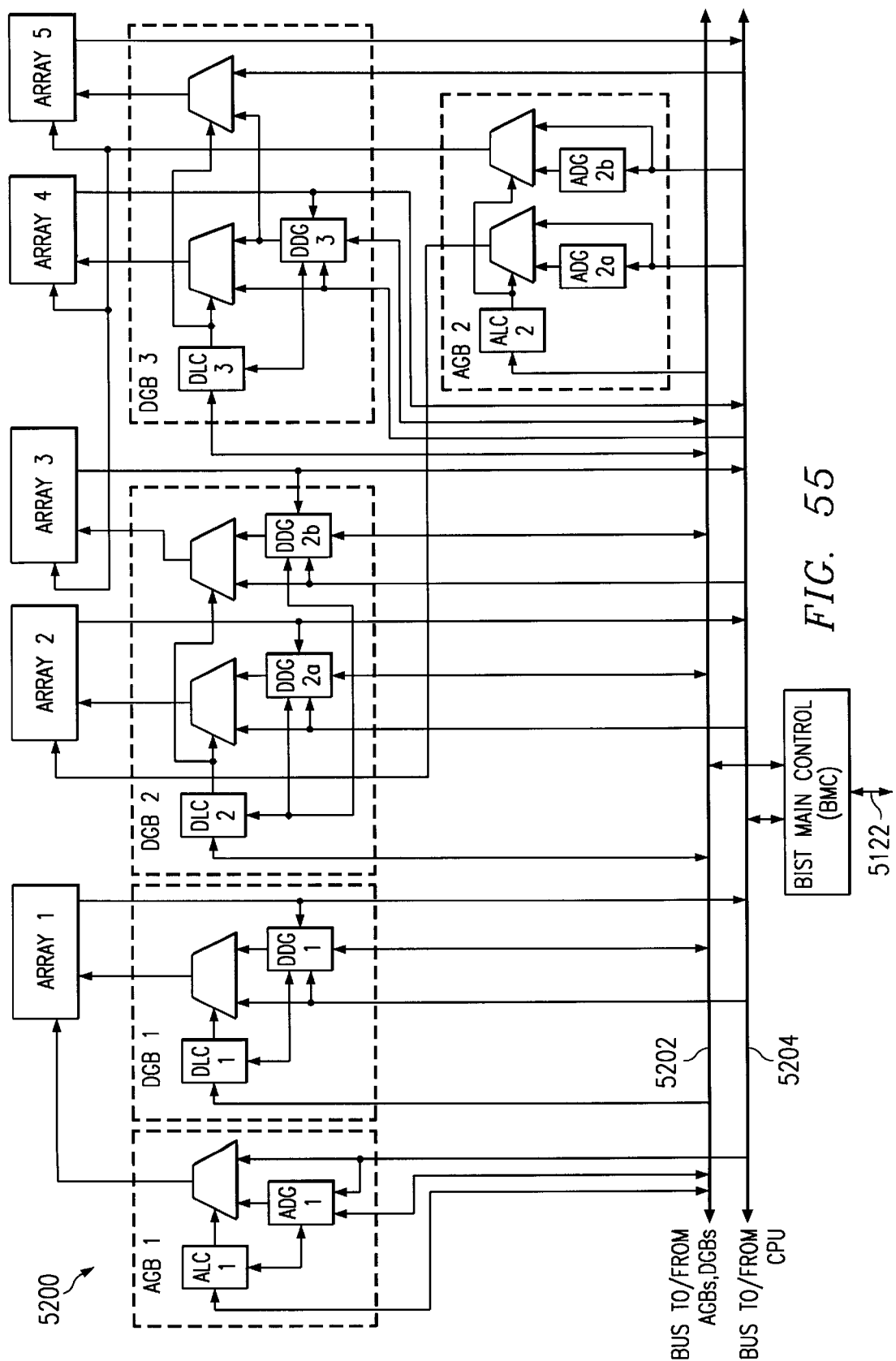
FIG. 55 illustrates several possible implementations of a BIST engine, according to the present invention.

Referring now to FIG. 49, a high-level block diagram of a BIST engine 5070 according to the present invention is shown. This figure represents the most basic BIST engine configuration; FIG. 55 expands upon FIG. 49 by showing various possible BIST engine configurations that are in keeping with the basic configuration of FIG. 49. As shown in FIG. 49, each BIST engine 5070 according to the present invention has one BIST main control block (BMC) 5110, at least one address generation block (AGB) 5072 having one address local control block (ALC) 5074 and one or more address-data generation blocks (ADG) 5076, and at least one data generation block (DGB) 5090 having one data local control block (DLC) 5092 and one or more data—data generation blocks (DDG) 5094. Each of the local control blocks ALC 5074 and DLC 5092 is independently programmed to define the operations that will be performed by the individual data blocks 5076 and 5094, respectively. BMC 5110 is then programmed, via dedicated interface 5122 or by the CPU over bus 5112, to coordinate the operation of the local control blocks ALC 5074, DLC 5092 and to communicate with the rest of the on-chip circuitry; herein lies the flexibility of the invention. Logic inside BMC 5110 selects either interface 5112 or 5122. Dedicated interface 5112 may be any interface, either serial or parallel; a serial interface, such as the JTAG TAP serial interface, is an inexpensive and reliable choice.

Each AGB 5072 of the BIST engine has ALC block 5074 that controls the operations of the one or more individual data blocks ADG 5076 via bus 5082. BMC 5110 may receive privileged CPU instructions from the CPU via bus 5112 that are provided to ALC block 5074 to control the ADG blocks 5076. ALC 5074 controls the multiplexer 78 associated with each ADG block 5076 via bus 5080 to chose address data from ADG block 5076 on bus 5086 or directly from the CPU on bus 5114. Array address bus 5084 provides the generated address data to one or more on-chip memory arrays. Similarly, each DGB 5090 of a BIST engine has one DLC block 5092 that controls one or more DDG blocks 5094 via bus 5108 to allow parallel access and monitoring capabilities simultaneously to all on-chip memory arrays connected to the BIST engine 5070. DLC block 5092, via bus 5098 to the one or more multiplexers 5096, decides whether to provide data from the one or more DDG blocks 5100 or from the CPU via bus 5116 to one or more on-chip memory arrays on bus 5104. Multiplexer(s) 5096 accordingly provide data from DGB 5090 to the one or more arrays. Unlike AGB 5072, the one or more DDG blocks 5094 of DGB 5090 additionally receive data from the one or more on-chip memory arrays via bus 5118; Bus 5118 additionally provides this data to the CPU.

Each AGB 5072 has an address control register and a queue consisting of general-purpose and special-purpose address-data registers. ALC 5074 has the address control register and each ADG 5076 contains the general- and special-purpose registers. ALC 5074 is programmed through the address control register that dictates how the data registers of one or more ADG blocks 5076 source addresses (bus 5086) to the one or more memory arrays or monitor the CPU-generated addresses of bus 5114.

ADGs 5076 contain the address queue consisting of address-data registers that are each at least as wide as the array's address and that are programmed to source or monitor addresses to the on-chip memory arrays and are connected to apply sequences of addresses to the on-chip memory arrays without involving the CPU in any way. Some of the data registers are special-purpose registers, such as a multiple-input-shift-register (MISR), counters and linear feedback shift registers (LFSRs), that may be selectively disabled to operate as general-purpose registers if desired.

The MISR is capable of performing signature analysis by recording and compressing a sequence of CPU-issued or BIST engine-generated addresses. The MISR compresses a data sequence on a bus into a single "signature" through a process of XORing and shifting new data with current data. The resulting digital signature is nearly unique for a given data sequence over time. This signature is used to identify an error or fault. If an error or fault occurs, the signature will not match the expected value. The signature analysis methodology is especially useful for performing extended memory array characterization using random sequences and for monitoring the critical memory array-CPU core interface 5112 during CPU core testing.

4.2 The address Generation Block (AGB)

Figure 50:
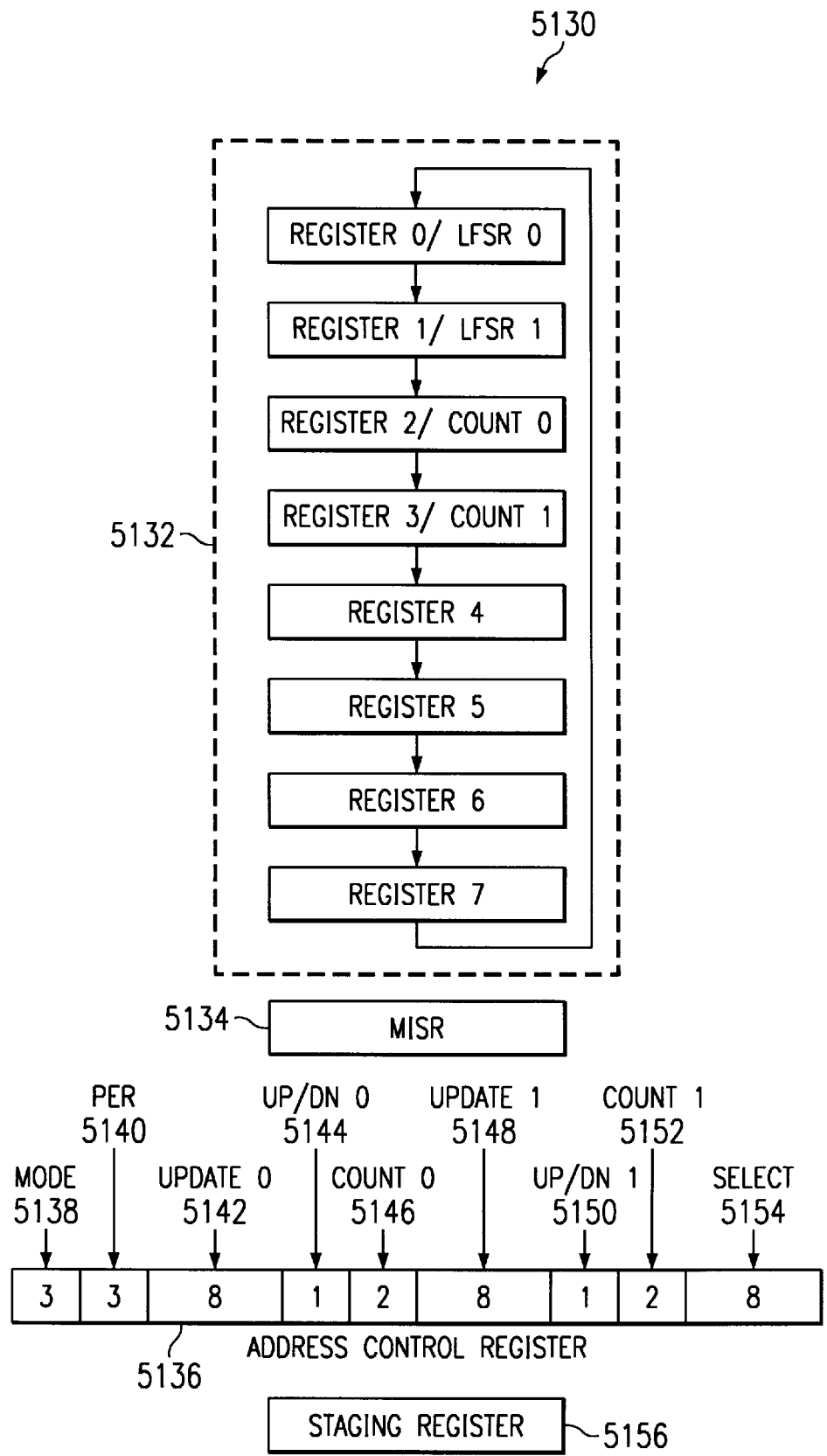
FIG. 50 illustrates an address generation block, according to the present invention.

FIG. 50 provides an example of how a sample address generation block might be configured. In this example, the address block of AGB 5072 is shown as having eight address-data registers 5132, MISR 5134, and address control register 5136. Four of the eight registers 5132 are special purpose registers; Register 0 is a first LFSR register, Register 1 is a second LFSR register, Register 2 is a first counter register, and Register 3 is a second counter register. One will recognize that any number or type of special function registers may be used in the address block. All of the registers shown in FIG. 50 utilize staging register 5156 to program them.

Address control register 5136 is 36 bits long in this example and is made up of several fields that both determine the mode of operation of the address block 5072 as a whole and control the operation of the individual special function registers: LFSR 0, LFSR 1, Count 0, Count 1. The first field 5138 of address control register 5136 is the mode of AGB 5072, made up of three control bits in this example. There are several types of modes appropriate to an address block, including the following: generate addresses from a single register of registers 5132, generate addresses by ping-ponging between two registers of registers 5132, generate addresses by looping through some or all of the eight registers 5132, and record addresses arriving from the CPU via bus 5114 in registers 5132 or MISR 5134. The last mode of recording addresses from the CPU is used to test functionality outside the memory array.

In addition to the mode field, it can be seen that there are various fields 5142, 5144, 5146, 5148, 5150, and 5152, of address control register 5136 that allow control of the special function registers of this example. For the LFSR 0, LFSR 1, Count 0, and Count 1 registers, these fields control the following functions: enable special counting modes or disable counting so that the LFSR and counter registers behave as general purpose registers (fields 5146, 5152), increment or decrement counting (fields 5144, 5150), independently control each special function register (fields 5142, 5148), and control when each special function register is updated (fields 5142, 5148).

Figure 51:
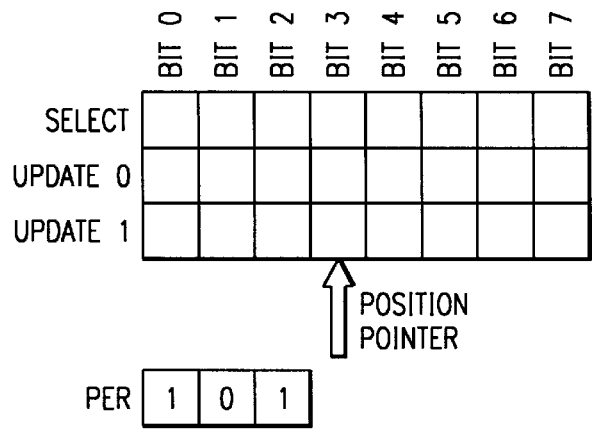
FIG. 51 illustrates an example of updating a special function register, according to the present invention.

FIG. 51 illustrates an example of how updating a special function register might be controlled. The position pointer is initialized to index zero and is then incremented each clock cycle. If the bit in the update field indicated by the position pointer is a high logic state ("1"), then the special function register that is associated with that update field is updated. The period field ("per") 5140 controls the number of clock cycles that occur before the position pointer returns to index zero and repeats the above-described sequence. In this example, the maximum sequence length is eight.

The source of the memory address at each clock cycle is determined by the mode field 5138 and the select field 5154. The mode field 5138 designates the registers as potential sources of the memory address to the one or more on-chip memory arrays. For instance, mode 0 selects the LFSR 0 and LFSR 1 registers, mode 1 selects the LFSR 0 and Count 1 registers, and mode 2 selects the two counters registers Count 0 and Count 1. The select field 5154, also eight bits wide in this example, chooses between the two registers designated as potential address sources by the mode field 5138 and is indexed by the position pointer shown and described in conjunction with FIG. 51, above.

Data Generation Block 5090 is similar to AGB 5072 in that it also consists of a data control register, data registers and a MISR. It additionally consists of a read/write register and compare logic. It is noted that the read/write register could alternatively be located in AGB 5072. The data control register is contained within DLC block 5092 while the other registers and logic are contained within each DDG block 5094. The data block dictates how the one or more DDG blocks 5094 source data values to the on-chip memory arrays or monitor CPU- or memory array-generated values.

Like the AGB, DLC block 5092 of DGB 5090 is programmed through the data control register that determines whether the one or more DDG blocks 5094 source the data presented to the one or more on-chip memory arrays via busses 5104 or simply monitors the CPU- or memory array-generated data via buses 5116 and 5118, as shown. Each DDG block 5094 contains registers used to source or monitor data values. The DDG registers can be connected to form a data queue that applies sequences of data, of any size, to the one or more memory arrays without involving the CPU, if desired. These registers, some of which are special function registers that can be selectively disabled to operate as general registers, can be accessed through CPU instructions.

The MISR of DGB 5090 operates in much the same way as the MISR of AGB 5072 described above. It is typically the same length as the other data registers of DGB 5090 and could monitor both read and write data. The MISR records and compresses data coming out of the memory array(s). When enabled, the MISR register can be checked after a test has been performed to determine whether a failure occurred during that test.

4.3 The data Eeneration Block (DGB)

Figure 52:
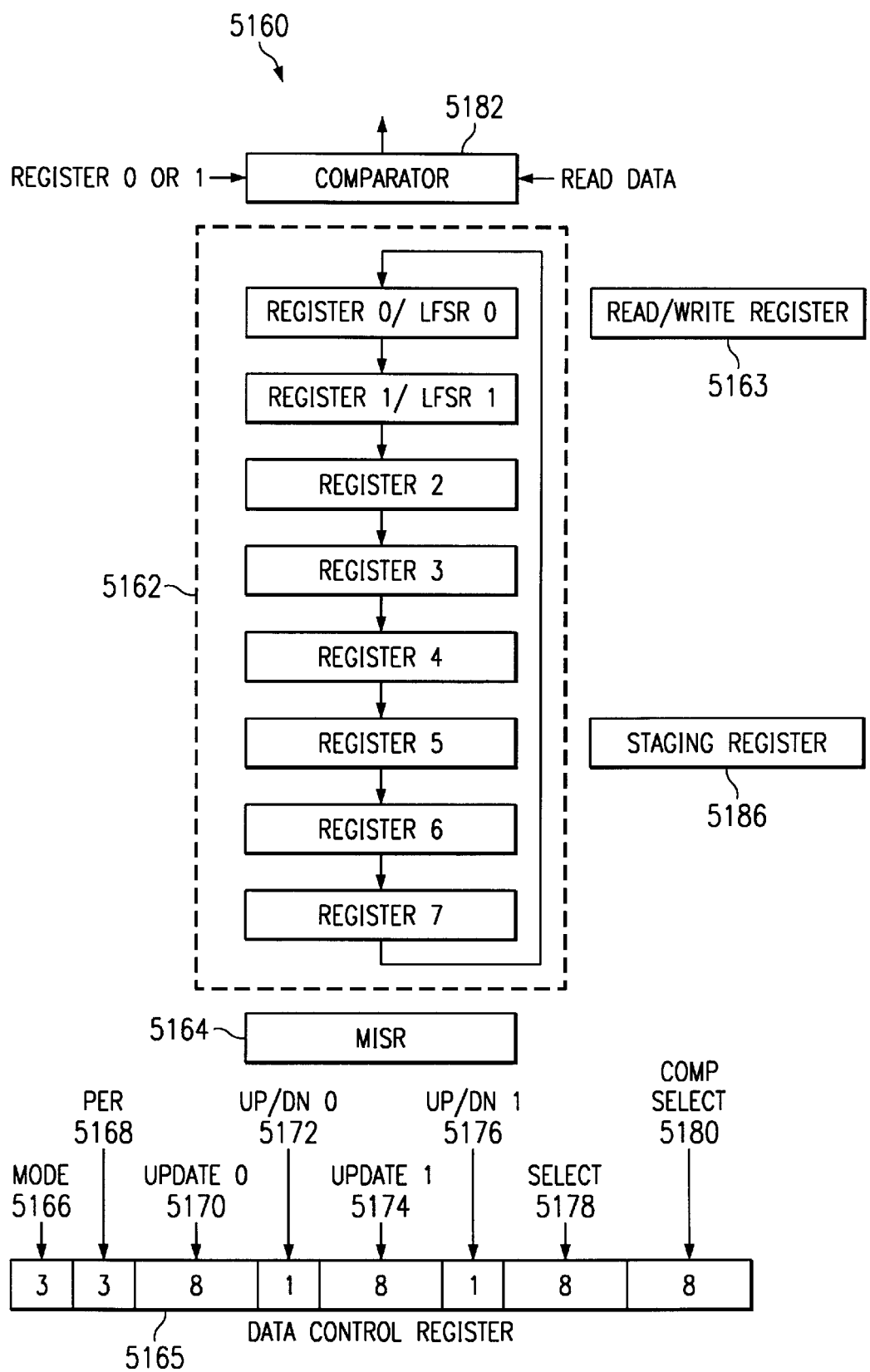
FIG. 52 illustrates a data generation block, according to the present invention.

FIG. 52 provides an example of how a sample data generation block might be configured. In this example, the data block of DGB 5090 is shown as having eight registers 5162, read/write register 5163, MISR 5164, data control register 5165, and comparator 5182. Two of the eight registers 5162 are special purpose registers; Register 0 is a first LFSR register and Register 1 is a second LFSR register. LFSR 0 and LSFR 1 are special function registers that can function as reversible LSFRs or as inputs to comparator 5182, as shown. One will recognize that any number of registers or types of special function registers may be used in the data block. In this example, data registers 5162, MISR 5164, and comparator 5182 are each as wide as the memory array to which they are coupled. All of the registers shown in FIG. 52 utilize staging register 5186 to program them.

Like address control register 5136, data control register 5165 of DLC 5092 directs the operation of the general-and special-purpose data registers of the DDG blocks 5094. In this example, data control register 5165 is 40 bits long and is made up of several fields that both determine the mode of operation of the DGB 5090 as a whole and control the operation of the individual special function registers: LFSR 0 and LFSR 1. The first field 5166 of address control register 5165 is the mode of DGB 5090, made up of three control bits in this example. There are several types of modes appropriate to a data block, including the following: generate data by ping-ponging between two registers of registers 5162, generate data by looping through some or all of the eight registers 5162, record data read out of the memory array in the registers 5162 or MISR 5164 so that the memory array as well as the CPU is tested, or some combination of the first two modes in which data from DGB 5090 is written to the memory array and data read out of the memory array is saved. In this combination mode, the data registers 5162 are configured like a first-in-first-out (FIFO) device with read data entering the FIFO as write data is exiting.

In addition to the mode field, data control register 5165 contains fields 5170, 5172, 5174, 5176, 5178, and 5180 that control the following functions: disable counting so that the LFSR registers are treated as general purpose registers and control when each special function register is updated (fields 5170, 5174), increment or decrement the LFSRs (fields 5172, 5176), and use the value of a special function register as an input to comparator 5182 (field 5180). A combination of the select field 5178 and mode field 5166 determines which register is used to source data to the on-chip memory arrays.

The read/write register 5163, like the update and select fields, is eight bits long and may be indexed by the position pointer shown in FIG. 51 above. Each bit of the read/write register is a read/write bit that determines whether a read or a write operation from/to the memory array will be performed when that bit is referenced by the position pointer.

The special function registers in the data block are selected and updated in the same manner as the special function registers of the address block. MISR 5164 monitors both read and write data, and may be implemented to prioritize write data monitoring over read data monitoring and to monitor the write data bus on cycles when neither write nor read data are valid. During all BIST engine operations, the BIST write-enable patterns are used to determine MISR updates, as will be described below in conjunction with the discussion on BMC 5110, that only occur during BIST engine operations. CPU-generated write-enable patterns can be used to determine MISR updates when it is desired to monitor the CPU. Comparator select field 180 determines the source of one of two comparator inputs- LFSR 0 or LFSR 1; the other comparator input is provided by the data that has just been read from the array. The fields of data control register 5165, then, allow data just read from the array to be immediately compared to an expected value stored in the selected LFSR.

4.4 BIST Main Control (BMC)

As previously mentioned, BMC 5110 controls when all local control blocks ALC 5074 and DLC 5092 start and stop their programmed operations. BMC 5110 also coordinates the MISR updates, provides an interface to on-chip debug hardware for sampling/monitoring the address and data busses, and controls the signature analysis provided by the MISRs of the ADG blocks 5076 and the DDG blocks 5094.

The bit-compare results generated by the compare logic 5182, 5184 of DDG blocks 5094 are received by BMC 5110 which can cause the current operations by the ADG blocks 5076 and the DDG blocks 5094 to be aborted or paused through proper control of the local control blocks ALC 5074 and DLC 5092, respectively.

The BIST engine program execution is initiated when an instruction is stored into the main control instruction register of the BMC 5110. Programming of the main control instruction register of BMC 5110 launches the BIST engine operation synchronously with the CPU core, when BMC 5110 is programmed with CPU privileged instructions, so that read and write operations of the other BIST registers contained within AGB 5072 and DGB 5090 does not initiate BIST operations. Alternately, programming BMC 5110 via dedicated JTAG TAP interface 5122 provides for operation of the BIST engine and memory arrays independently of the CPU. The synchronized BIST engine/CPU interface is further reflected in that BIST engine operation appears as an extended diagnose shift operation to the CPU. CPU-generated memory array access requests are generally ignored during BIST operations. When the BIST operation is complete, the instruction retires.

Figure 53:
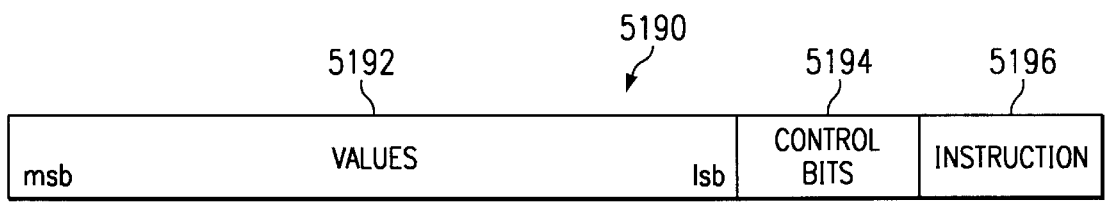
FIG. 53 illustrates a main BIST control instruction register, according to the present invention.

Referring now to FIG. 53, an example of how the main BIST control instruction register 5190 of BMC 5110 might be configured is illustrated. Field 5192 contains a predetermined number of bits representative of data. Field 5194 contains control bits and field 5196 contains the instruction to be programmed into the control register 5190. All of the instructions 5196 that are stored in control instruction register 5190 require that programming of local control blocks 5074 and 5092 must occur before control instruction register 5190 can initiate BIST engine operation.

There are many types of control bits that might be stored in field 5194. The following are but a few of the types of control that might be required of the main BIST control instruction register 5190 and, of course, other types of control bits might be added as required. A MISR enable control bit would enable the signature analysis performed by MISR registers 5134 and 5164. A MISR start/stop bit would control when updates of MISR registers 5134 and 5164 are started and stopped. A parity control bit would stop the BIST program in the event of any parity error. The system designer has the flexibility to include any controls bits that might be relevant to a particular BIST engine environment.

The bits of field 5196 represent the various instructions that may be programmed into the BIST engine 5070. Examples of relevant instructions include the following: an instruction to clear write enables of AGB 5072 and DGB 5090 by forcing them to a write condition and then executing the local program for a given number of clock cycles, an instruction to execute the local BIST program of AGB 5072 and DGB 5090 for the given number of clock cycles and while performing MISR update operations, an instruction to execute local BIST programs until a new instruction 5196 is issued to AGB 5072 and DGB 5090-this instruction is useful for monitoring and debugging the memory array being tested, and a null instruction to stop all local BIST programs and to also enable and start/stop MISR update operations.

4.5 Sample BIST Engine Implementations

Figure 54:
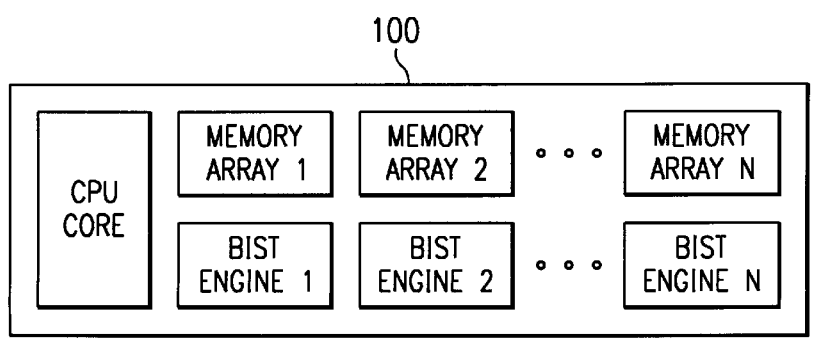
FIG. 54 illustrates a plurality of BIST engines for a chip having a plurality of memory arrays, according to the present invention.

As shown above, each BIST engine of the present invention features one BMC, one or more AGBs, and one or more DGBs. How each BIST engine is configured is entirely flexible and is a function of the manner in which the chip designer wishes to access, test, and monitor the activities of on-chip memory arrays. The distributed programming and control, model described allows for the implementation to be flexible. There may be single or multiple independent BIST engines on a single integrated circuit chip; FIG. 54, for example, illustrates a microprocessor chip 100 having N BIST engines on-chip-one for each of N on-chip memory arrays or memory array groups having one or more memory arrays of the same or different sizes. Within each engine, the AGB 5072 and DGB 5090 may be replicated for multiple arrays of varying or equal sizes. For some arrays, the BIST engine may have separate AGB and DGB blocks for each on-chip array, or AGB and DBG blocks common to two or more on-chip memory arrays, or some combination thereof. For instance, two or more on-chip memory arrays may share a common ADG block but have separate DGB blocks unique to each memory array. In any of these schemes in which there is more than one memory array, a major advantage of the present invention is that the memory arrays may be of the same or differing sizes.

Referring to FIG. 55, several examples of BIST engine configurations are illustrated. First, the figure illustrates multiple memory arrays 1, 2, 3, 4, 5 being tested by one BIST engine comprised of the BMC, first AGB1, first DGB1, second AGB2, second DGB2, and third DGB3. Second, AGB1, DGB1, and Array 1 illustrate a separate AGB and DGB for a single on-chip memory array. Third, AGB2 illustrates an AGB having multiple ADGs, AGD2*a* and ADG2*b*, that test multiple arrays, Array 2, Array 3, Array 4, and Array 5. Fourth, ADG2*b* of AGB2 illustrates a single ADG shared by multiple arrays of different sizes; as can be seen, Array 4 and Array 5 are physically smaller than Array 3. DGB2 illustrates a DGB with multiple DDGs, DDG2*a* and DDG2*b*, that test multiple on-chip memory arrays Array 2 and Array 3. Fifth, DGB3 illustrates a single DGB shared by multiple arrays Array 4 and Array 5. Finally, in all of these examples, it is important to note that the AGBs and DGBs are physically and functionally independent from each other as shown.

Testing of a particular memory array is provided independent of any other on-chip array and the majority of other on-chip, non-BIST engine circuitry, such as CPU core logic, through the serial interface 5122. The ability to independently test any particular memory array independently of the CPU core, for example, is especially useful since characterizing or accessing the array is not hindered by a non-functional or hung CPU. Thus, while the complexity and flexibility of the BIST engine of the present invention does add overhead to the chip in terms of layout area and power dissipation this investment is justified by being able to perform advanced characterization of one or more memory arrays of a VLSI chip independent of other circuitry on the chip.

The BIST engine of the present invention provides, the important advantages of full access, comprehensive testing of on-chip memory arrays, and monitoring capabilities. Due to the full memory array access through the BIST engine afforded by the present invention, the BIST engine provides unprecedented flexibility in test vector generation so that large, on-chip memory arrays may be comprehensively and meaningfully tested and characterized. This flexibility is essential as critical sensitivities of the array are impossible to predict. The flexibility of the BIST engine provides for each on-chip memory array to be tested for manufacturing defects, undesirable electrical effects, and device performance with respect to voltage, temperature, process, frequency, and other testing parameters. The simple, reliable, and inexpensive serial interface 5122 to the BMC supports this flexibility. Full access to the memory arrays reduces test time requirements.

5. Interface Between the Debug Block and the BIST Engine

As can be seen in FIG. 5, both BIST engines 150 and 160 are provided with sample-on-the-fly (SOF) control signal I and MISR control signal K generated by CPU interface 308. Signals I and K are the interface between the debug hardware and the BIST engines. The BIST engines can have two different structures that monitor all reads and writes to and from the cache. The first structure is a recording element, such as a first-in-first-out (FIFO), that records a predetermined number of reads and writes to and from the cache 102, 104. The second structure is a signature analysis element, like the MISR previously discussed, that also monitors reads and writes to and from the cache 102, 104 and combines each successive read or write into its current signature. The I and K signals control the BIST engines to achieve two important objectives of the present invention: to debug and to test microprocessor 100. Alternately, as will be described, these signals can be used to debug and test microprocessor 100 without going through the BIST engines.

The interface between the BIST engine(s) and the debug block can greatly facilitate debugging and test coverage of the microprocessor. When a failure occurs in microprocessor 100, it is not easy to pinpoint when the failure occurred. Looking at the input and output signals of caches 102 and 104 can often provide a clue as to where the microprocessor went astray. Since the MISR keeps a signature of all preceding inputs and outputs of caches 102, 104, comparing the MISR's value, its signature, to an expected value or signature at various points in the execution of a failing code sequence can pinpoint the first difference between a passing case and a failing case. Once the failure region has thus been narrowed down, looking at the actual input and output signals of the cache, rather than the signature, around the point of failure is extremely helpful and this is typically accomplished by one or more FIFOs.

In addition to debugging, another important issue for microprocessors is test coverage. When the microprocessor is tested for defects that might have occurred in fabrication, better coverage means that fewer parts have to be scrapped later. As microprocessors have become more complex, it has been ever more difficult to provide adequate test coverage with a short suite of tests. The present invention provides adequate test coverage by taking a signature of many internal signals, cache inputs and outputs in this embodiment, over a period of many cycles. The signature can then be read and compared with the expected value. If the values do not match, the microprocessor is not a good part. In this way, the present invention operates to substantially increase test coverage.

5.1 Signature Analysis using the MISR Control Signal K

The K control signal from the debug block allows the debug hardware to control when a MISR of the microprocessor updates, thereby enabling signature analysis for arbitrary sections of code. The K control signal generated by CPU core interface 308 can be used to control signature analysis of microprocessor 100 in at least two ways. First, it can control when a MISR of a BIST engine, such as BIST engine 150 or BIST engine 160, updates the signature with the information that it records so that the signature of the information sequence is available. As described above, the MISR combines each successive read or write into its current signature to create a new signature. This signature is used to identify an error or fault. If an error or fault occurs, the signature will not match the expected value.

MISR control signal K controls a BIST MISR register to update by controlling one or more of the control bits 5194 of main BIST control register 5190, shown in FIG. 53. Examples of relevant control bits 5194 include a MISR enable bit and/or a start/stop MISR update bit. MISR control signal K is manipulated in order to control one or more relevant control bits 5194 so as to be able to selectively control when the MISR being controlled performs its updating function.

Figure 56:
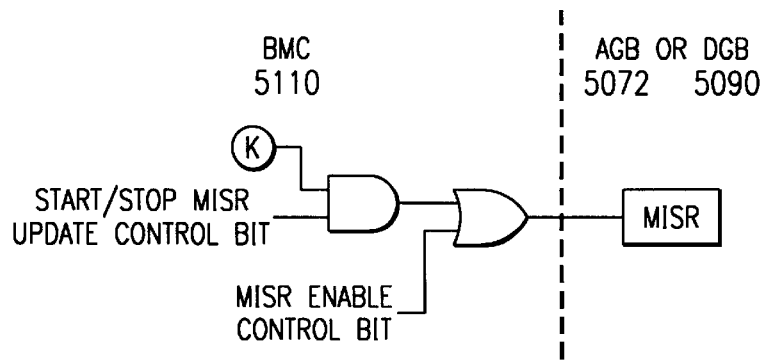
FIG. 56 illustrates the use a debug block-generated control signal to control signature analysis performed by a MISR in a first example, according to the present invention.

Referring now to FIG. 56, an example of how MISR control signal K can be used to control one or more of the control bits 5194 of main BIST control register 5190 is illustrated. As noted in the figure, the control logic is contained within BMC 5110 and the MISR can be a MISR capable of performing signature analysis performed in either the AGB 5072 or the DGB 5090 as described above. In this example, MISR control signal K and a first control bit of the control bits 5194 of main BIST control register 5190, a start/stop MISR update control bit, are input signals to the AND gate. The output signal of the AND gate and a second control bit of the control bits 5194, a MISR enable control bit, are input signals to the OR gate. The output of the OR gate thus selectively controls whether the MISR updates as a function of the two control bits shown. Such circuitry can of course be duplicated and modified as necessary to control as many BIST MISR as is required. Moreover, the MISR block can be representative of one or more MISRs of the BIST engine.

Using MISR control signal K in this manner to selectively control when a BIST MISR updates offers the advantage of always being able to access the signature analysis capabilities of the MISR, even when the debug block is not operational.

Figure 57:
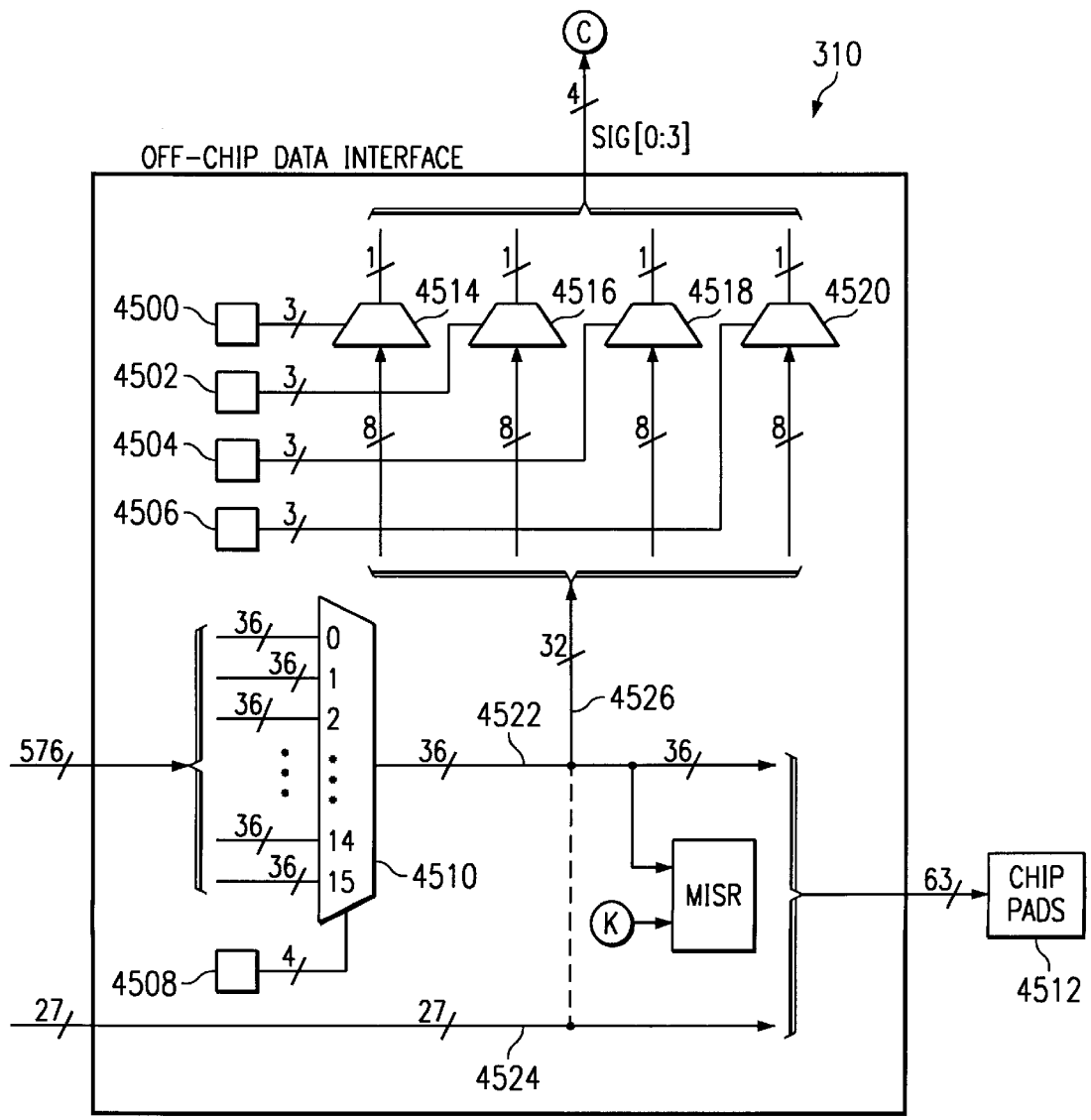
FIG. 57 illustrates the use a debug block-generated control signal to control signature analysis performed by a MISR in a second example, according to the present invention.

Second, in addition to controlling the MISRs of the BIST engine, the K control signal can be used to ensure that signature analysis may be performed on any arbitrary set of signals anywhere on the microprocessor chip. FIG. 57 provides an example of this capability. In this example, thirty-six selected signals 4522 are received and recorded by the MISR. The MISR updates its signature when it is controlled to update by the K control signal. It is noted that the multiplexer 4510 is not necessary to perform the MISR operation.

Any number of MISRs may be distributed throughout microprocessor 100 and controlled by MISR control signal K to perform signature analysis of selected, arbitrary groups of signals in the manner shown.

The examples of both FIGS. 56 and 57 show how the K control signal selectively controls when a MISR will update, thereby enabling the signature analysis that has been performed for arbitrary sections of code. This is superior to the prior art approach of inserting an intrusive instruction in the code stream to stop the MISR at a particular place. The present invention removes the requirement for any added instructions and allows much more flexibility in when the MISR updates. This flexibility is particularly useful for debugging failures since signatures can be taken over various segments of the code and compared with known good signatures to determine where in the code sequence the problem is occurring.

In addition to flexibility, the MISR control signal K provides a measure of control not previously available. Since the debug block generates MISR control signal K, cycle-to-cycle control of signature analysis is a benefit that is realized. Any error that occurs can be more accurately pinpointed to the exact cycle when it occurred than was previously possible. This cycle-to-cycle control also allows signature analysis itself to be restricted to those few cycles in which the problem is repeatable, thereby providing a very fine resolution signature analysis.

5.2 Selectively Accessing Recorded Event Information using the SOF Control Signal I SOF control signal I controls one or more FIFOs of one or more BIST engines of the microprocessor to cause stop recording the input or output signals of the cache so that the contents of the FIFOs may be examined as described above. SOF control signal I is received by BMC 5110 which in turn generates an update signal that is received by the appropriate local control block, ALC 5074 or DLC 5092, to stop the operation of the FIFO. In addition to controlling FIFOs of the BIST engine, the SOF I control signal can be used to control any FIFOs of microprocessor 100, even those that are not located in the BIST engine.

In the case of an eight-deep FIFO queue, the last eight reads/writes are recorded based on an event in the chip. Previous implementations have not had this ability to selectively stop the FIFO operation. In addition, storing all the reads and writes is complicated because the reads and writes are pipelined. Thus, some cycles have both read data and write data, and others contain no valid data. Storing all the reads/writes is especially useful for debugging failures. Once all the reads/writes from the time around the failure have been captures in the FIFO, subsequent experiments to determine the problem can be confined to the caches, and do not require any complicated code sequences.

While the present invention has been described in detail in relation to a preferred embodiment thereof, the described embodiment has been presented by way of example and not by way of limitation. It will be understood by those skilled in the art that various changes may be made in the form and details of the described embodiment, resulting in equivalent embodiments that will remain within the scope of the appended claims.

What is claimed is:

1. A method of debugging and monitoring the performance of a microprocessor having a built-in-self-test (BIST) engine, comprising the steps of:

defining an event by configuring an on-chip state machine to detect when a combination of state machine inputs is asserted, said combination of state machine inputs corresponding to said event, wherein said event may occur at any time during operation of the microprocessor and wherein the combination of state machine inputs may be asserted at any place on the microprocessor;

defining an action to be taken when said event occurs by configuring said on-chip state machine to drive control information onto a state machine output bus when said event occurs, said control information corresponding to said action;

executing instructions on said microprocessor until said event occurs; and in response to said event occurring, controlling one or more monitor-and-debug elements of the microprocessor within the BIST engine with the control information to perform one or more monitor or debug operations.

2. The method of claim 1, wherein the one or more monitor or debug operations include performing a signature analysis operation on a plurality of signals by one or more signature analysis elements of the microprocessor that are controlled by the control information.

3. The method of claim 2, wherein the plurality of signals are a plurality of memory operation signals to or from one or more memory elements of the microprocessor.

4. The method of claim 2, wherein the one or more signature analysis elements are contained within one or more built-in-self-test (BIST) engines of the microprocessor.

5. The method of claim 4, wherein the control information controls one or more control bits of a main control register of each BIST engine of the one or more BIST engines that controls operation of the one or more signature analysis elements contained within the one or more BIST engines.

6. The method of claim 2, wherein the one or more signature analysis elements are one or more multiple-input-shift-registers of the microprocessor.

7. The method of claim 1, wherein the one or more monitor or debug operations include recording a plurality of signals by one or more recording elements of the microprocessor that are controlled by the control information.

8. The method of claim 7, wherein the plurality of signals are a plurality of memory operation signals to or from one or more memory elements of the microprocessor.

9. The method of claim 7, wherein the one or more recording elements are contained within one or more built-in-self-test (BIST) engines of the microprocessor.

10. The method of claim 9, wherein the control information controls one or more control bits of a main control register of each BIST engine of the one or more BIST engines that controls operation of the one or more recording elements contained within the one or more BIST engines.

11. The method of claim 7, wherein the one or more recording elements are one or more first-in-first-out (FIFO) devices of the microprocessor.

12. A method of debugging and monitoring the performance of a microprocessor, comprising the steps of:

defining an event by configuring an on-chip state machine to detect when a combination of state machine inputs is asserted, said combination of state machine inputs corresponding to said event, wherein said event may occur at any time during operation of the microprocessor and wherein the combination of state machine inputs may be asserted at any place on the microprocessor;

defining an action to be taken when said event occurs by configuring said on-chip state machine to drive control information onto a state machine output bus when said event occurs, said control information corresponding to said action;

executing instructions on said microprocessor until said event occurs; and in response to said event occurring, controlling one or more signature analysis elements of the microprocessor with the control information to perform signature analysis on a plurality of signals.

13. The method of claim 12, wherein the one or more signature analysis elements are one or more multiple-input-shift-registers of the microprocessor.

14. The method of claim 12, wherein the one or more signature analysis elements are contained within one or more built-in-self-test (BIST) engines of the microprocessor.

15. The method of claim 14, wherein the control information controls one or more control bits of a main control register of each BIST engine of the one or more BIST engines that controls operation of the one or more signature analysis elements contained within the one or more BIST engines.

16. The method of claim 12, wherein the plurality of signals are a plurality of memory operation signals to or from one or more memory elements of the microprocessor.

17. A method of debugging and monitoring the performance of a microprocessor, comprising the steps of:

defining an event by configuring an on-chip state machine to detect when a combination of state machine inputs is asserted, said combination of state machine inputs corresponding to said event, wherein said event may occur at any time during operation of the microprocessor and wherein the combination of state machine inputs may be asserted at any place on the microprocessor;

defining an action to be taken when said event occurs by configuring said on-chip state machine to drive control information onto a state machine output bus when said event occurs, said control information corresponding to said action;

executing instructions on said microprocessor until said event occurs; and in response to said event occurring, controlling one or more recording elements of the microprocessor with the control information to record a plurality of signals.

18. The method of claim 17, wherein the plurality of signals are a plurality of memory operation signals to or from one or more memory elements of the microprocessor.

19. The method of claim 17, wherein the one or more recording elements are contained within one or more built-in-self-test (BIST) engines of the microprocessor.

20. The method of claim 19, wherein the control information controls one or more control bits of a main control register of each BIST engine of the one or more BIST engines that controls operation of the one or more recording elements contained within the one or more BIST engines.

21. The method of claim 17, wherein the one or more recording elements are one or more first-in-first-out (FIFO) devices of the microprocessor.

22. Apparatus for debugging and monitoring the performance of a microprocessor, comprising:

one or more memory arrays of the microprocessor;

a debug block of the microprocessor coupled to the memory arrays that drives control information onto a state machine output bus in response to an event, wherein said event may occur at any time during operation of the microprocessor; and one or more built-in-self-test (BIST) engines of the microprocessor coupled to the debug block and the one or more memory arrays, wherein in response to the event occurring, the control information controls one or more monitor-and-debug elements of the one or more BIST engines to perform one or more monitor or debug operations.

23. The apparatus of claim 22, wherein the one or more monitor or debug operations include performing a signature analysis operation on a plurality of signals and the control information controls one or more signature analysis elements of the one or more BIST engines to perform signature analysis on the plurality of signals.

24. The apparatus of claim 23, wherein the plurality of signals are a plurality of memory operation signals to or from the one or more memory arrays.

25. The apparatus of claim 23, wherein each BIST engine of the one or more BIST engines comprises:

a main control block;

one or more programmable address generation blocks controlled by the main control block to selectively provide address information to one or more on-chip memory arrays, comprising:

an address local control block having an address control register; and one or more address-data blocks having a plurality of address-data registers controlled by the address control register to provide or monitor address information from either the one or more address generation blocks or a CPU of an integrated circuit device to one or more on-chip memory arrays to which the one or more address-data blocks are coupled in accordance with instructions programmed into the address control register; and one or more programmable data generation blocks controlled by the main control block to selectively provide and receive data information to and from the one or more on-chip memory arrays, comprising:

a data local control block having a data control register; and one or more data—data blocks having a plurality of data—data registers controlled by the data control register of the data local control block to provide or monitor data information from either the one or more data generation blocks or the CPU of the integrated circuit device to the one or more on-chip memory arrays to which the one or more data—data blocks are coupled in accordance with instructions programmed into the data control register and to receive information from the one or more on-chip memory arrays, wherein the main control block is programmed by programming a main control register of the main control block to coordinate when the one or more address generation blocks and the one or more data generation blocks execute their programming; and wherein the control information controls one or more control bits of the main control register of each BIST engine to control operation of the one or more signature analysis elements.

26. The apparatus of claim 25, wherein the one or more signature analysis elements are one or more of the one or more address-data registers or of the one or more data—data registers.

27. The apparatus of claim 26, wherein the one or more signature analysis elements are multiple-input-shift-registers.

28. The apparatus of claim 23, wherein the one or more signature analysis elements are one or more multiple-input-shift-registers of the microprocessor.

29. The apparatus of claim 22, wherein the one or more monitor or debug operations include recording a plurality of signals by one or more recording elements of the one or more BIST engines that are controlled by the control information.

30. The apparatus of claim 29, wherein the plurality of signals are a plurality of memory operation signals to or from one or more memory elements of the microprocessor.

31. The apparatus of claim 29, wherein each BIST engine of the one or more BIST engines comprises:

a main control block;

one or more programmable address generation blocks controlled by the main control block to selectively provide address information to one or more on-chip memory arrays, comprising:

an address local control block having an address control register; and one or more address-data blocks having a plurality of address-data registers controlled by the address control register to provide or monitor address information from either the one or more address generation blocks or a CPU of an integrated circuit device to one or more on-chip memory arrays to which the one or more address-data blocks are coupled in accordance with instructions programmed into the address control register; and one or more programmable data generation blocks controlled by the main control block to selectively provide and receive data information to and from the one or more on-chip memory arrays, comprising:
  a data local control block having a data control register; and
  one or more data—data blocks having a plurality of data—data registers controlled by the data control register of the data local control block to provide or monitor data information from either the one or more data generation blocks or the CPU of the integrated circuit device to the one or more on-chip memory arrays to which the one or more data—data blocks are coupled in accordance with instructions programmed into the data control register and to receive information from the one or more on-chip memory arrays,
  wherein the main control block is programmed by programming a main control register of the main control block to coordinate when the one or more address generation blocks and the one or more data generation blocks execute their programming; and
  wherein the control information controls the main control register of each BIST engine to control operation of the one or more recording elements.

32. The apparatus of claim 31, wherein the one or more recording elements are one or more of the one or more address-data registers or one or more of the one or more data—data registers.

33. The apparatus of claim 32, wherein the one or more recording elements are first-in-first-out (FIFO) registers.

34. The apparatus of claim 29, wherein the one or more recording elements are first-in-first-out (FIFO) registers of the microprocessor.

35. The apparatus of claim 22, wherein the debug block comprises:
  an on-chip state machine capable of being configured to detect when a combination of state machine inputs is asserted and to drive the control information onto a state machine output bus when said combination is detected;
  a plurality of signal sources having their outputs coupled to said state machine inputs, the outputs of said plural signal sources representing debug related and performance-related information about said microprocessor; and
  at least one on-chip output device coupled to said state machine output bus, said at least one on-chip output device for effecting, responsive to said control information, an action that will facilitate debugging and performance monitoring in said microprocessor.

\* \* \* \* \*

UNITED STATES PATENT AND TRADEMARK OFFICE
CERTIFICATE OF CORRECTION

PATENT NO. : 6,374,370 B1
DATED : April 16, 2002
INVENTOR(S) : John W. Bockhaus et al.

It is certified that error appears in the above-identified patent and that said Letters Patent is hereby corrected as shown below:

Column 1,
Lines 14, 20, 23 and 34, after "1996;" insert -- copending --
Line 17, after "Sep. 10, 1996;" insert -- copending --
Line 11, delete "1998," and insert therefor -- 1998; --
Line 11, after "1998;" insert -- copending --
Line 25, delete "1996," insert -- 1996; --
Line 25, after "Oct. 31, 1996;" insert -- copending --
Lines 28 and 31, after "Sep. 10, 1996;" insert -- copending --

Column 2,
Line 19, delete "berri" and insert therefor -- been --

Column 3,
Line 44, delete "portion.,even" and insert therefor -- portion, even --

Column 6,
Line 30, delete "control.register" and insert therefor -- control register --

Column 13,
Line 37, delete "The.sixteen" and insert therefor -- The sixteen --

Column 15,
Line 59, delete "Comparator.508" and insert therefor -- Comparator 508 --

Column 16,
Line 66, delete "In.step" and insert therefor -- In step --

Column 24,
Line 44, delete "ICMPA[13]" and insert therefor -- ICMPA[13] --

Column 27,
Line 53, delete "11VALID" and insert therefor -- I1VALID --
Line 53, delete "12VALID" and insert therefor -- I2VALID --
Line 53, delete "13VALID" and insert therefor -- I3VALID --

UNITED STATES PATENT AND TRADEMARK OFFICE
CERTIFICATE OF CORRECTION

PATENT NO. : 6,374,370 B1
DATED : April 16, 2002
INVENTOR(S) : John W. Bockhaus et al.

It is certified that error appears in the above-identified patent and that said Letters Patent is hereby corrected as shown below:

Column 29,
Line 21, "Bits 3800-3826" should begin a new paragraph
Line 56, "38003806" and insert therefor -- 3800- 3806 --

Column 35,
Line 54, delete "Eeneration" and insert therefor -- Generation --

Signed and Sealed this

Second Day of November, 2004

JON W. DUDAS
*Director of the United States Patent and Trademark Office*